(12) United States Patent
Cheng

(10) Patent No.: US 12,176,410 B2
(45) Date of Patent: Dec. 24, 2024

(54) INTEGRATED LOGIC AND PASSIVE DEVICE STRUCTURE

(71) Applicant: Taiwan Semiconductor Manufacturing Co., Ltd., Hsinchu (TW)

(72) Inventor: Chung-Liang Cheng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 310 days.

(21) Appl. No.: 17/463,402

(22) Filed: Aug. 31, 2021

(65) Prior Publication Data

US 2023/0065446 A1   Mar. 2, 2023

(51) Int. Cl.
*H01L 29/423* (2006.01)
*H01L 27/12* (2006.01)

(52) U.S. Cl.
CPC ...... *H01L 29/42392* (2013.01); *H01L 27/124* (2013.01); *H01L 27/1251* (2013.01); *H01L 27/1255* (2013.01); *H01L 27/1266* (2013.01); *H01L 27/127* (2013.01)

(58) Field of Classification Search
CPC ................................................ H01L 29/42392
See application file for complete search history.

(56) References Cited

U.S. PATENT DOCUMENTS

| | | | |
|---|---|---|---|
| 9,236,267 B2 | 1/2016 | De et al. | |
| 9,502,265 B1 | 11/2016 | Jiang et al. | |
| 9,520,466 B2 | 12/2016 | Holland et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |
| 2011/0049589 A1* | 3/2011 | Chuang | H01L 27/14609 257/292 |
| 2013/0051117 A1* | 2/2013 | En | H01L 27/0688 365/148 |
| 2013/0235647 A1* | 9/2013 | Kim | G11C 13/0004 365/148 |
| 2021/0125992 A1* | 4/2021 | Lajoie | H10B 12/31 |
| 2021/0296396 A1* | 9/2021 | Wu | H10B 61/22 |

* cited by examiner

Primary Examiner — Peter M Albrecht
(74) Attorney, Agent, or Firm — Seed IP Law Group LLP

(57) ABSTRACT

A semiconductor device includes a substrate, a gate all around (GAA) device overlying the substrate, and a thin film transistor (TFT) overlying the GAA device, and a passive device overlying the TFT. The substrate, the GAA device, the TFT, and the passive device is subsequently stacked on each other and at least partially overlap with each other. A via includes a first end, a second end, and a middle portion of the via that is located between the first end and the second end of the via. The first end of the via is connected to the passive device and the second end of the via is connected to one layer of the GAA device. The middle portion of the via is laterally spaced apart from the TFT and the passive device.

20 Claims, 35 Drawing Sheets

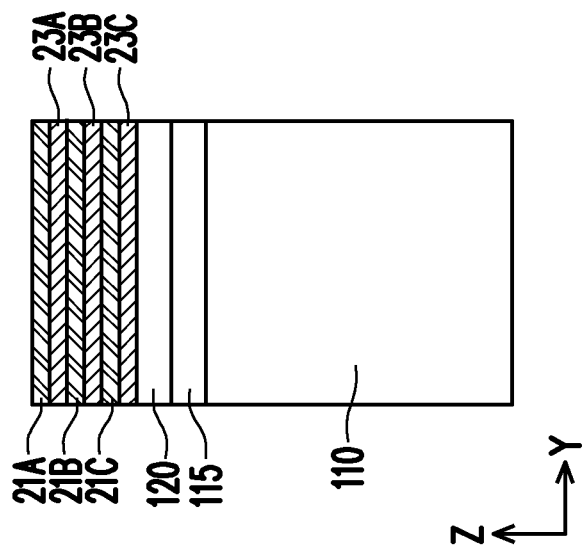
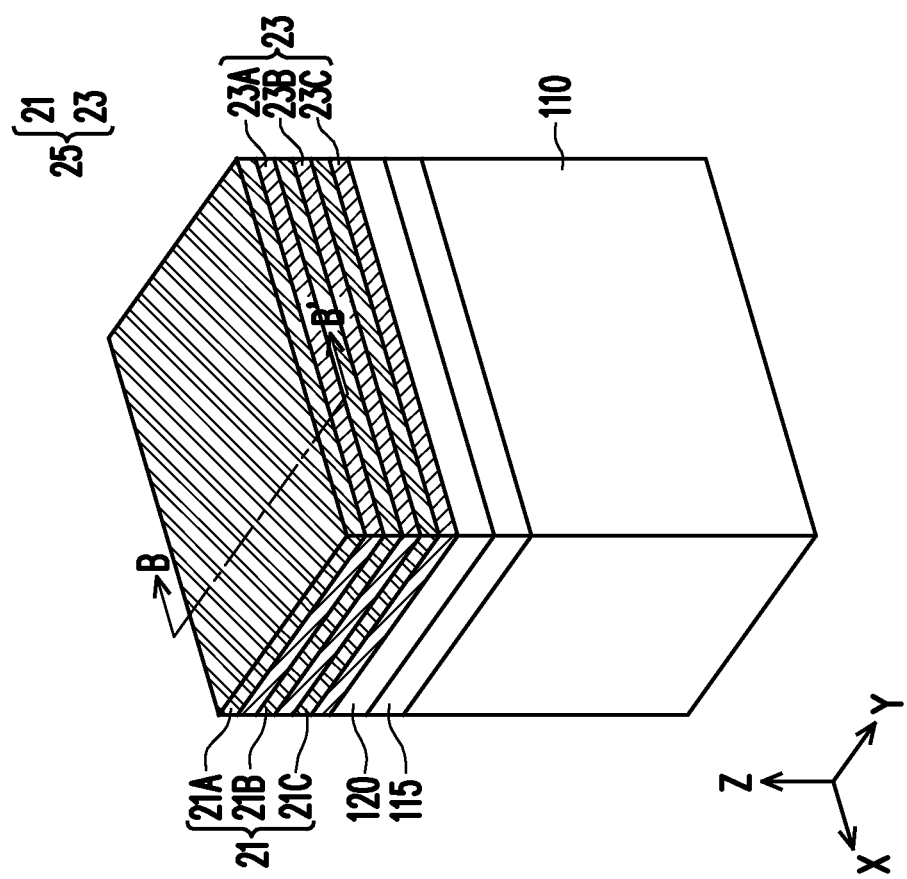
FIG. 5A
FIG. 5B

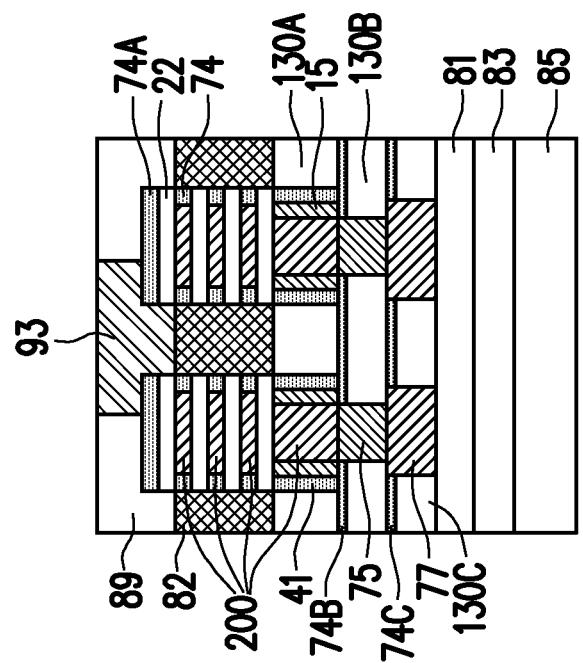
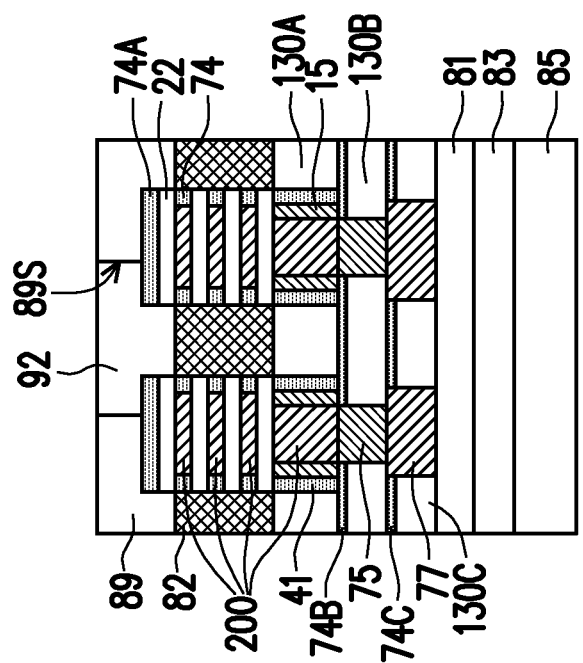

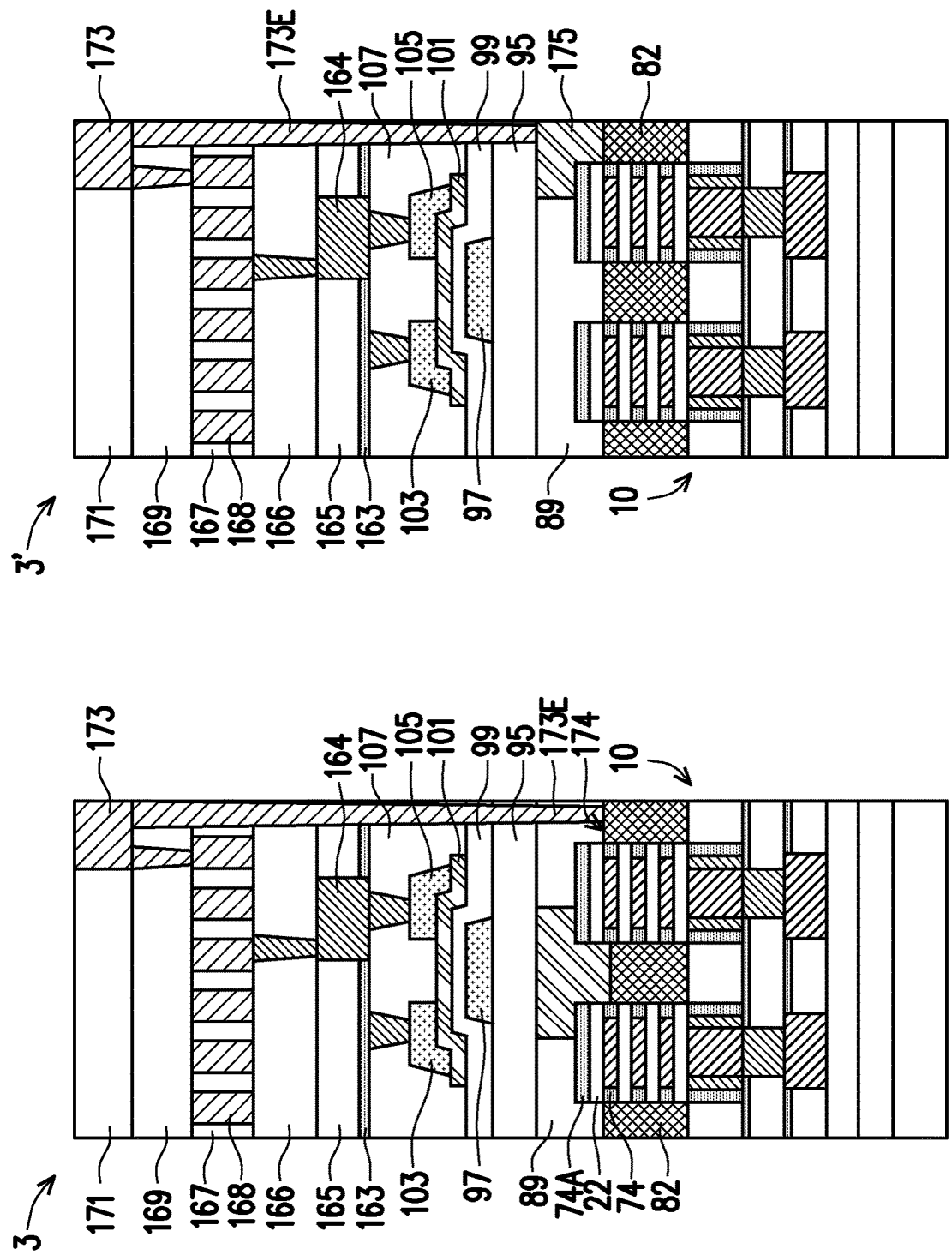

INTEGRATED LOGIC AND PASSIVE DEVICE STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. Such scaling down has also increased the complexity of processing and manufacturing ICs. Other ways of overcoming the complexity and the physical limitation of manufacturing ICs have been considered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 27 illustrate a method of forming the semiconductor device shown in FIG. 1, in accordance with some embodiments.

FIGS. 41 to 43 illustrate a method of forming a device shown in FIG. 40, in accordance with some embodiments.

FIG. 44 illustrates the via connecting to a contact plug located on the GAA device and below the thin film transistor, in accordance with some embodiments.

DETAILED DESCRIPTION

Figure 1:
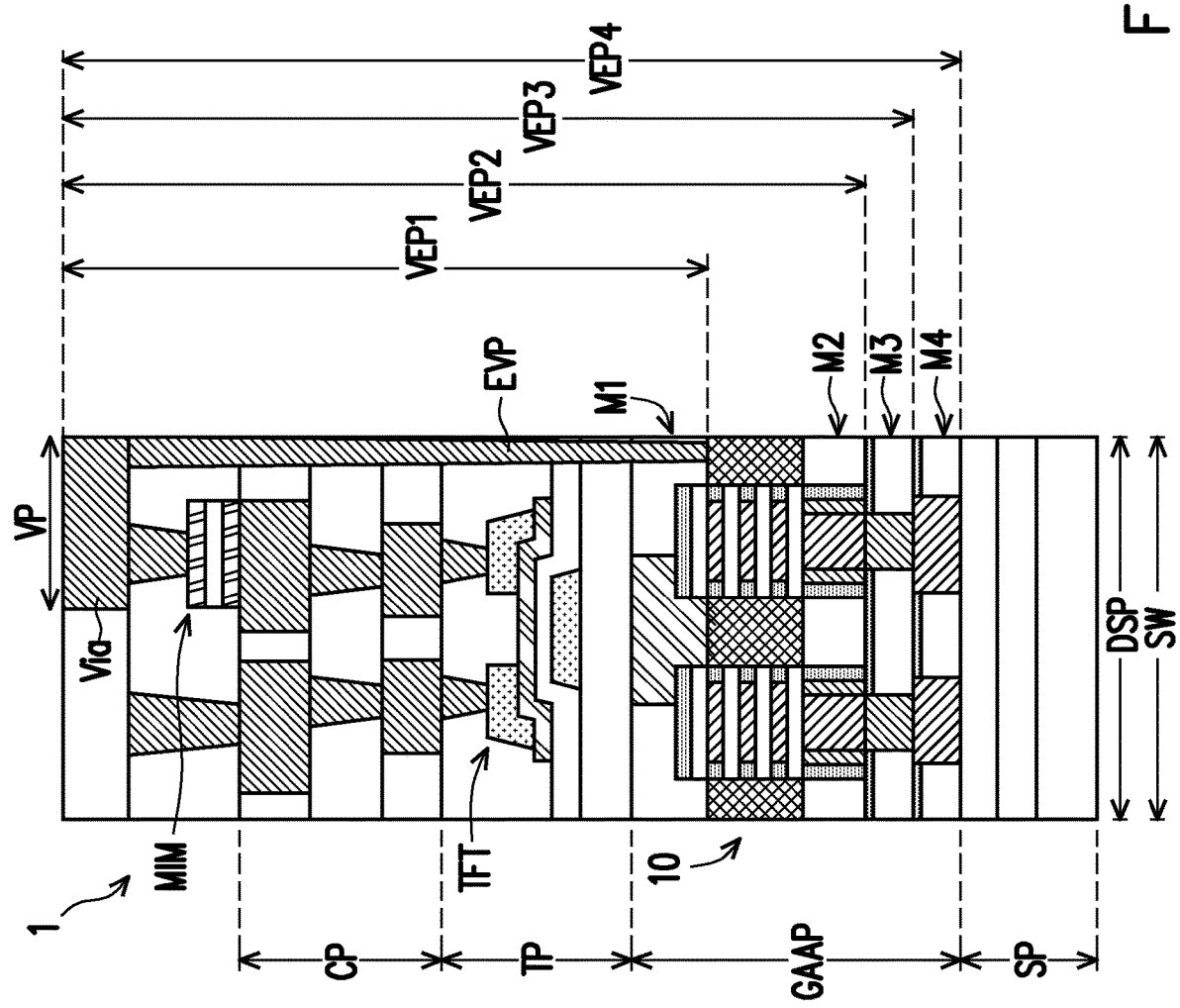
FIG. 1 illustrates a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms such as "about," "approximately," "roughly," "substantially," and the like may be used herein for ease of description. A person having ordinary skill in the art will be able to understand and derive meanings for such terms. For example, "about" may indicate variation in a dimension of 20%, 10%, 5% or the like, but other values may be used when appropriate. A large feature, such as the longest dimension of a semiconductor fin may have variation less than 5%, whereas a very small feature, such as thickness of an interfacial layer may have variation of as much as 50%, and both types of variation may be represented by the term "about." "Substantially" is generally more stringent than "about," such that variation of 10%, 5% or less may be appropriate, without limit thereto. A feature that is "substantially planar" may have variation from a straight line that is within 10% or less. A material with a "substantially constant concentration" may have variation of concentration along one or more dimensions that is within 5% or less. Again, a person having ordinary skill in the art will be able to understand and derive appropriate meanings for such terms based on knowledge of the industry, current fabrication techniques, and the like.

One or more embodiments of the present disclosure improves the dimension limitation of ICs that causes low device density. For example, reducing the dimension of components such as transistors to increase transistor density becomes more and more challenging due to the physical limitation. The present disclosure provides a novel integrated logic and passive device structure which is capable of increasing transistor density. Some embodiments of the present disclosure provides a method of stacking the passive device on the backside of the logic device to increase density. In the related art, the method of increasing density was largely directed towards arranging both the passive devices/components (e.g., resistor, capacitor, inductor, DRAM, RRAM, or the like) and the logic devices (e.g., integrated circuits) on the front side of a substrate. That is, the logic device and the passive device would be arranged side by side on the same plane. To further increase the density in the front side, reducing the dimensions of the components were the key factors. However, the semiconductor device structure according to the present disclosure increases the density of components by arranging the passive devices and the logic devices in a stacked relationship which further reduces the area footprint of the IC. For example, a SOI substrate or an epitaxial SiGe/Si substrate may be used for the logic GAA (gate all around) MOSFET process. Here, the FEOL (front-end-of-line) and the MEOL (mid-end-of-line) processes may be performed. After these process are completed, the substrate may be bonded with a carrier wafer. Next, the wafer may be flipped and then the backside of the substrate may be thinned down at least until it reaches the SOI oxide layer or the SiGe layer, for example, a first silicon layer and an oxide or SiGe layer may be removed by the thinning, leaving only a portion of silicon or other semiconductor material of the substrate after the thinning. On the backside, contact patterning and contact silicide/plug formation may be performed. The flipped wafer is then used as a substrate for Indium Gallium Zinc Oxide (IGZO) thin film transistor (TFT), for forming resistor, capacitor, and inductor, used for forming RRAM or DRAM or any other passive devices. After the passive device is formed on the backside, a TOV (through oxide vias) is used to connect the front side logic and the backside passive device. Further details of the one or more embodiments will be explained in connection with the drawings.

The present disclosure is generally related to semiconductor devices, and more particularly to field-effect transistors (FETs), such as planar FETs, three-dimensional fin-line FETs (FinFETs), or gate-all-around (GAA) devices. In advanced technology nodes, cell height scaling can be constrained by layout restrictions on spacing between gate isolation ("cut metal gate") structures and neighboring semiconductor fins related to overlap and critical dimension. Gate isolation structures improve spacing constraints by employing a self-aligned fabrication process.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 illustrates a semiconductor device 1 according to some embodiments of the present disclosure. FIGS. 2 to 27 illustrate a method of forming the semiconductor device 1 shown in FIG. 1. Accordingly, FIG. 27 and FIG. 1 show an identical cross-section of the semiconductor device 1. The method of forming each layer as shown in the semiconductor device 1 and the materials used for each layer will be detailed in the relevant figures. It will be apparent to a person of ordinary skill in the art various method may be used in forming the semiconductor device 1 and the various layers constituting the semiconductor device 1.

Referring to FIG. 1, the semiconductor device 1 includes a substrate portion SP, a gate-all-around (GAA) device portion GAAP, a transistor portion TP, a contact plug portion CP, a metal-insulator-metal (MIM) structure, and a via. A GAA device 10 is formed on the substrate portion SP. The transistor portion TP is formed on the GAA device 10 or the GAA device portion GAAP. On the transistor portion TP, a plurality of contact plugs are stacked and electrically connected to each other in the contact plug portion CP. The contact plugs in the contact plug portion CP provides electrical connection to the transistor portion TP (either the source or the drain of the transistor). In some embodiments, an MIM structure may be formed on the contact plug portion CP. The via is formed on the MIM structure. One end of the via is electrically connected to the MIM structure. The other end of the via extends downward and connects to a layer of the GAA device 10. That is, an extended via portion EVP contacts the layer of the GAA device 10. This connection (either electrical or physical, or both) using the via allows the MIM structure which is spaced apart from the GAA device 10 to be connected to each other.

One of the many technical benefits of the structure of the semiconductor device 1 is that it allows to logic circuit devices such as the GAA device 10 and passive devices such as the MIM structure to be stacked within a specified area DSP, which facilitates an increase of the density of components in an integrated circuit chip. The semiconductor device 1 according to some embodiments of the present disclosure achieves this by flipping the GAA device 10 and forming the transistor TFT and the MIM structure on the other side of the GAA device 10, as will be described in further detail herein.

As shown in FIG. 1, the GAA device 10, the transistor TFT, the contact plugs in the contact plug portion CP, the MIM structure, and the via at least partially overlap each other. The configuration of forming a narrow via with high aspect ratio facilitates a high level of integration of semiconductor components within a selected area (e.g., DSP). Namely, based on the combination of forming passive devices on the opposite side of the GAA device 10 and connecting the passive device to the GAA device through a narrow via provides the benefits of achieving increased level of integration of semiconductor components within a selected area (e.g., DSP).

The semiconductor device 1 may have a selected width SW as shown in FIG. 1. In one or more embodiments, the GAA device 10, the transistor TFT, the contact plugs, the MIM structure, and the via may be arranged to be within this selected width SW. These features are made possible, at least in part, due to the narrow via having a high aspect ratio that connects the GAA device 10 with a passive device (e.g., MIM) on the opposite side of the GAA device 10.

In some embodiments, the via portion VP where the via is located overlaps with at least a portion of the transistor TFT. The extended via portion EVP is spaced apart from either the source or the drain of the TFT so that the extended via portion EVP does not contact either the source or the drain of the TFT. The extended via portion EVP may not contact a gate or a semiconductor layer of the TFT as well.

In some embodiments, the via portion VP where the via is located overlaps with at least a portion of the contact plug portion CP. The extended via portion EVP is spaced apart from the contact plugs in the contact plug portion CP so that the extended via portion EVP does not make an electrical contact with one of the contact plugs in the contact plug portion CP.

In some embodiments, the via portion VP where the via is located overlaps with at least a portion of the MIM structure. The extended via portion EVP is spaced apart from the MIM structure so that the extended via portion EVP does not make an electrical contact with the MIM structure laterally. For example, one end of the via may be electrically connected to a top metal layer of the MIM structure. However, the extended via portion EVP which is spaced apart from the MIM structure laterally may not contact the MIM structure.

In some embodiments, the via portion VP where the via is located overlaps with at least a portion of the GAA device 10. The extended via portion EVP may be configured to extend to any layer of the GAA device 10. For example, in one embodiment, the extended via portion EVP may extend a distance VEP1 to reach and contact a first layer M1 of the GAA device 10. In another embodiment, the extended via portion EVP may extend a distance VEP2 to reach and contact a second layer M2 of the GAA device 10. In another embodiment, the extended via portion EVP may extend a distance VEP3 to reach and contact a third layer M3 of the GAA device 10. In another embodiment, the extended via portion EVP may extend a distance VEP4 to reach and contact a fourth layer M4 of the GAA device 10.

Figure 28:
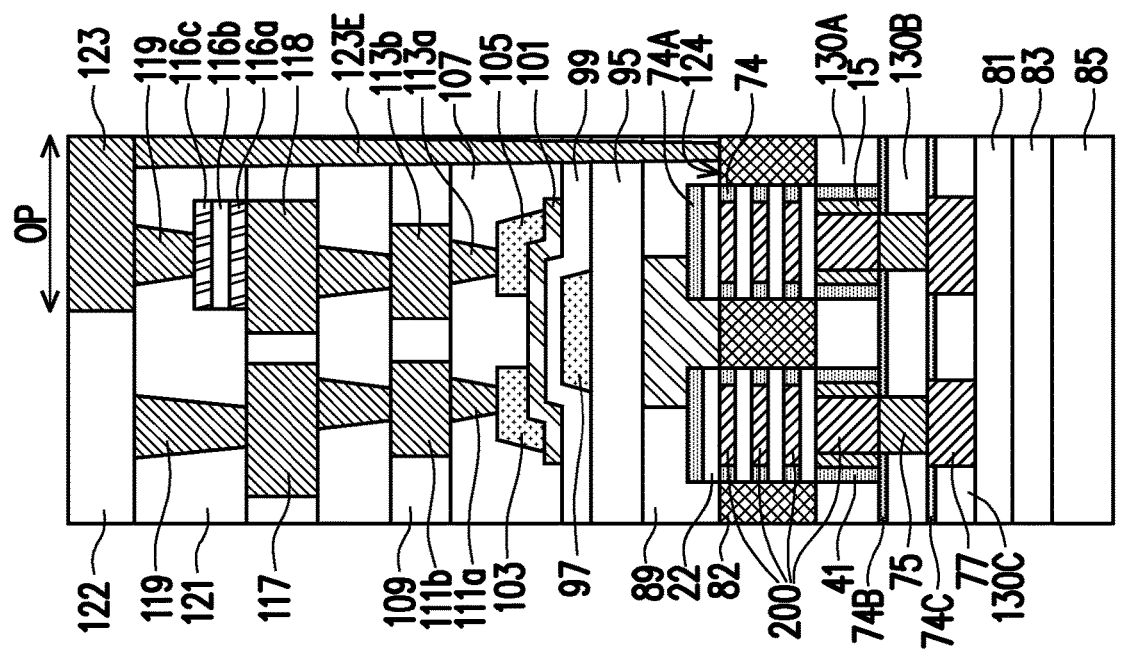
FIG. 28 illustrates a via connecting to a contact plug located on the GAA device and below the TFT, in accordance with some embodiments.
Figure 38:
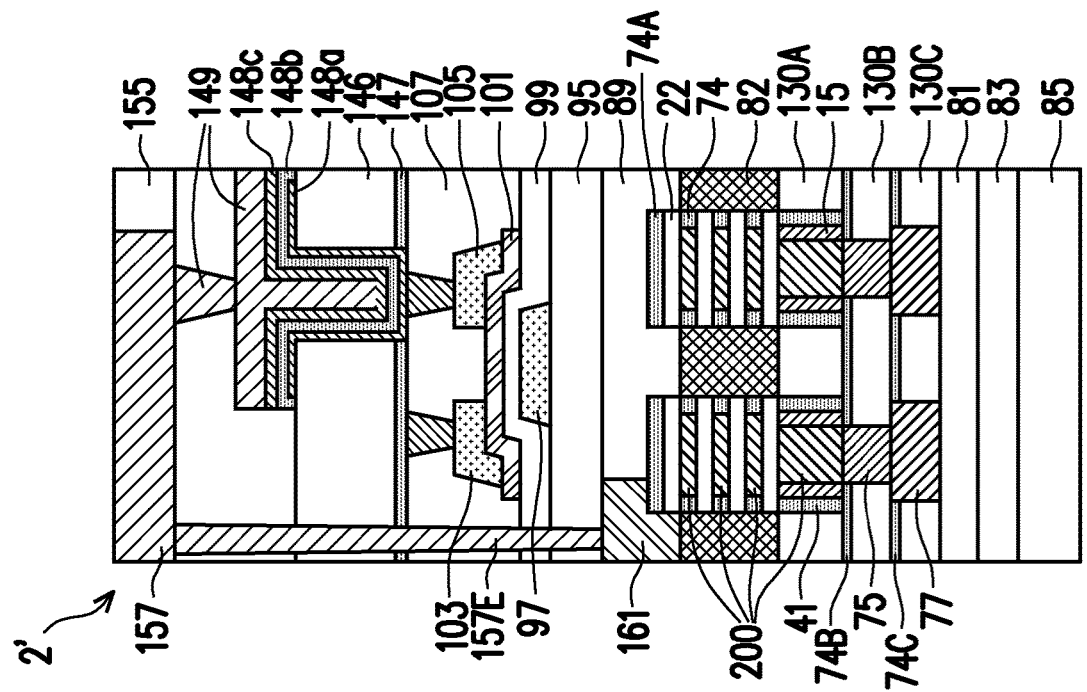
FIG. 38 illustrates a semiconductor device having a via connecting to a contact plug located on the GAA device and below the thin film transistor, in accordance with some embodiments.

In some embodiments, a contact plug (not shown in FIG. 1) may be further formed so that the contact plug functions as a middle component between the GAA device 10 and the extended via portion EVP. An example of such embodiments is shown in FIGS. 28, 38, and 44.

Figure 2:
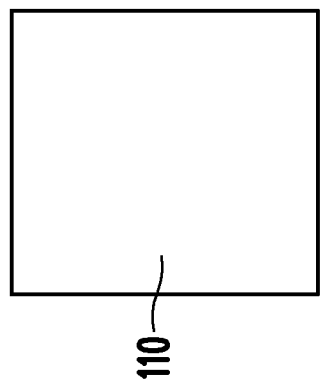

FIGS. 2 to 27 illustrate a method of forming the semiconductor device 1 shown in FIG. 1, in accordance with one or more embodiments. As shown in FIG. 2, a first substrate layer 110 is provided. The first substrate layer 110 may be a semiconductor substrate, such as a bulk semiconductor, or the like, which may be doped (e.g., with a p-type or an n-type dopant) or undoped. The semiconductor material of the first substrate layer 110 may include: silicon; germanium; a compound semiconductor including silicon carbide, gallium arsenide, gallium phosphide, indium phosphide, indium arsenide, or indium antimonide; an alloy semiconductor including silicon-germanium, gallium arsenide phosphide, aluminum indium arsenide, aluminum gallium arsenide, gallium indium arsenide, gallium indium phosphide, or gallium indium arsenide phosphide; or combinations thereof. Other substrates, such as single-layer, multi-layered, or gradient substrates may be used.

Figure 3:
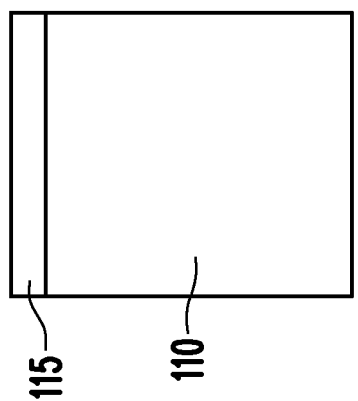

In FIG. 3, a second substrate layer 115 is provided on the first substrate layer 110. The second substrate layer 115 may include a substrates including dopants. For example, the second substrate layer 115 may include a boron (B) doped SiGe substrate. In some embodiments, the second substrate layer 115 is used as an etch stop layer.

Figure 4:
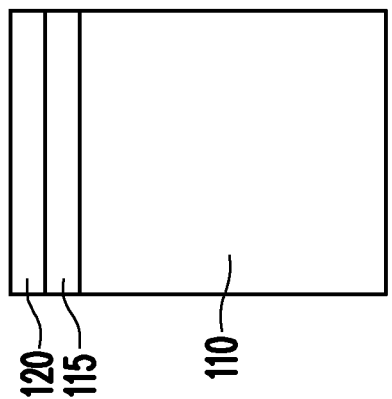

In FIG. 4, a third substrate layer 120 is provided on the second substrate layer 115. The third substrate layer 120 may include substrates formed by epitaxial growth. An epitaxial substrate or epitaxial wafer is a wafer of semiconducting material made by epitaxial growth (epitaxy). The third substrate layer 115 may be or include the same material as the first substrate layer 110 (e.g., monocrystalline silicon), or it may include other materials.

Methods for growing the epitaxial layer (e.g., the third substrate layer 120) on monocrystalline silicon or other wafers include various types of chemical vapor deposition (CVD). The types of method of growing the epitaxial layer include atmospheric pressure CVD (APCVD), metal organic chemical vapor deposition (MOCVD), molecular beam epitaxy (MBE), or the like. The epitaxial layers may consist of compounds with certain features such as gallium nitride (GaN), gallium arsenide (GaAs), or some combination of the elements gallium, indium, aluminum, nitrogen, phosphorus or arsenic.

In some embodiments, the third substrate layer 120 may include a silicon epitaxial substrate (Si EPI).

FIGS. 5A through 13C are perspective views and cross-sectional views of intermediate stages in the manufacturing of nano-FETs, in accordance with some embodiments. FIGS. 5A, 6A, 7A, 8A, 9A, 10A, 11A, 12A, and 13A illustrate perspective views. FIGS. 5B, 6B, 7B, 8B, 9B, 10B, 11B, 12B, and 13B illustrate reference cross-section B-B' (gate cut) illustrated in FIGS. 5A, 6A, and 7A. FIGS. 7C, 8C, 9C, 10C, 11C, 12C, and 13C illustrate reference cross-section C-C' (channel/fin cut) illustrated in FIG. 7A. The nano-FETs may be, for example, the GAA device 10 of the semiconductor device 1 of FIG. 1, and the method illustrated in FIGS. 5 through 13 may be utilized to form the GAA device 10 of the semiconductor device 1.

In FIG. 5A and FIG. 5B, a multi-layer stack 25 or "lattice" is formed over the third substrate layer 120 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Further, in some embodiments, the bottommost layer that is positioned between the third substrate layer 120 and the multi-layer stack 25 may include a layer including silicon nitride (SiN). The layer including silicon nitride may be used as an insulator and chemical barrier to electrically isolate different structures or as an etch mask in bulk micromachining. However, other materials capable of achieving the same purpose may be used.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

Figure 6B:
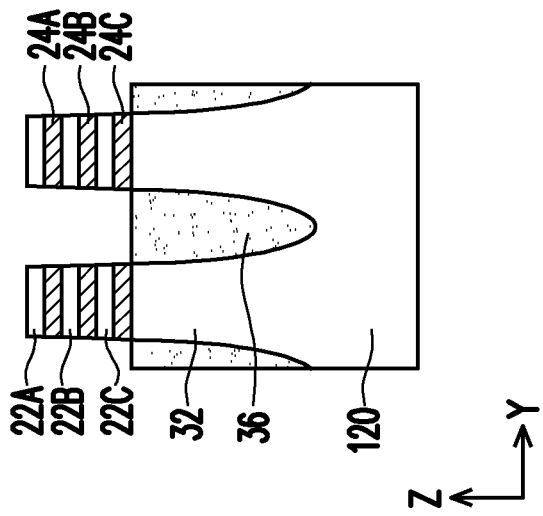
Figure 6A:
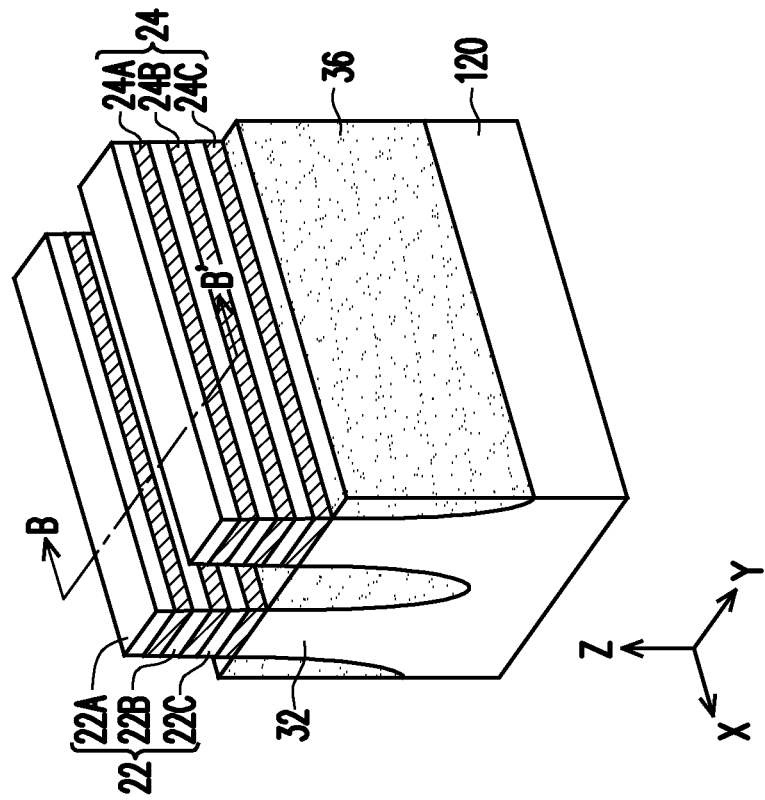
Figure 13C:
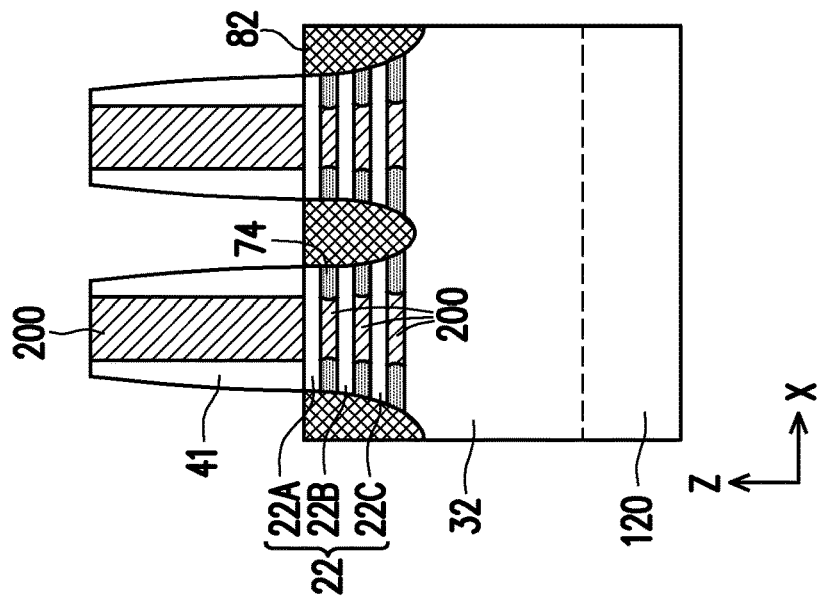
Figure 13B:
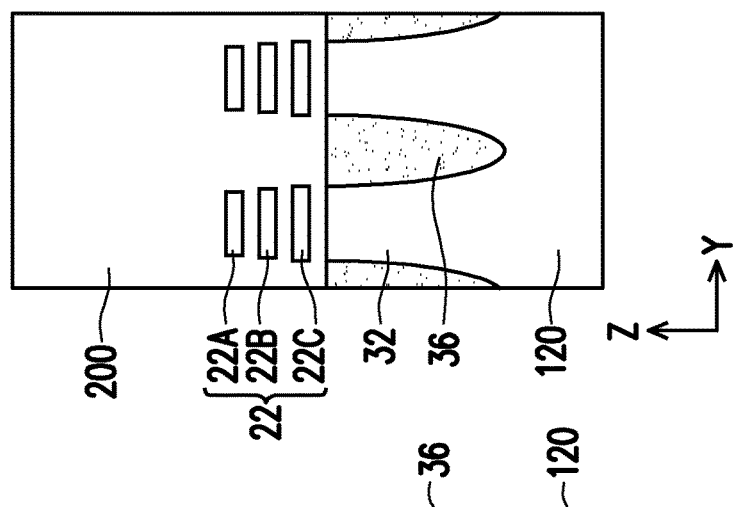
Figure 13A:
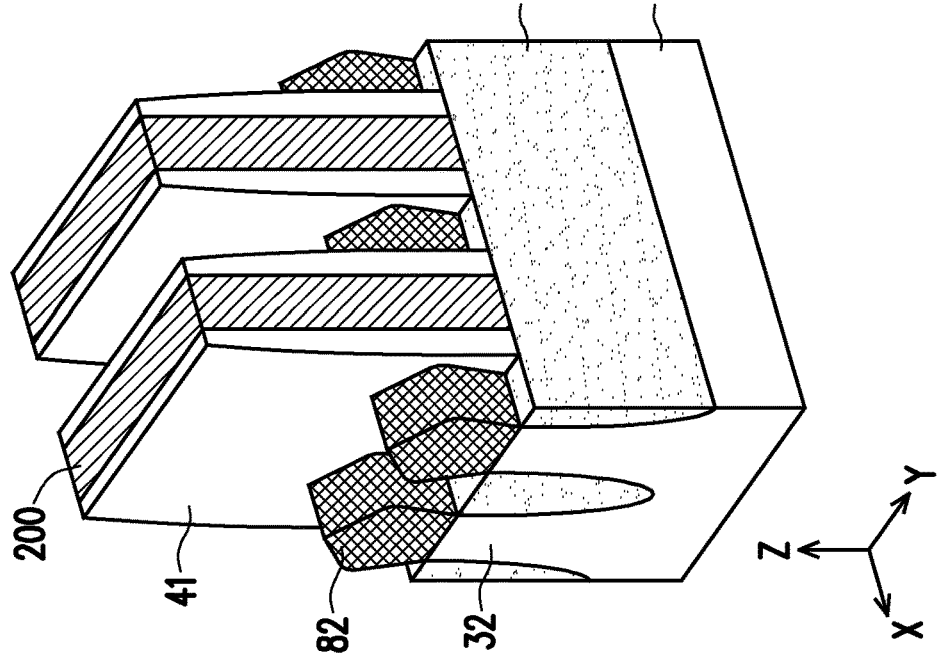
Figure 14:
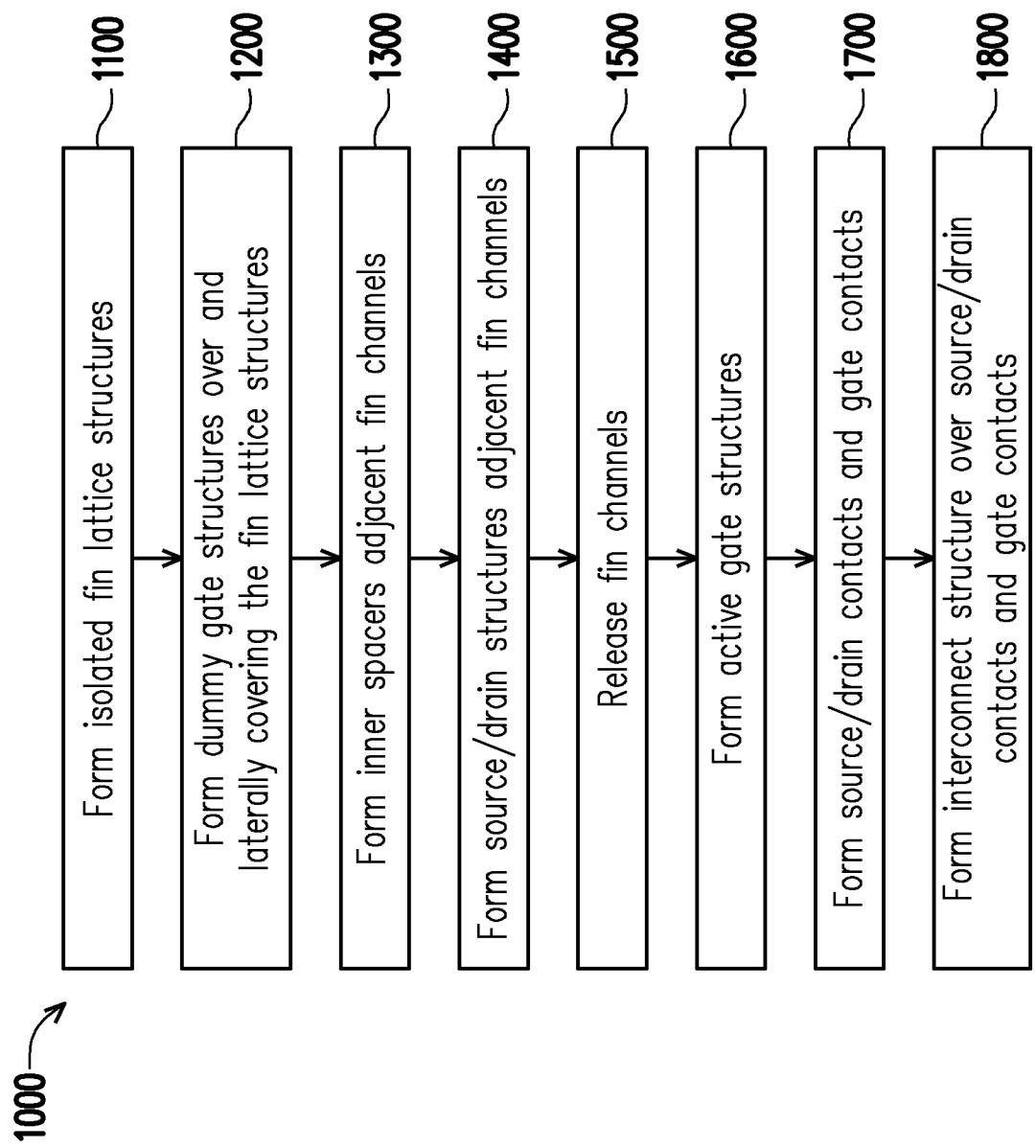

In FIG. 6A and FIG. 6B, fins 32 are formed in the third substrate layer 120 and nanostructures 22, 24 are formed in the multi-layer stack 25 corresponding to act 1100 of FIG. 14. FIG. 14 is a flowchart 1000 illustrating a method of fabricating a semiconductor device according to some embodiments of the present disclosure, which corresponds with FIGS. 6-13C. As shown in FIGS. 6A and 6B, in some embodiments, the nanostructures 22, 24 and the fins 32 may be formed by etching trenches in the multi-layer stack 25 and the third substrate layer 120. The etching may be any acceptable etch process, such as a reactive ion etch (ME), neutral beam etch (NBE), the like, or a combination thereof. The etching may be anisotropic. First nanostructures 22A-22C (also referred to as "channels" below) are formed from the first semiconductor layers 21, and second nanostructures 24A-24C are formed from the second semiconductor layers 23. Distance CD1 between adjacent fins 32 and nanostructures 22, 24 may be from about 18 nm to about 100 nm.

The structures are shown in FIGS. 6-13 without the first and second substrate layers 110, 115; however, it will be readily appreciated that the first and second substrate layers 110, 115 may be included in the illustrated structures.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIGS. 6A and 6B illustrate the fins 32 having tapered sidewalls, such that a width of each of the fins 32 or the nanostructures 22, 24 continuously increases in a direction towards the third substrate layer 120. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIGS. 6A and 6B, isolation regions 36, which may be shallow trench isolation (STI) regions, are formed adjacent the fins 32. The isolation regions 36 may be formed by depositing an insulation material over the third substrate layer 120, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the third substrate layer 120, the fins 32, and the nanostructures 22, 24. Thereafter, a fill material, such as those discussed above may be formed over the liner.

The insulation material undergoes a removal process, such as a chemical mechanical polish (CMP), an etch-back process, combinations thereof, or the like, to remove excess insulation material over the nanostructures 22, 24. Top surfaces of the nanostructures 22, 24 may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are substantially flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 5A through 6B illustrate one or more embodiments (e.g., etch last) of forming the fins 32 and the nanostructures 22, 24. In some embodiments, the fins 32 or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 6A and FIG. 6B, appropriate wells (not separately illustrated) may be formed in the fins 32, the nanostructures 22, 24, or the isolation regions 36. Using masks, an n-type impurity implant may be performed in p-type regions of the third substrate layer 120, and a p-type impurity implant may be performed in n-type regions of the third substrate layer 120. Example n-type impurities may include phosphorus, arsenic, antimony, or the like. Example p-type impurities may include boron, boron fluoride, indium, or the like. An anneal may be performed after the implants to repair implant damage and to activate the p-type or n-type impurities. In some embodiments, in situ doping during epitaxial growth of the fins 32 and the nanostructures 22, 24 may obviate separate implantations, although in situ and implantation doping may be used together.

Figure 7A:
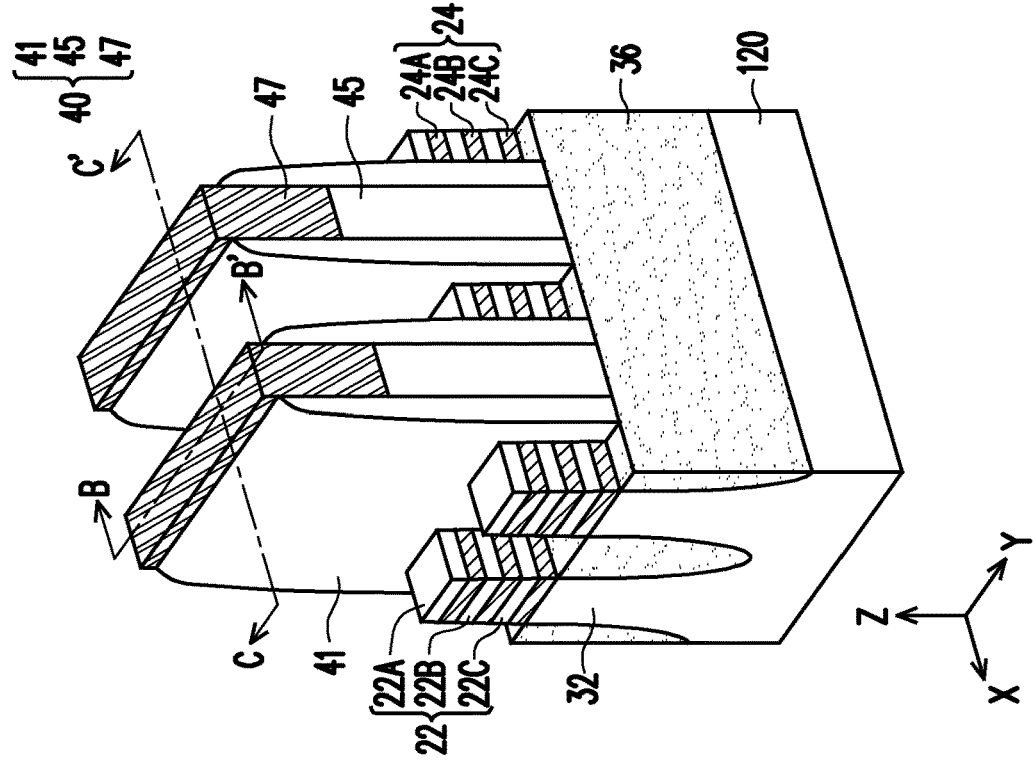
Figure 7B:
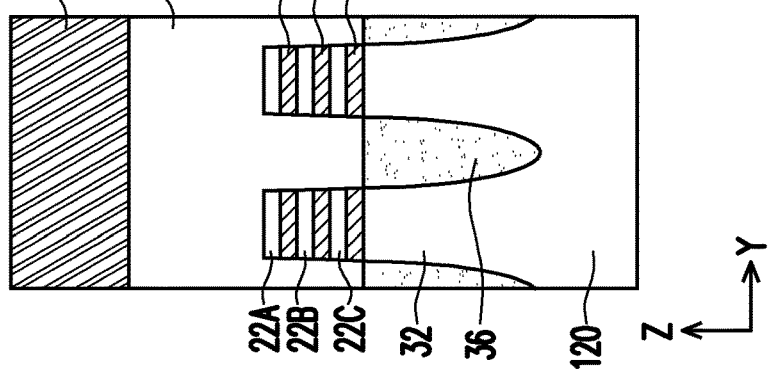
Figure 7C:
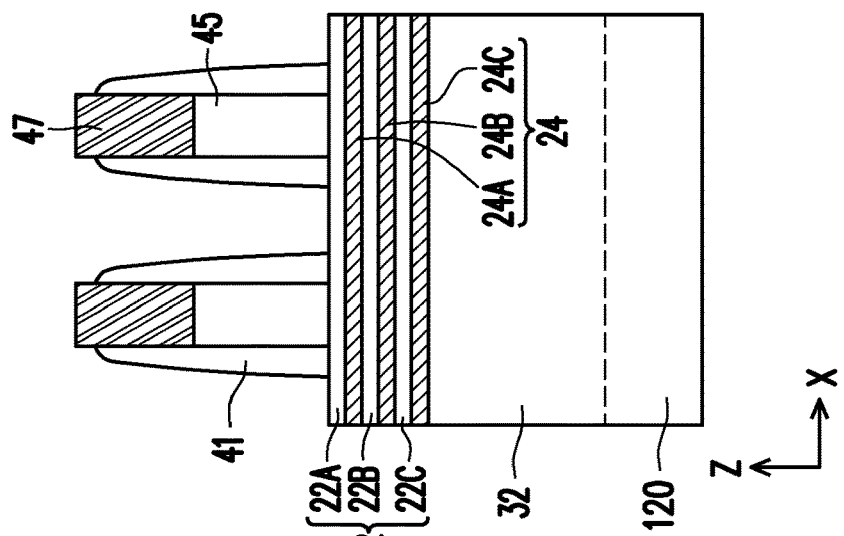

In FIGS. 7A-7C, dummy gate structures 40 are formed over the fins 32 or the nanostructures 22, 24, corresponding to act 1200 of FIG. 14. A dummy gate layer 45 is formed over the fins 32 or the nanostructures 22, 24. The dummy gate layer 45 may be made of materials that have a high etching selectivity versus the isolation regions 36. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a gate dielectric layer (not illustrated for simplicity) is formed before the dummy gate layer 45 between the dummy gate layer 45 and the fins 32 or the nanostructures 22, 24.

A spacer layer 41 is formed over sidewalls of the mask layer 47 and the dummy gate layer 45. The spacer layer 41 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. Portions of the spacer material layer between dummy gate structures 40 are removed using an anisotropic etching process, in accordance with some embodiments.

FIGS. 7A-7C illustrate an example process for forming the spacer layer 41. In some embodiments, the spacer layer 41 is formed alternately or additionally after removal of the dummy gate layer 45. In such embodiments, the dummy gate layer 45 is removed, leaving an opening, and the spacer layer 41 may be formed by conformally coating material of the spacer layer 41 along sidewalls of the opening. The conformally coated material may then be removed from the bottom of the opening corresponding to the top surface of the uppermost channel, e.g., the channel 22A, prior to forming an active gate.

Figure 8C:
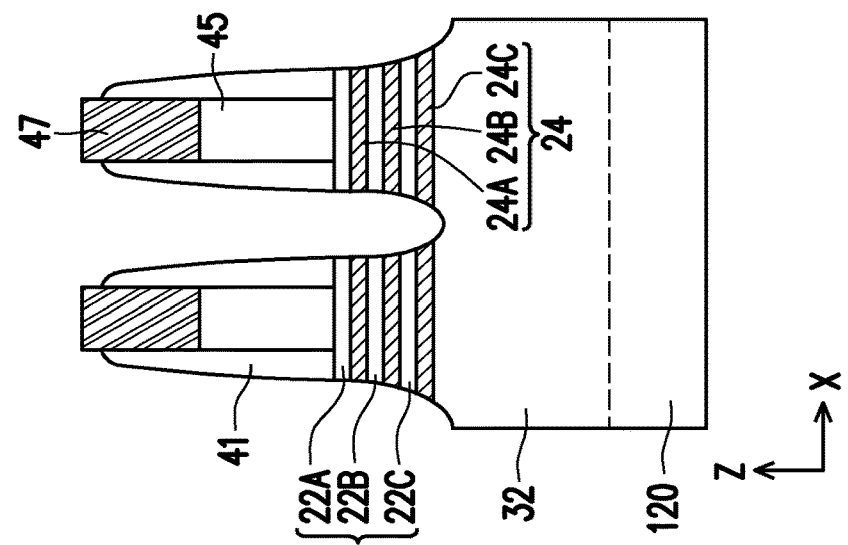
Figure 8B:
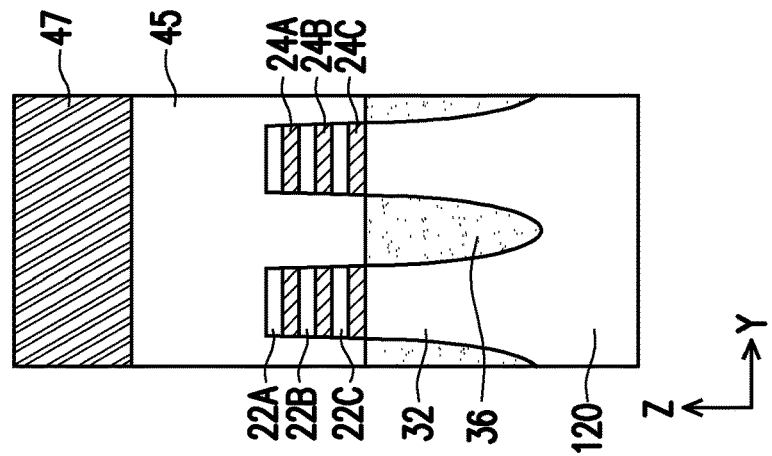
Figure 8A:
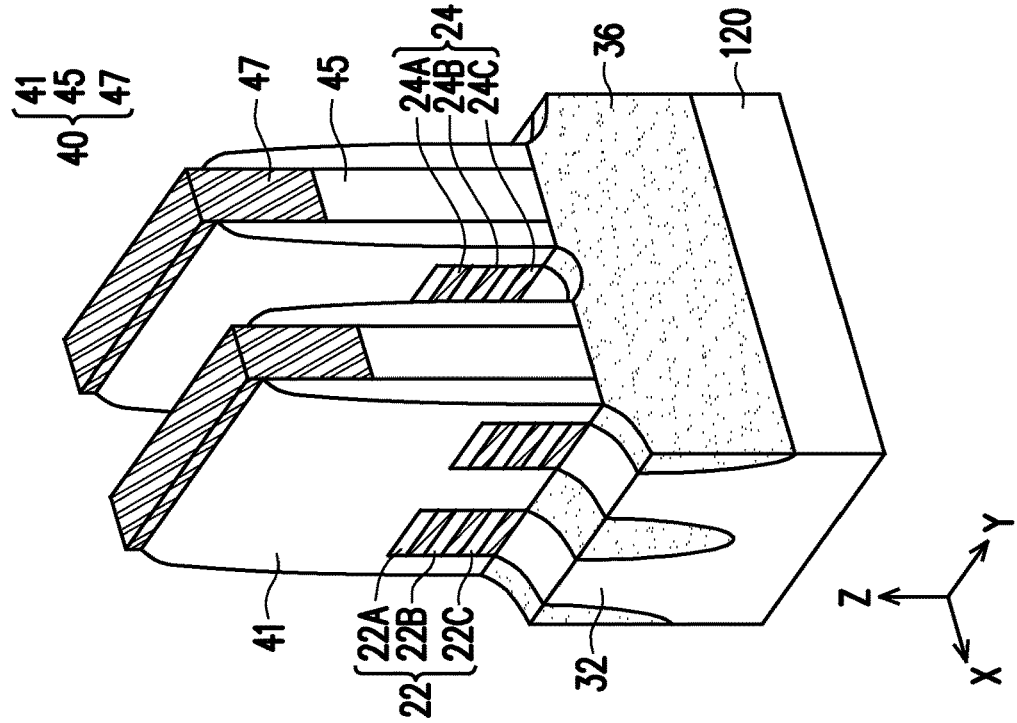

In FIGS. 8A-8C, an etching process is performed to etch the portions of protruding fins 32 or nanostructures 22, 24 that are not covered by dummy gate structures 40, resulting in the structure shown. The recessing may be anisotropic, such that the portions of fins 32 directly underlying dummy gate structures 40 and the spacer layer 41 are protected, and are not etched. The top surfaces of the recessed fins 32 may be substantially coplanar with the top surfaces of the isolation regions 36 as shown, in accordance with some embodiments. The top surfaces of the recessed fins 32 may be lower than the top surfaces of the isolation regions 36, in accordance with some other embodiments.

Figure 9C:
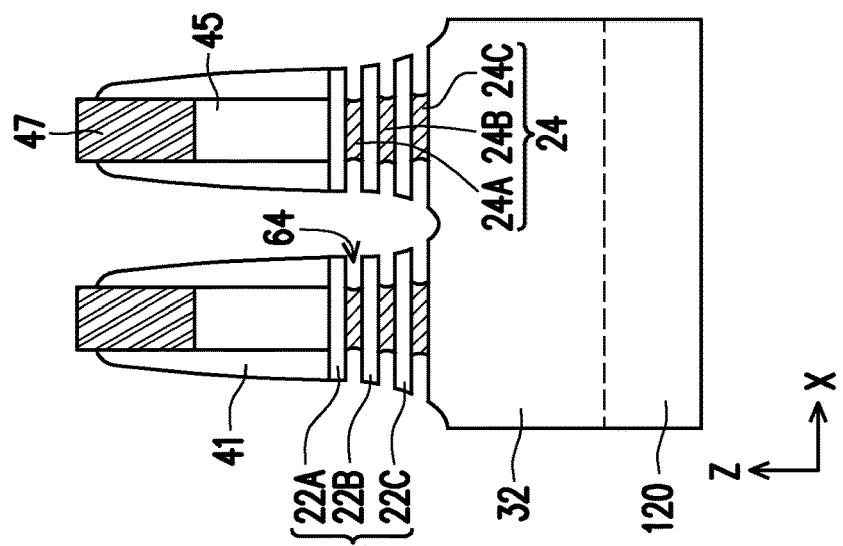
Figure 9B:
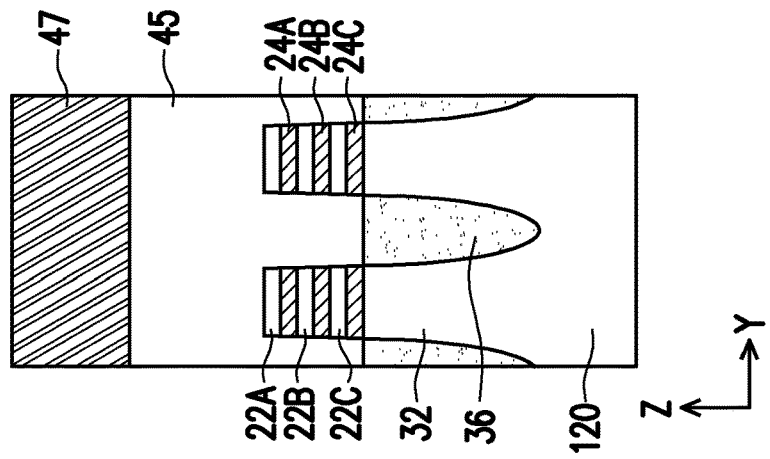
Figure 9A:
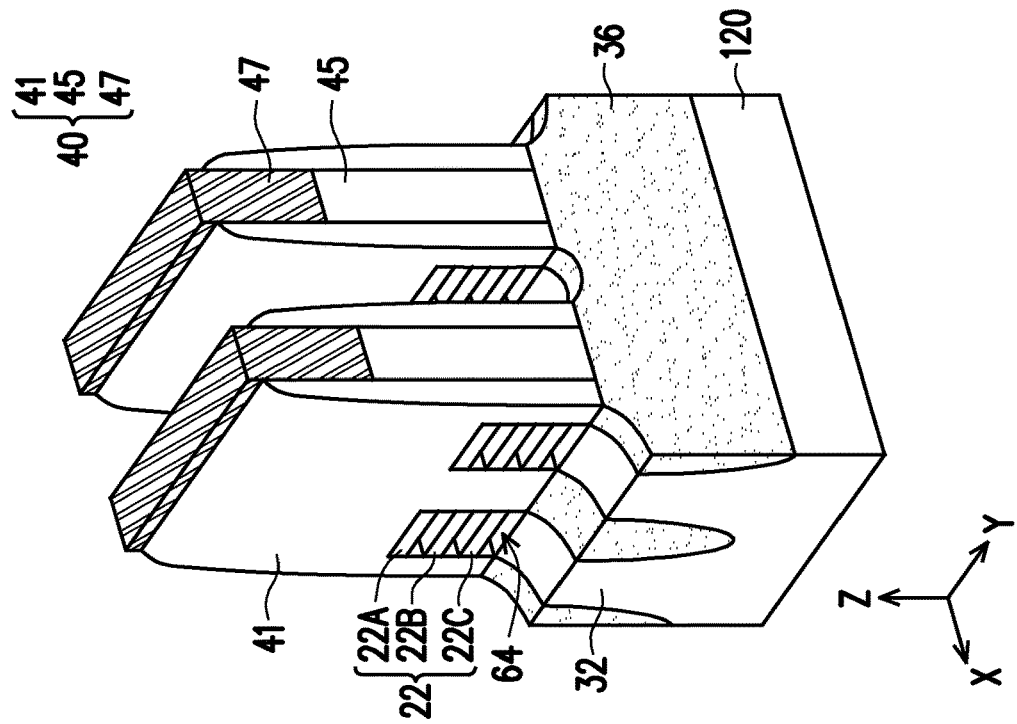

FIGS. 9A-9C and 10A-10C illustrate formation of inner spacers 74 corresponding to act 1300 of FIG. 14. A selective etching process is performed to recess end portions of the nanostructures 24 exposed by openings in the spacer layer 41 without substantially attacking the nanostructures 22. After the selective etching process, recesses 64 are formed in the nanostructures 24 at locations where the removed end portions used to be. The resulting structure is shown in FIGS. 9A-9C.

Figure 10C:
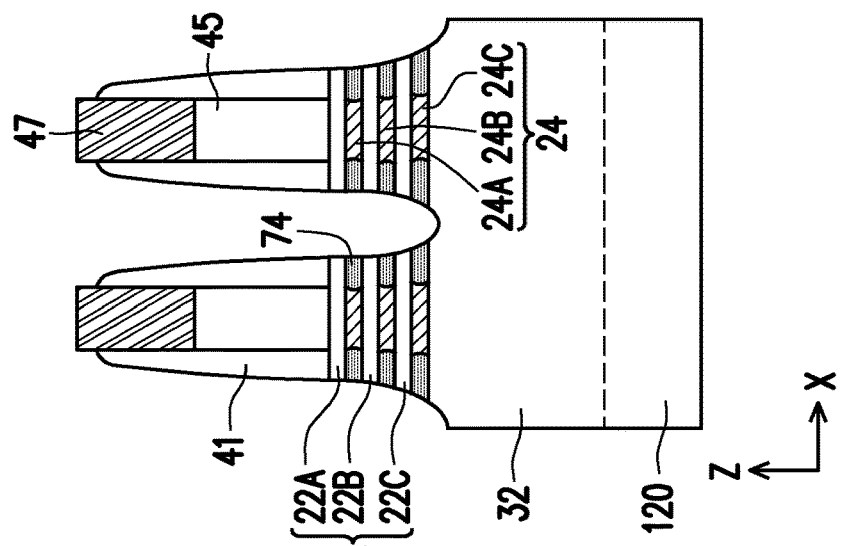
Figure 10B:
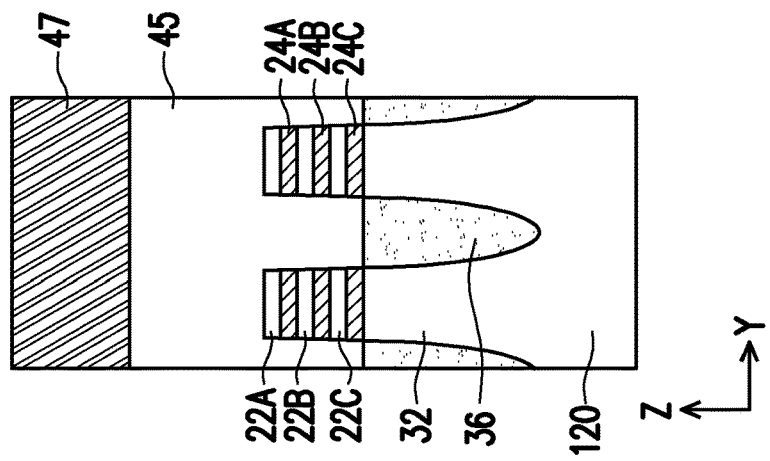
Figure 10A:
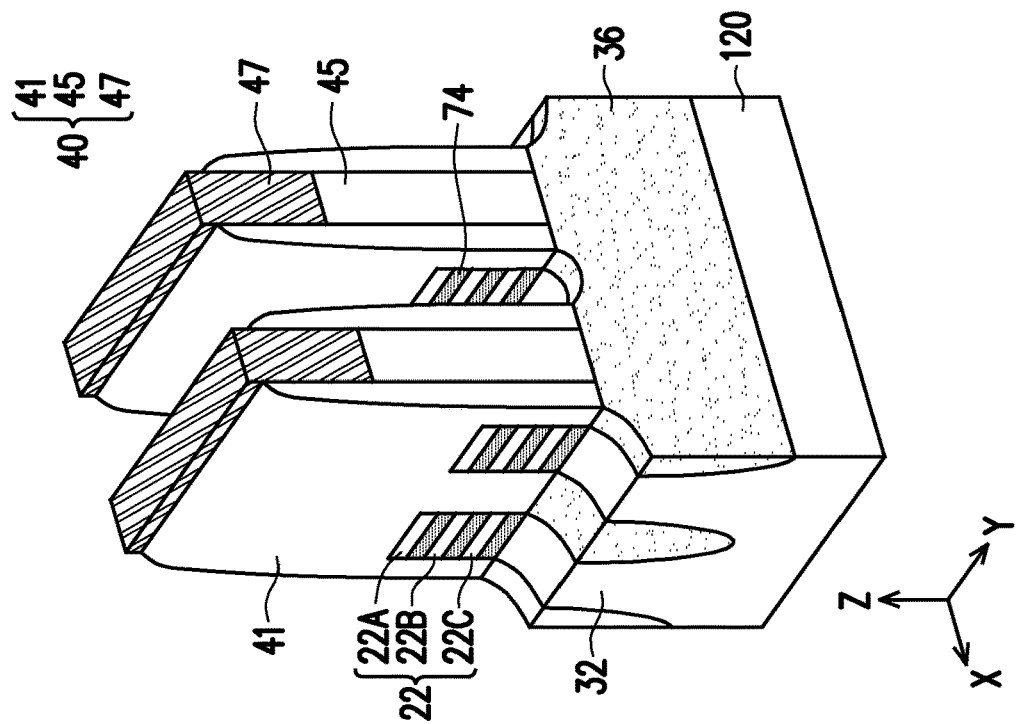

Next, an inner spacer layer is formed to fill the recesses 64 in the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses 64 in the nanostructures 24) form the inner spacers 74. The resulting structure is shown in FIGS. 10A-10C.

Figure 11C:
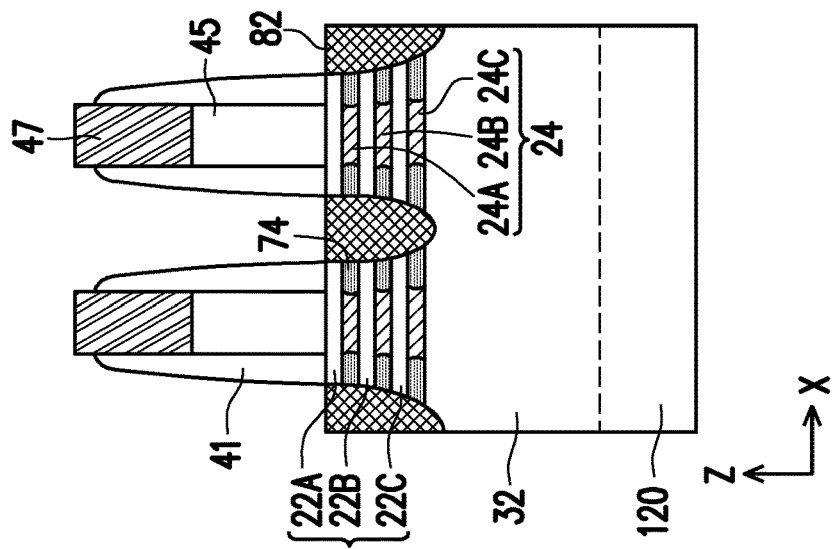
Figure 11B:
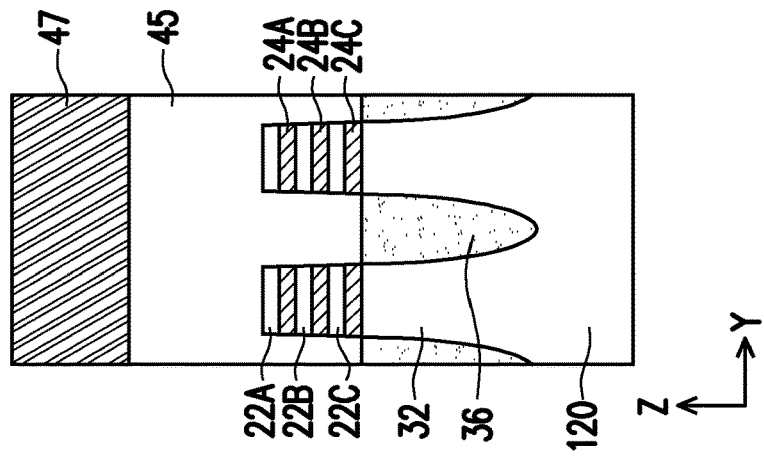
Figure 11A:
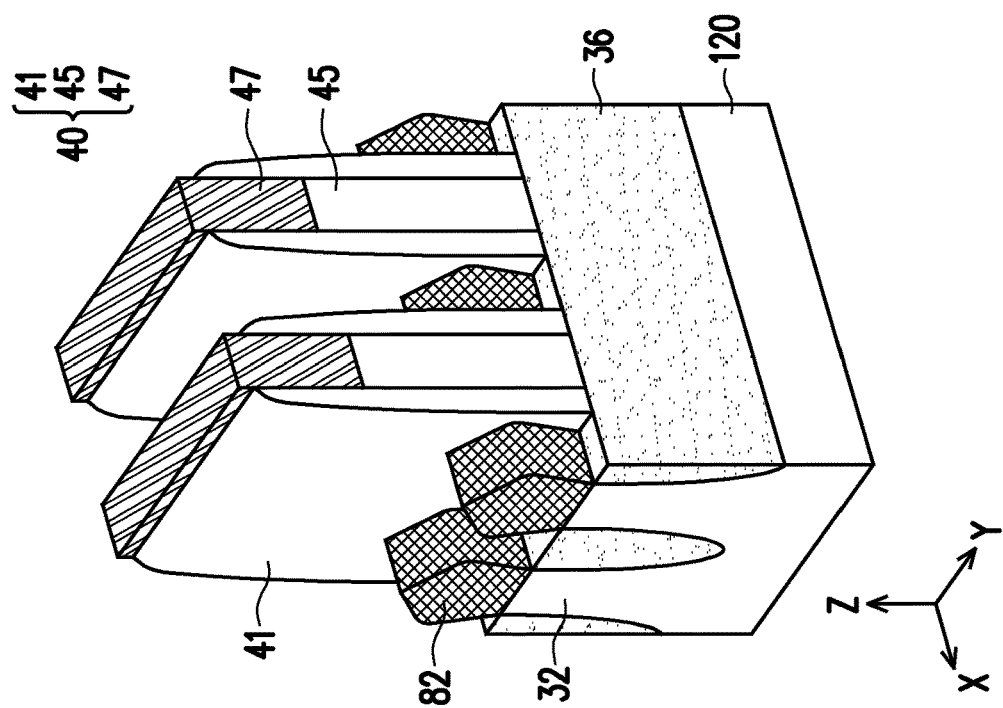

FIGS. 11A-11C illustrate formation of source/drain regions 82 corresponding to act 1400 of FIG. 14. In the illustrated embodiment, the source/drain regions 82 are epitaxially grown from epitaxial material(s). In some embodiments, the source/drain regions 82 exert stress in the respective channels 22A-22C, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 32.

The source/drain regions 82 may be implanted with dopants followed by an anneal. The source/drain regions may have an impurity concentration of between about $10^{19}$ cm$^{-3}$ and about $10^{21}$ cm$^{-3}$. N-type or p-type impurities for source/drain regions 82 may be any of the impurities previously discussed. In some embodiments, the source/drain regions 82 are in situ doped during growth. A contact etch stop layer (CESL) and interlayer dielectric (ILD), not illustrated for simplicity, may then be formed covering the dummy gate structures 40 and the source/drain regions 82.

The GAA devices further include an interlayer dielectric (ILD). The ILD provides electrical isolation between the various components of the GAA devices 10 discussed above, for example between the gate structures and the source/drain contacts.

Figure 12C:
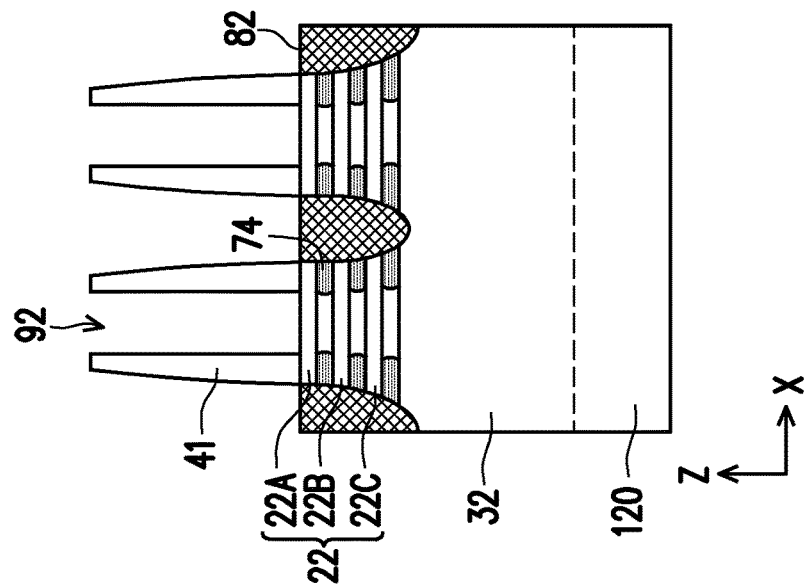
Figure 12B:
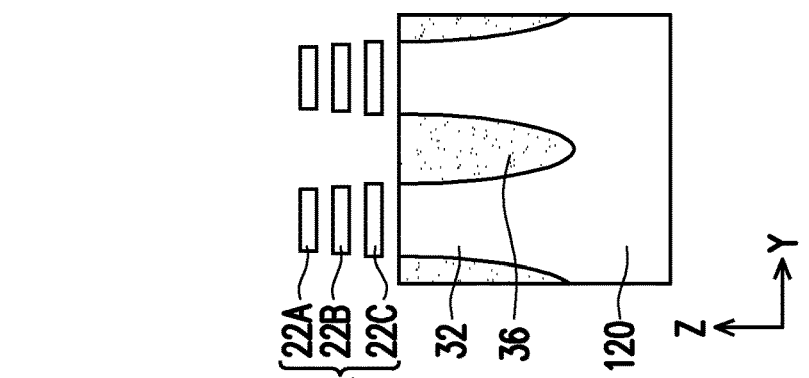
Figure 12A:
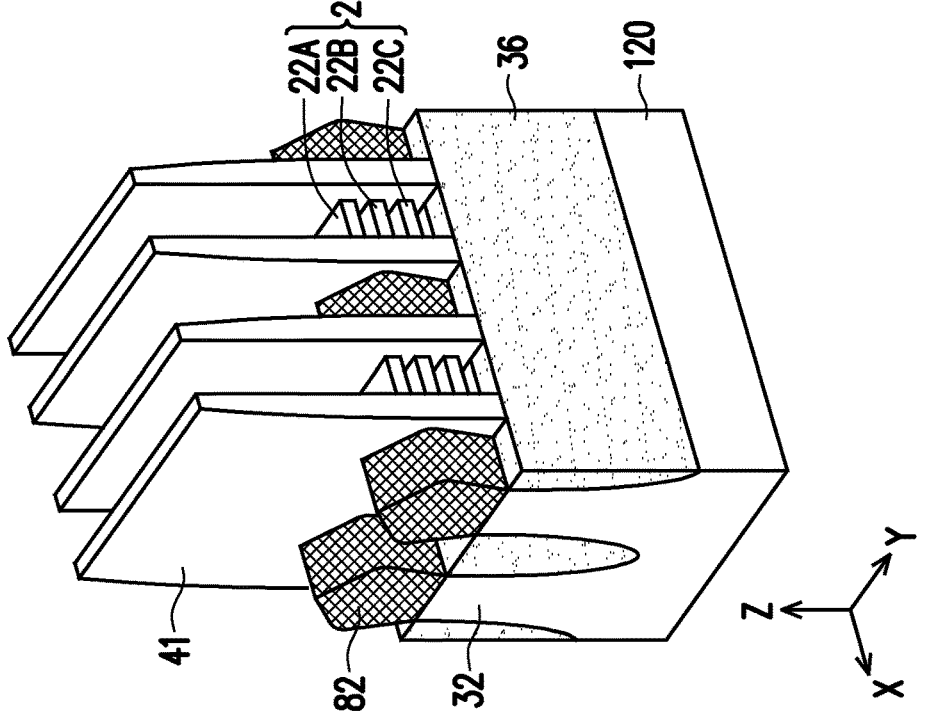

FIG. 12A, FIG. 12B, and FIG. 12C illustrate release of fin channels 22A-22C by removal of the nanostructures 24A-24C, the mask layer 47, and the dummy gate layer 45, which corresponds to act 1500 of FIG. 14. A planarization process, such as a CMP, is performed to level the top surfaces of the dummy gate layer 45 and gate spacer layer 41. The planarization process may also remove the mask layer 47 (see FIG. 10A) on the dummy gate layer 45, and portions of the gate spacer layer 41 along sidewalls of the mask layer 47. Accordingly, the top surfaces of the dummy gate layer 45 are exposed.

Next, the dummy gate layer 45 is removed in an etching process, so that recesses 92 are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric, when present, may be used as an etch stop layer when the dummy gate layer 45 is etched. The dummy gate dielectric may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., substantially parallel to a major upper surface of the third substrate layer 120). The nanosheets may be collectively referred to as the channels 22 of the GAA devices 10 formed.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises $F_2$ and HF, and the carrier gas may be an inert gas such as Ar, He, $N_2$, combinations thereof, or the like.

In some embodiments, the nanostructures 24 are removed and the nanostructures 22 are patterned to form channel regions of both PFETs and NFET. However, in some embodiments the nanostructures 24 may be removed and the nanostructures 22 may be patterned to form channel regions of the NFET, and nanostructures 22 may be removed and the nanostructures 24 may be patterned to form channel regions of the PFET. In some embodiments, the nanostructures 22 may be removed and the nanostructures 24 may be patterned to form channel regions of the NFET, and the nanostructures 24 may be removed and the nanostructures 22 may be patterned to form channel regions of the PFET. In some embodiments, the nanostructures 22 may be removed and the nanostructures 24 may be patterned to form channel regions of both PFETs and NFETs.

In some embodiments, the nanosheets 22 of the GAA devices 10 are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Next, in FIGS. 13A-13C, replacement gates 200, such as the gate structures 200A, 200F, are formed, corresponding to act 1600 of FIG. 14. Each replacement gate 200 generally includes the first IL layer 210, the gate dielectric layer 220, the work function metal layers 300, the protection layer structure 270, and the gate fill layer 290N or 290P. In some embodiments, the replacement gate 200 further includes the second work function layer 700.

Additional processing may be performed to finish fabrication of the GAA device 10. For example, gate contacts (not illustrated for simplicity) and the source/drain contacts may be formed to electrically couple to the gate structures 200A-200F and the source/drain regions 82, respectively, corresponding to act 1700 of FIG. 14. An interconnect structure may then be formed over the source/drain contacts and the gate contacts corresponding to act 1800 of FIG. 14. The interconnect structure may include a plurality of dielectric layers surrounding metallic features, including conductive traces and conductive vias, which form electrical connection between devices on the substrate, such as the GAA devices 10, as well as to IC devices external to the IC device.

Figure 15:
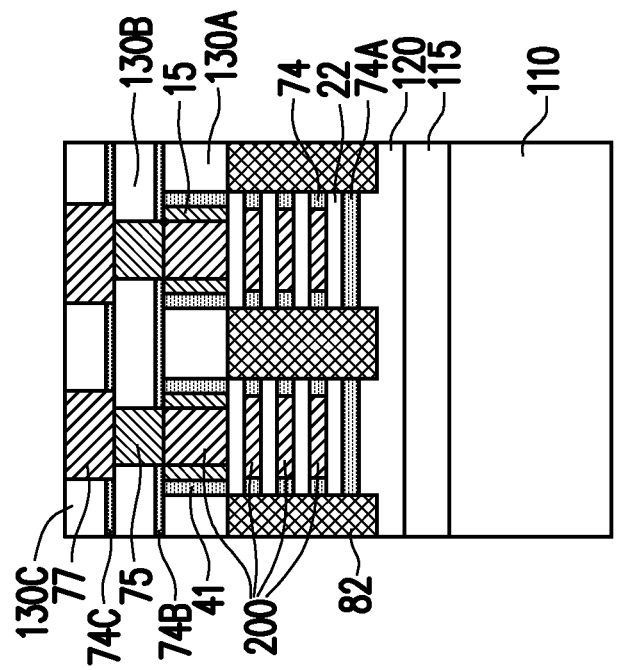

FIG. 5A through FIG. 13C illustrates a method of forming a GAA structure, in accordance with one or more embodiments. A person of ordinary skill in the art would readily understand that various other methods of forming a GAA structure may be employed. Further, one skilled in the art would understand that other layers can be formed during the GAA structure manufacturing process. FIG. 15 illustrates a GAA structure similar to that shown in FIG. 13C. However, a spacer layer 74A is additionally formed below the nanosheets 22. The spacer layer 74A may include the same material as the inner spacers 74. For example, the spacer layer 74A may be a layer formed of SiN. One method of forming the GAA structure as shown in FIG. 15 is to deposit the spacer layer 74A on the third substrate layer 120, and then form the nanosheets 22 on top of the spacer layer 74A along with the metal gate structure 200. Then the source/drain 82 may be formed by the etching and depositing process described in connection with FIGS. 5A to 11C.

FIG. 15 further shows a high-K ("HK") dielectric layer 15 that is between the gate structure 200 and the spacer layer 41. The high-K dielectric layer 15 includes high-k gate dielectric material in some embodiments, which may refer to dielectric materials having a high dielectric constant that is greater than a dielectric constant of silicon oxide (k≈3.9). Examples of high-k dielectric materials include $HfO_2$, HfSiO, HfSiON, HfTaO, HfTiO, HfZrO, $ZrO_2$, $Ta_2O_5$, or combinations thereof. This additional protection layer is introduced in the embodiments to prevent metal oxidation.

The GAA devices may further include a first interlayer dielectric (ILD0) 130A. The ILD0 130A provides electrical isolation between the various components of the GAA devices discussed above, for example between the gate structures 200 and the source/drain contacts 82.

FIG. 15 further shows a spacer layer 74B that may be formed on the ILD0 130A. One example method of forming the spacer layer 74B is planarizing the ILD0 130A, gate structure 200, the high-K dielectric layer 15, and the spacer layer 41. A CMP is one example of planarizing the top surface of the above layers which may be utilized in accordance with one or more embodiments. After the spacer layer 74B is formed, a first metal contact plug 75 may be formed to expose at least a part of the spacer layer 74B using an etching process. The first metal contact plug 75 may electrically contact the metal gate structure 200. One example of the material of the first metal contact plug 75 includes tungsten (W). However, other electrically conductive materials may be used.

The GAA devices may further include a second interlayer dielectric (ILD1) 130B between the first metal contact plugs 75. The ILD1 130B provides electrical isolation between the various components of the GAA devices. For example, the ILD1 130B provides electrical isolation between the first metal contact plugs 75.

FIG. 15 also shows forming a spacer layer 74C on a third interlayer dielectric ILD2 130C. One method of forming the spacer layer 74C is planarizing the ILD1 130B and the first metal contact plug 75. A CMP is one example of planarizing the top surface of the above layers. After the spacer layer 74C is formed using deposition or other methods, a second metal contact plug 77 may be formed to expose at least a part of the spacer layer 74C using an etching process. The second metal contact plug 77 may electrically contact the first metal contact plug 75. In some embodiments, the second metal contact plug 77 may partially contact the ILD1 130B. One example of the material of the second metal contact plug 77 includes copper (Cu). However, other electrically conductive materials may be used.

Figure 16:
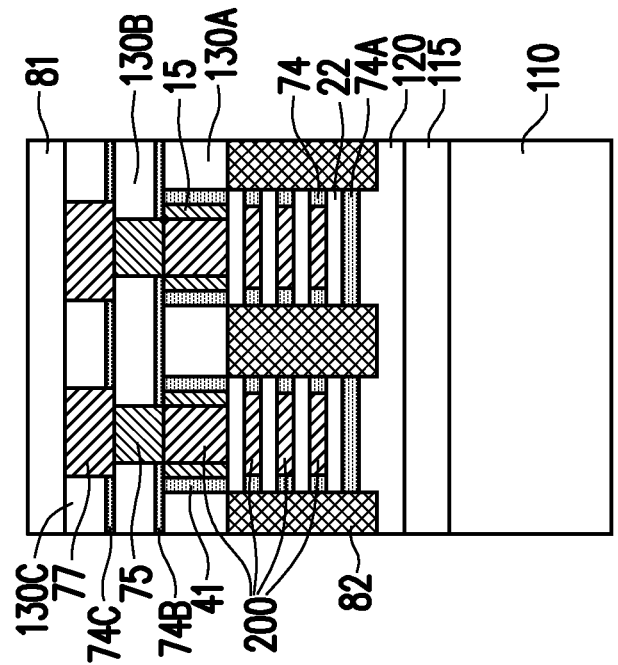

FIG. 16 illustrates formation of an oxide layer on the GAA structure of FIG. 15. The top surface of the GAA structure of FIG. 15 is planarized in order to deposit an oxide layer 81. For example, the top surface of the GAA structure may be planarized using a CMP. After the top surface is planarized, an oxide layer 81 is deposited using a high density plasma (HDP) CVD process. However, HDP CVD is one example of depositing the oxide layer 81 and other deposition method may be used. After forming the oxide layer 81, the top surface of the oxide layer 81 is planarized using a CMP.

Figure 17:
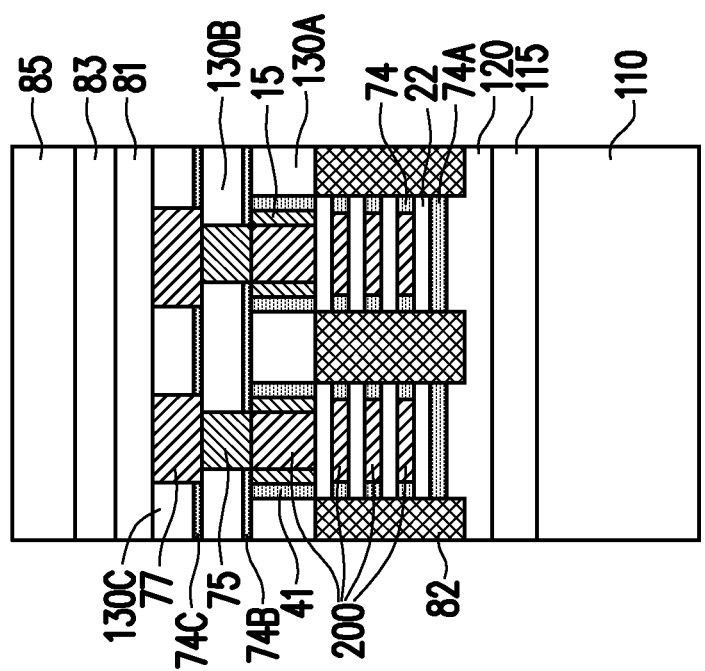

FIG. 17 illustrates forming another oxide layer 83 on the oxide layer 81 of the GAA structure. The oxide layer 83 is deposited on the oxide layer 81 for oxide bonding between the oxide layer 83 and the oxide layer 81. The top surface of the oxide layer 83 is planarized using a CMP and thereafter a carrier wafer 85 is bonded to the oxide layer 83.

Figure 18:
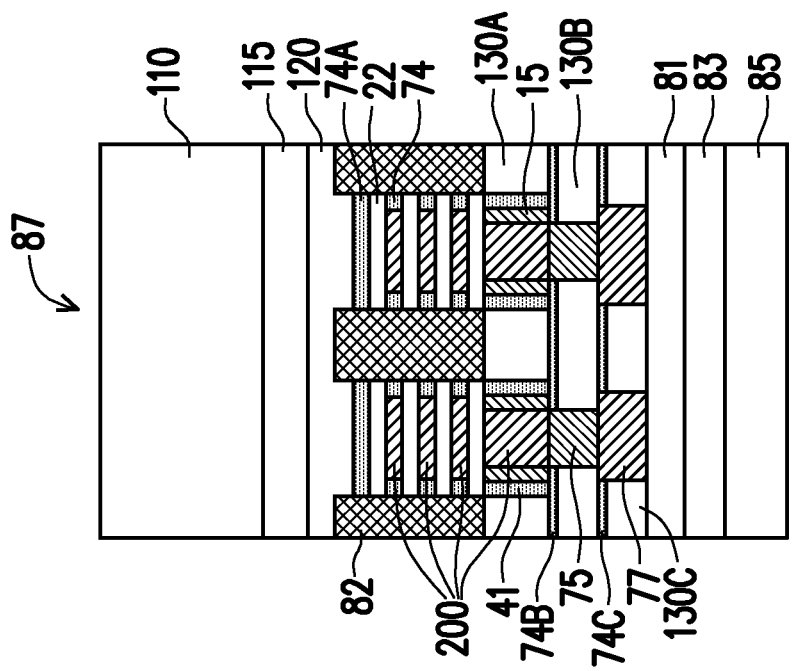

FIG. 18 illustrates flipping the GAA structure shown in FIG. 17. The GAA structure as shown in FIG. 18 now illustrate the carrier wafer 85 as being in the bottommost layer and the first substrate layer 110 in the topmost layer. The GAA structure is flipped so that a flipped side 87 of the GAA structure can be further processed to form various components on the flipped side 87 of the GAA structure. This addresses one or more problems of some approaches in the art which suffered from the physical spatial limitation of forming both the logic devices (e.g., IC chips) and passive devices on the same side of the substrate.

Figure 19:
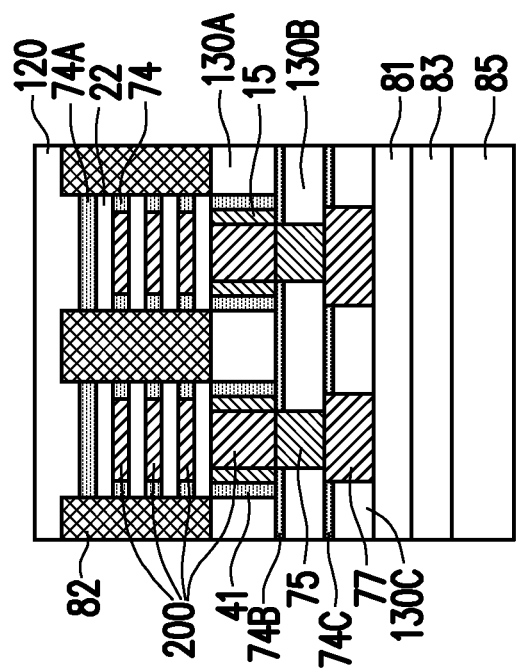

FIG. 19 illustrates removing one or more substrates of the GAA structure. To transition from the intermediate stage of FIG. 18 to the process stage shown in FIG. 19, a wafer grinding or wafer thinning operation, which may include mechanical wafer grinding, silicon etching, CMP, or combinations of these processes, is performed on the (now upper) surface of substrate layer 120. For example, through the thinning process, the first substrate layer 110 and the second substrate layer 115 are removed. In other embodiments, the first substrate layer 110 and the second substrate layer 115 can be removed entirely and a portion of the third substrate layer 120 may also be removed.

Figure 20:
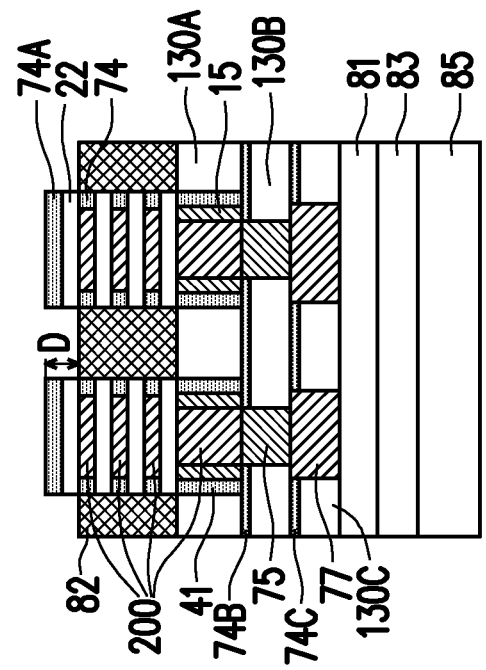

FIG. 20 illustrates removing one or more layers of the GAA structure. As shown, the third substrate layer 120 is entirely removed using, for example, a CMP. Although not explicitly shown, a person skilled in the art would readily understand how the process of removal is performed. For example, the CMP may be used to planarize the surface until it reaches the spacer layer 74A. In some embodiments, the CMP may remove a portion of the top surface of the spacer layer 74A. At this point, the top surface of the source/drain 82 and the top surface of the spacer layer 74A will be coplanar with each other due the planarization process. In order to selectively etch the source/drain 82 to a desirable depth D, a mask may be used on top of the spacer layer 74A so that the spacer layer 74A is not removed through the etching process. After the etching of the source/drain 82 is complete, the mask on the spacer layer 74A may be removed.

Figure 21:
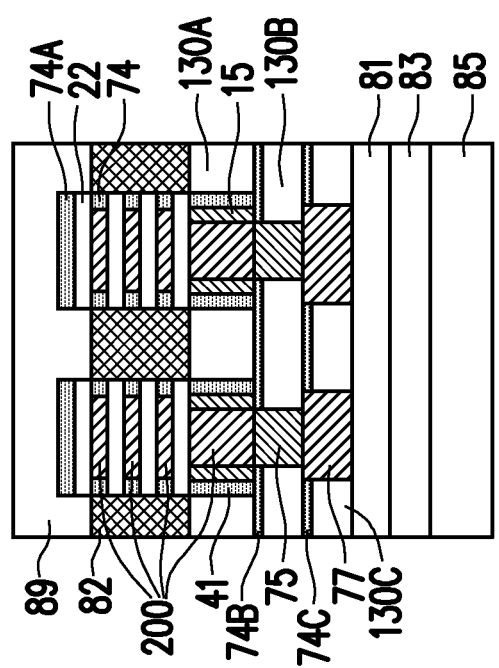

FIG. 21 illustrates adding one or more layers on the GAA structure. As shown, a fourth interlayer dielectric 89 may be formed on the exposed portions of the source/drain 82 and a portion of the nanosheets 22 and the spacer layer 74A. The fourth interlayer dielectric 89 may include materials such as SiCN, oxide, or the like. The fourth interlayer dielectric 89 may be deposited on the GAA structure through various example deposition methods previously described.

Figure 22:
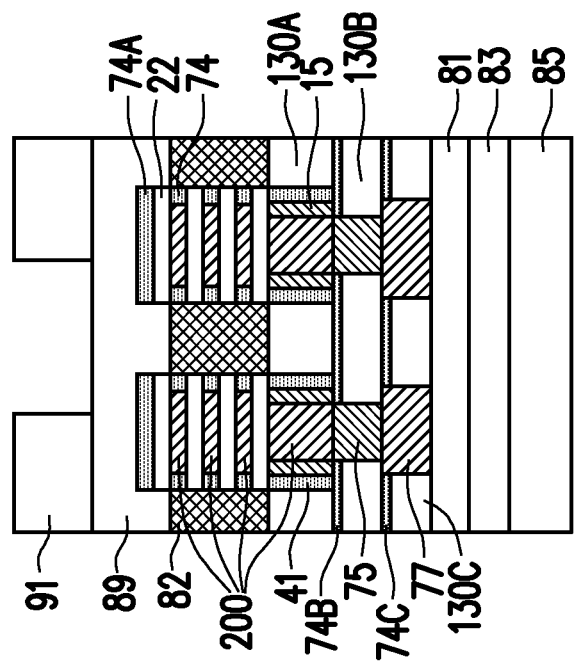

FIG. 22 illustrates adding a photomask for patterning layers of the GAA structure. As shown, a photomask 91 may be provided on the fourth interlayer dielectric 89. Some portions of the fourth interlayer dielectric 89 may be exposed so that the exposed portion may be etched and removed.

FIG. 23 illustrates etching some portions of the fourth interlayer dielectric 89. In the etching process, a dry etching or a wet etching process may be used. As a result of the etching process, a void 92 is formed. For example, a side wall 89S of the fourth interlayer dielectric 89 is exposed and one or more surfaces of the spacer layer 74A, the nanosheets 22, and the inner spacers 74 may be exposed. Once the etching process is complete, the photomask 91 may be removed from the top surfaces of the fourth interlayer dielectric 89.

FIG. 24 illustrates forming a contact plug 93 in the void 92 formed at FIG. 23. In some embodiments, the void 92 may be filled with a conductive material to form the contact plug 93. The conductive material may be formed of, for example, doped polysilicon, a metal, metal silicide, conductive metal nitride, or a combination thereof. The contact silicide that is formed on the EPI may include CoSi, TiSi, NiSi, or the like. However, the materials are not limited to the aforementioned materials. The contact plug metal may include various metals that have low resistivity. Some examples include but are not limited to Co, Ru, Ir, W, or the like. A portion of the conductive material filling an upper portion of the void 92 is removed to form the contact plug 93 filling the void 92 and electrically connecting with the GAA device.

Figure 25:
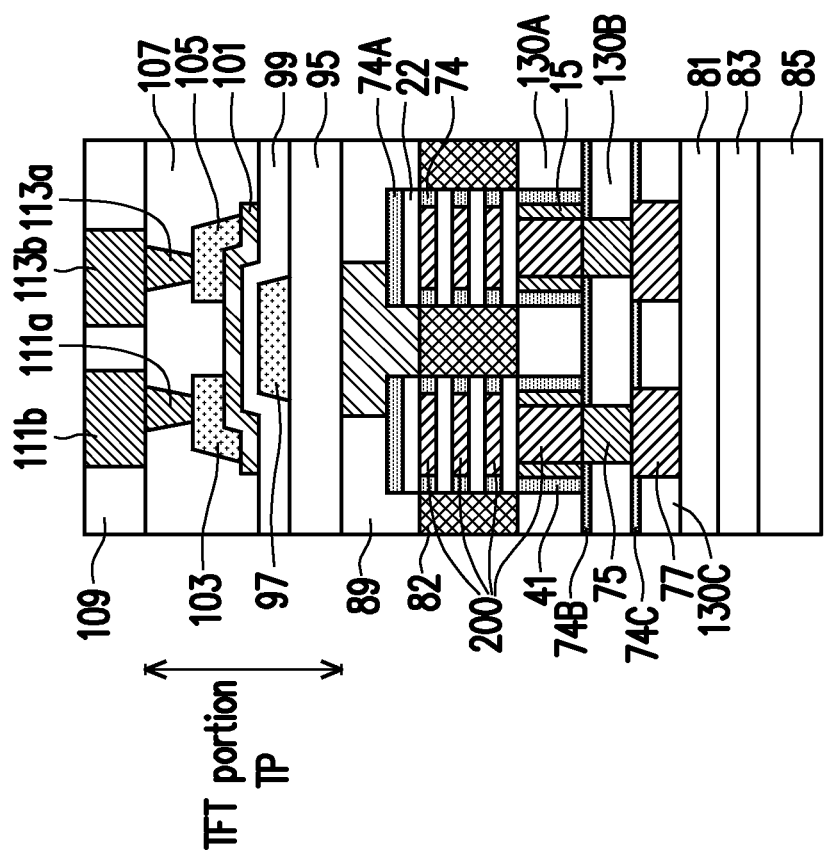

FIG. 25 illustrates forming a thin film transistor (TFT) on the contact plug 93. Various types of TFTs may be formed. In this embodiment, a method of forming an IGZO TFT will be explained as an example. A first insulating layer 95 may be formed on the contact plug 93. Then a gate film is formed on the first insulating layer 95 by PVD, and then the gate film is exposed to radiation, and subjected to dry etching to obtain a gate pattern 97. In some embodiments, the gate pattern 97 includes or made of copper (Cu). Next, a GI (Gate Insulator) film 99 is formed by CVD on the first insulating layer 95. In some embodiments, the GI film 99 includes or made of silicon dioxide (SiO$_2$). Next an active semiconductor layer 101 may be formed on the GI film 99. Subsequently, a source film and drain film may be formed on the active semiconductor layer 101. The source film and the drain film are exposed to radiation and subjected to wet etching to obtain a source pattern 103 and a drain pattern 105. The arrangement of the source and drain may interchange. In other embodiments, source pattern may be 105 and the drain pattern may be 103. In some embodiments, the source and the drain pattern includes or are made of copper (Cu).

A PV (Passivation) film 107 may be formed by CVD on the entire resulting structure and an insulating layer 109 may be formed on top of the PV film 107. The PV film 107 includes, for example, SiO$_2$. In order to provide electrical connection for the TFT, one or more contact holes extending through the PV film 107 and the insulating layer 109 may be formed. The one or more contact holes may extend and expose the source and the drain pattern 103, 105 by dry etching. The contact hole is filled with contact plugs 111, 113 to electrically connect to the source and the drain pattern 103, 105.

The contact plugs 111, 113 can be formed by the following methods. As a first method, a transistor having a gate 97 and a source/drain 103/105 is formed. Before an interlayer insulating film 107 is formed on the whole structure, a polysilicon layer is formed on a junction region such as a source/drain 103/105, thus forming a first plug 111a/113a. Thereafter, an interlayer insulating film 109 is formed on the whole structure and a second plug 111b/113b is then formed through common processes. Thereby, a contact plug 111 having the first and second plugs 111a/111b and a contact plug 113 having the first and second plugs 113a/113b are formed. In some embodiments, the second plug can be formed using tungsten. As a second method, a transistor having a gate 97 and a source/drain 103/105 is formed. Before an interlayer insulating film 107 is formed on the whole structure, only a region such as a source/drain 103/105 can be grown by a selective epitaxial growth process, thus forming a first plug 111a/113a. Thereafter, an interlayer insulating film 109 is formed on the whole structure and a second plug 111b/113b is formed through typical processes. Thereby, a contact plug 111 having the first and second plugs 111a/111b and a contact plug 113 having the first and second plugs 113a/113b are formed. In some embodiments, the contact plugs can be formed using tungsten.

A portion where the TFT is formed may be referred to as the TFT portion TP for simplicity and for convenience. The TFT portion TP as shown in FIG. 25 includes layer 95 and the TFT formed on top of the layer 95. In some cases, the TFT portion TP may not include layer 95 and only include the portion of the layers where the TFT is formed. In other cases, the TFT portion TP may include layer 95, the layers where the TFT is formed (e.g., layers 97, 99, 101, 103, 105, 107), and layer 109. Hereinafter, the TFT portion TP may be used to indicate these portions and layers of the TFT for simplicity purposes.

Figure 26:
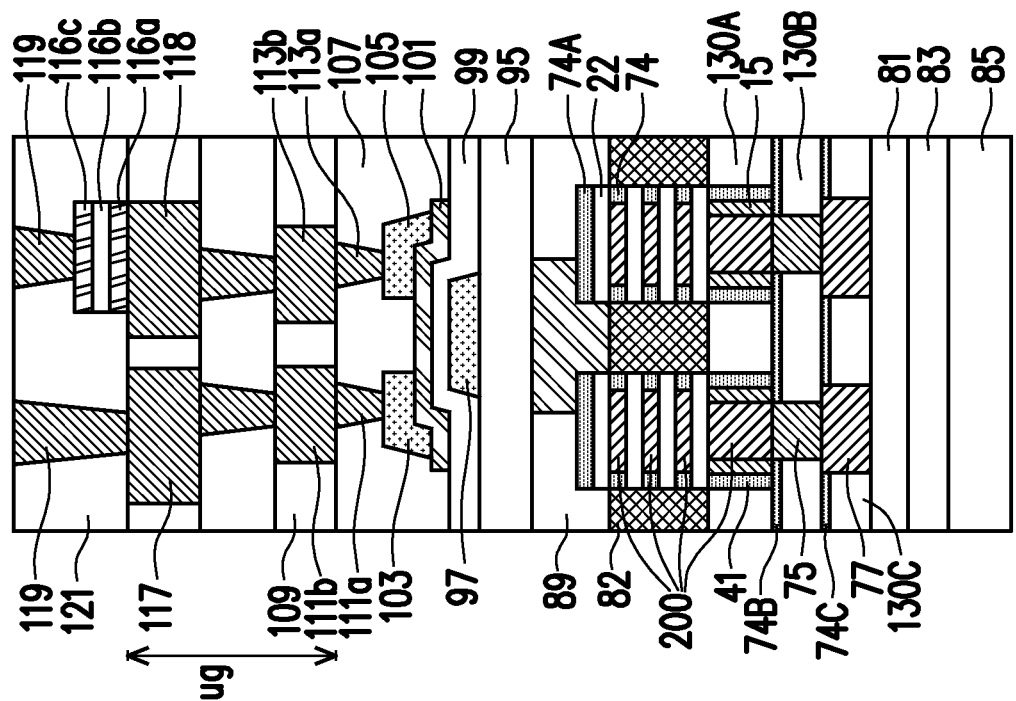
Figure 27:
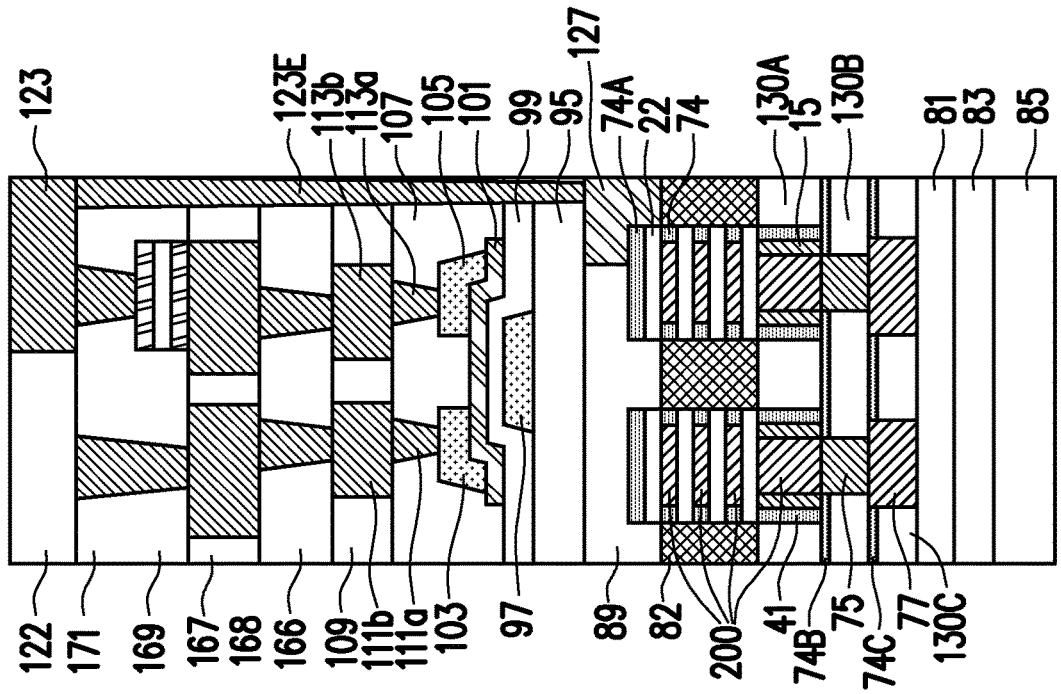

FIG. 26 illustrates forming one or more contact plugs on the TFT portion TP. One approach for forming contact plugs is removing a portion of an insulation layer to form a void. And then filling the void with a conductive material to form the contact plug. The conductive material may be formed of, for example, doped polysilicon, a metal, metal silicide, conductive metal nitride, or a combination thereof. The one or more contact plugs are used to provide electrical connectivity to other components within the semiconductor device.

In FIG. 26, a first contact plug 117 is connected to a source 103 via other contact plugs connected to the source 103 and a second contact plug 118 is connected to a drain 105 via other contact plugs connected to the drain 105. In some embodiments, a metal-insulator-metal structure (MIM structure) 116 (includes 116a, 116b, 116c) is formed on the second contact plug 118. MIM structure 116 includes an MIM capacitor. An example of making a MIM capacitor includes forming a first metal layer 116a by depositing the first metal layer 116a on the second contact plug 118. Then an insulator layer 116b may be deposited on the first metal layer 116a. The deposition of the first metal layer 116a or the insulator layer 116b may be achieved by using conformal deposition, such as chemical vapor deposition (CVD), physical vapor deposition (PVD), or any other suitable technique now known or later developed. A second metal layer 116c may then be formed on the insulator layer 116b.

After the MIM structure 116 is formed, an insulation layer 121 is deposited. Further, portions of the insulation layer 121 are etched to form a void for the contact plugs 119. The contact plugs 119 may be formed using the method as explained previously.

FIG. 27 illustrates forming a via to connect the MIM structure to the GAA device. An insulation layer 122 is formed on the MIM structure 116 and the contact plugs 119. Although not mentioned in every place, a person of ordinary skill in the art would readily understand that various methods including a CMP may be used in order to planarize the top surface of the previously deposited layer before depositing additional layers on top of the previous layer.

One approach for forming a via 123 is forming a photoresist or hard mask layer (not shown) over the exposed surface of the insulation layer 122. Openings OP are formed in the photoresist or hard mask layer, using photolithography and etch processes. Using the openings OP and using the photoresist layer as an etch mask, vias are formed. One example of vias include through oxide vias (TOVs). The TOVs may extend through the layers adjacent to the MIM structure 116, the contact plug portion CP, the TFT portion TP, to expose and contact the top most layer of the metallization structure 124 of the GAA device.

Figure 29:
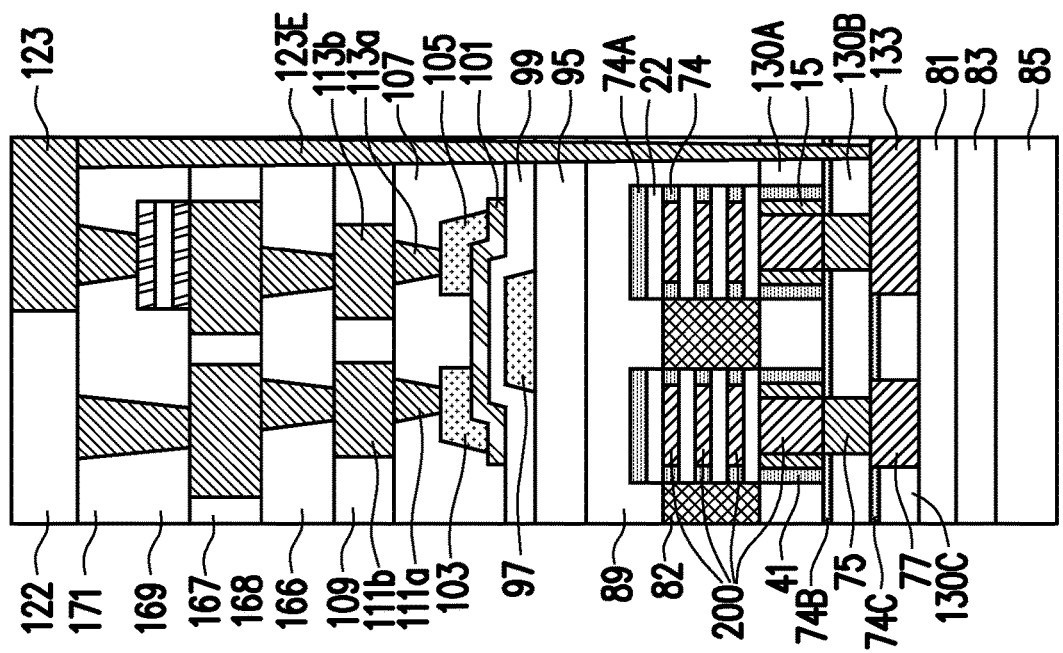
FIG. 29 illustrates a via connecting to a metallization structure located in the bottom most layer of the GAA device, in accordance with some embodiments.

In some embodiments, the etch process used to form the TOVs is an oxide etch process, and may be performed by an RIE etch (i.e., reactive-ion etching), which is particularly well suited to the high aspect ratio and anisotropic properties in forming a narrow via openings in an HDP oxide and extending into the oxide layers. Because the etch is an oxide etch, it may be performed at temperatures that have a relatively low thermal impact on the materials in the GAA device. In some embodiments, TOVs extending portion 123E may be connected to any part of the GAA device. FIG. 28 illustrates the TOVs connecting to a contact plug 127 located on the GAA device and below the TFT. FIG. 29 illustrates TOVs connecting to a metallization structure 133 located in the bottom most layer of the GAA device. That is, the various oxide layers mounted on the GAA device may be etched to form opening that continues into another oxide layer and then into yet another oxide layer. In some embodiments, the entire etch process is oxide etching. In some embodiments, the problems such as the "corner" stresses (e.g., stress applied at the corners of the device) may not occur when the embodiments with the TOVs are used. The MIM structure 116 (e.g., MIM resistor) connected to the TFT (e.g., IGZO TFT) forms a 1T1R (e.g., one transistor and one resistor) RRAM. Accordingly, by connecting the RRAM device with the front side logic device (e.g., GAA device) with the TOV, it is possible to formulate a high density stacked logic and passive device.

Figure 30:
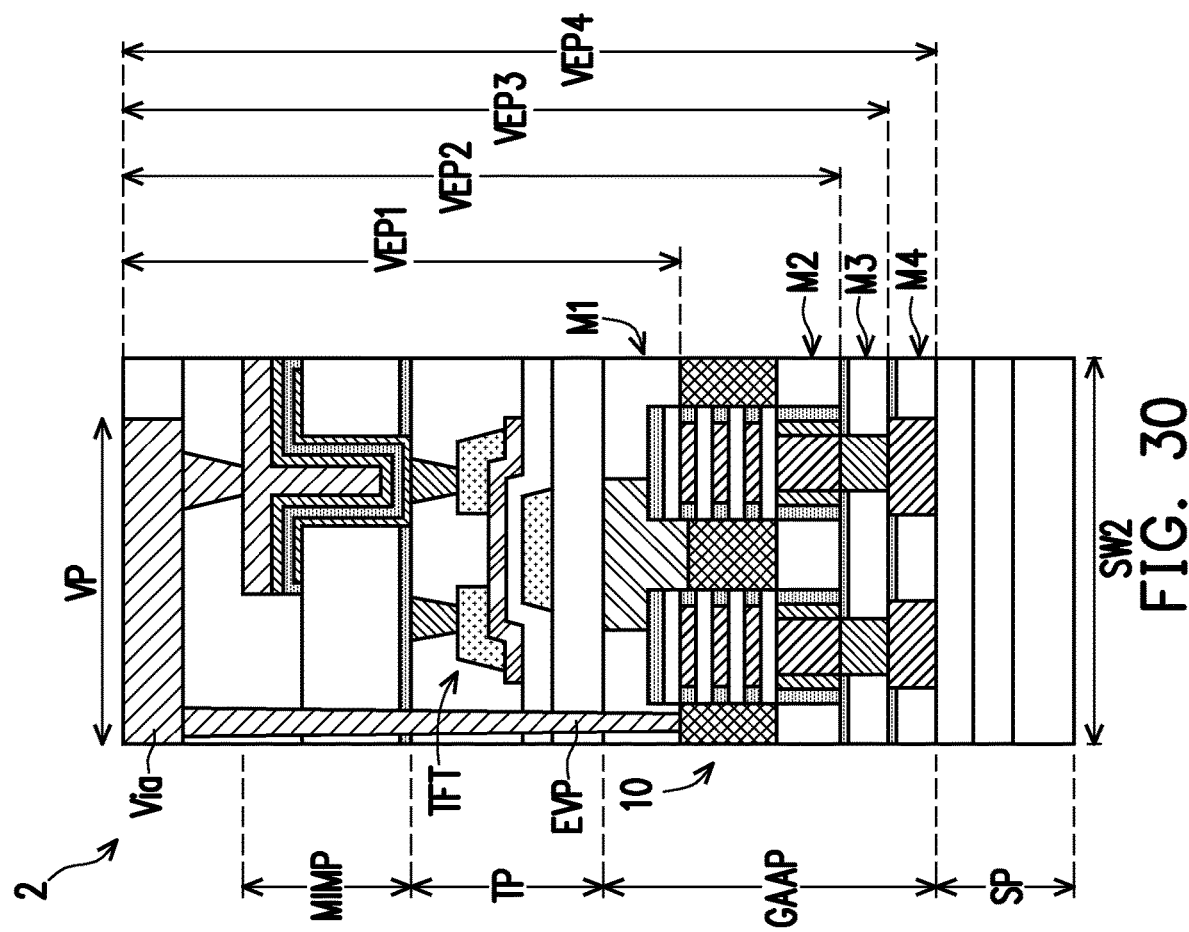
FIG. 30 illustrates a semiconductor device according to some embodiments of the present disclosure.

FIG. 30 illustrates a semiconductor device 2 according to some embodiments of the present disclosure. FIGS. 31 to 37 illustrate one method of forming a device shown in FIG. 30. Accordingly, FIG. 37 and FIG. 30 show identical cross-section of the semiconductor device 2.

Referring to FIG. 30, the semiconductor device 2 includes a substrate portion SP, a GAA device portion GAAP, a transistor portion TP, a MIM structure portion MIMP, and a via. A GAA device 10 is formed on the substrate portion SP. The transistor portion TP is formed on the GAA device 10 or the GAA device portion GAAP. On the transistor portion TP, an MIM capacitor is formed in the MIM structure portion MIMP. The MIM capacitor is electrically connected to either the source or the drain of the transistor TFT in the transistor portion TP. The via is formed on the MIM capacitor. One end of the via is electrically connected to the MIM capacitor. The other end of the via extends downward and connects to a layer of the GAA device 10. That is, an extended via portion EVP contacts the layer of the GAA device 10. This connection (either electrical or physical, or both) using the via allows the MIM capacitor which is spaced apart from the GAA device 10 to be connected to each other.

As shown in FIG. 30, the GAA device 10, the transistor TFT, the MIM capacitor in the MIM structure portion MIMP, and the via are vertically stacked and these components at least partially overlap each other.

The semiconductor device 2 may have a selected width SW2 as shown in FIG. 30. In one or more embodiments, the GAA device 10, the transistor TFT, the MIM capacitor, and the via may be arranged to be within this selected width SW2. This feature is made possible partly due to the narrow via having a high aspect ratio that connects the GAA device 10 with a passive device (e.g., MIM capacitor) on the opposite side of the GAA device 10.

In some embodiments, the via portion VP where the via is located overlaps with at least a portion of the transistor TFT. The extended via portion EVP is spaced apart from either the source or the drain of the TFT so that the extended via portion EVP does not contact either the source or the drain of the TFT. The extended via portion EVP may not contact a gate or a semiconductor layer of the TFT as well.

In some embodiments, the via portion VP where the via is located overlaps with at least a portion of the MIM structure portion MIMP. The extended via portion EVP is spaced apart from the MIM capacitor in the MIM structure portion MIMP so that the extended via portion EVP does not make an electrical contact with the MIM capacitor from a lateral direction. For example, one end of the via may be electrically connected to a top metal layer of the MIM capacitor. However, the extended via portion EVP which is laterally spaced apart from the MIM capacitor may not contact the MIM structure from the lateral direction.

In some embodiments, the via portion VP where the via is located overlaps with at least a portion of the GAA device 10. The extended via portion EVP may be configured to extend to any layer of the GAA device 10. For example, in one embodiment, the extended via portion EVP may extend a distance VEP1 to reach and contact a first layer M1 of the GAA device 10. In another embodiment, the extended via portion EVP may extend a distance VEP2 to reach and contact a second layer M2 of the GAA device 10. In another embodiment, the extended via portion EVP may extend a distance VEP3 to reach and contact a third layer M3 of the GAA device 10. In another embodiment, the extended via portion EVP may extend a distance VEP4 to reach and contact a fourth layer M4 of the GAA device 10.

In some embodiments, a contact plug (not shown) may be further formed so that the contact plug functions as a middle component between the GAA device 10 and the extended via portion EVP. An example of this embodiment is shown in FIGS. 38, and 44.

Figure 31:
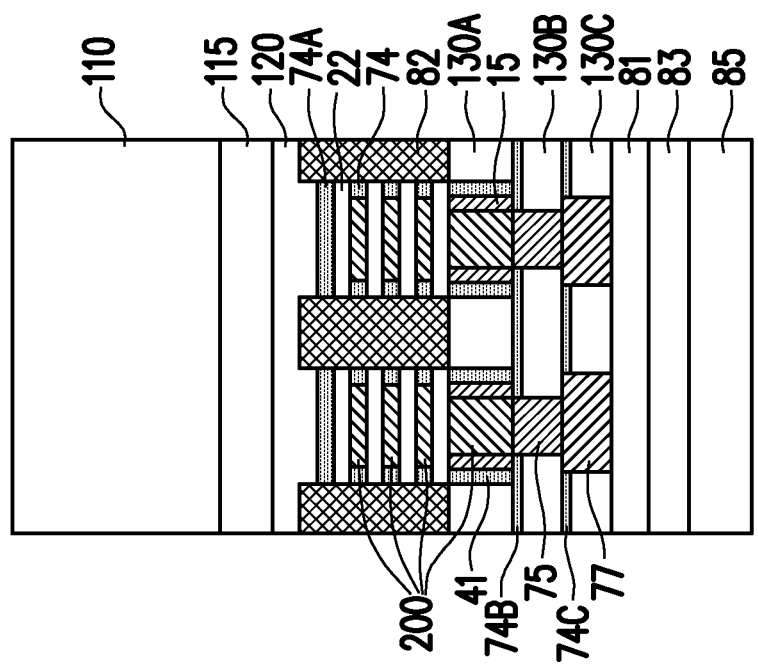
FIGS. 31 to 37 illustrate a method of forming a device shown in FIG. 30, in accordance with some embodiments.
Figure 32:
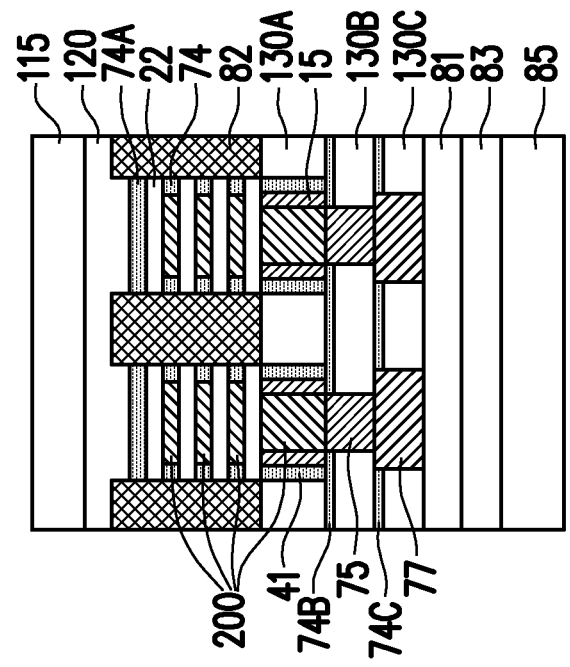

FIGS. 31 to 37 illustrate a method of forming a device shown in FIG. 30, in accordance with one or more embodiments. The method for forming a device as shown in FIG. 31 is identical to the method explained in connection with FIGS. 2 to 18. That is, the structure shown in FIG. 31 may be identical to the structure shown in FIG. 18. FIG. 32 illustrates a process that is similar to the process shown in connection with FIG. 19. However, in FIG. 32, the thinning of the substrates stops on the second substrate layer 115. In some embodiments, a portion of the second substrate layer 115 may be removed as well, for example, a thickness of the second substrate layer 115 may be reduced by the thinning of the backside of the substrate. A CMP may be used to planarize the top surface of the second substrate layer 115. As shown, in FIG. 33, a photomask 141 may be provided on some portions of the second substrate layer 115. That is, some portions of the second substrate layer 115 may be exposed so that the exposed portion may be etched and removed. After the photomask 141 is formed, a portion not covered by the photomask 141 is etched. In the etching process, a dry etching or a wet etching process may be used. As a result of the etching process, a void V is formed. For example, side walls of the second substrate layer 115 and the third substrate layer 120 are exposed and one or more surfaces of the spacer layer 74A, and the source/drain region 82 may be exposed. Once the etching process is complete, the second substrate layer 115 and the third substrate layer 120 are removed and the photomask 141 may also be removed from the top surfaces of the second substrate layer 115.

Figure 34:
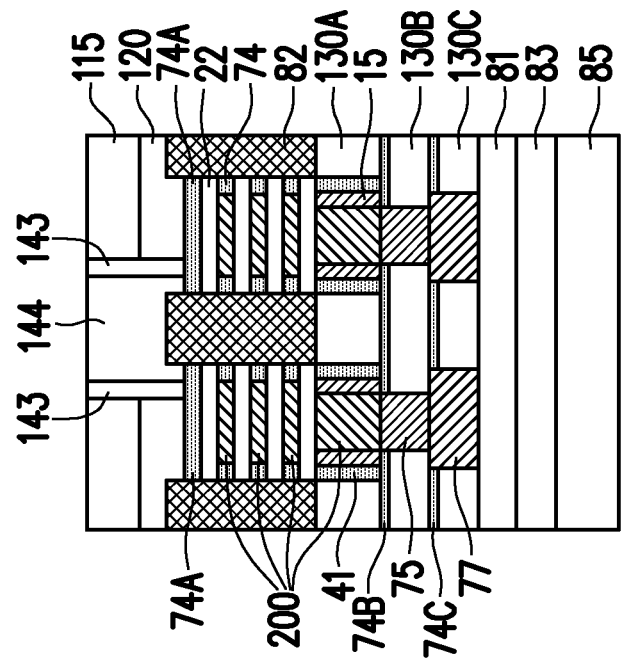
Figure 33:
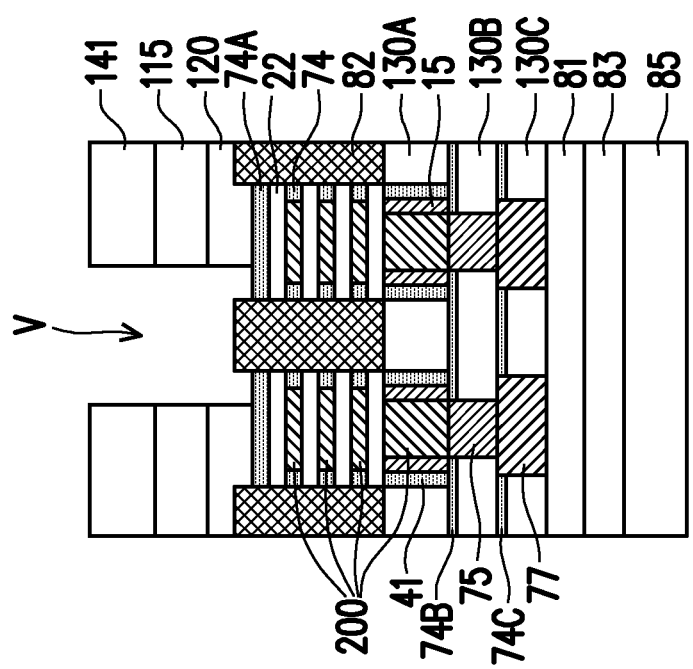

FIG. 34 illustrates forming a liner structure 143 and a via 144 on the device shown in FIG. 33. In some embodiments, the via 144 includes backside vias VB. The liner structure 143 is formed on the sidewalls of the second and third substrates 115, 120 and the spacer layer 74A. In some embodiments, the liner structure 143 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The liner structure 143 may be formed by depositing a spacer material layer (not shown) over the void V. Portions of the spacer material layer are removed using an anisotropic etching process, in accordance with some embodiments. Thereafter, a metallic material may be filled to form the via 144. The overflown metal material may be removed through the CMP process.

Figure 35:
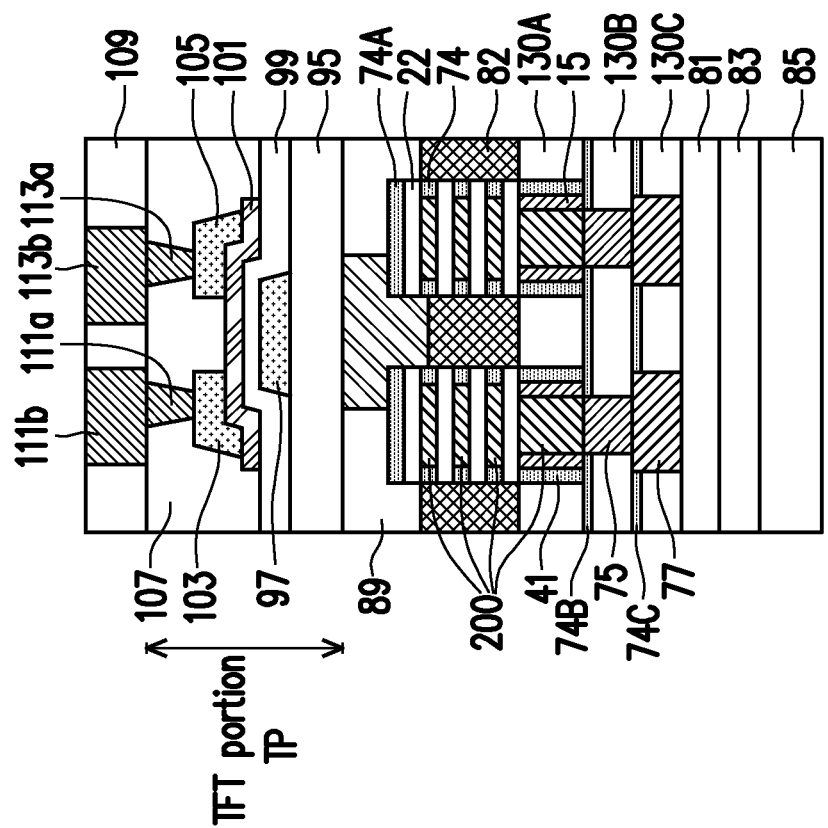

FIG. 35 illustrates forming a TFT on top of the device shown in FIG. 34. The process of forming a TFT may be similar or identical to that shown in FIG. 25. However, other conventional methods of forming a TFT may be used.

Figure 36:
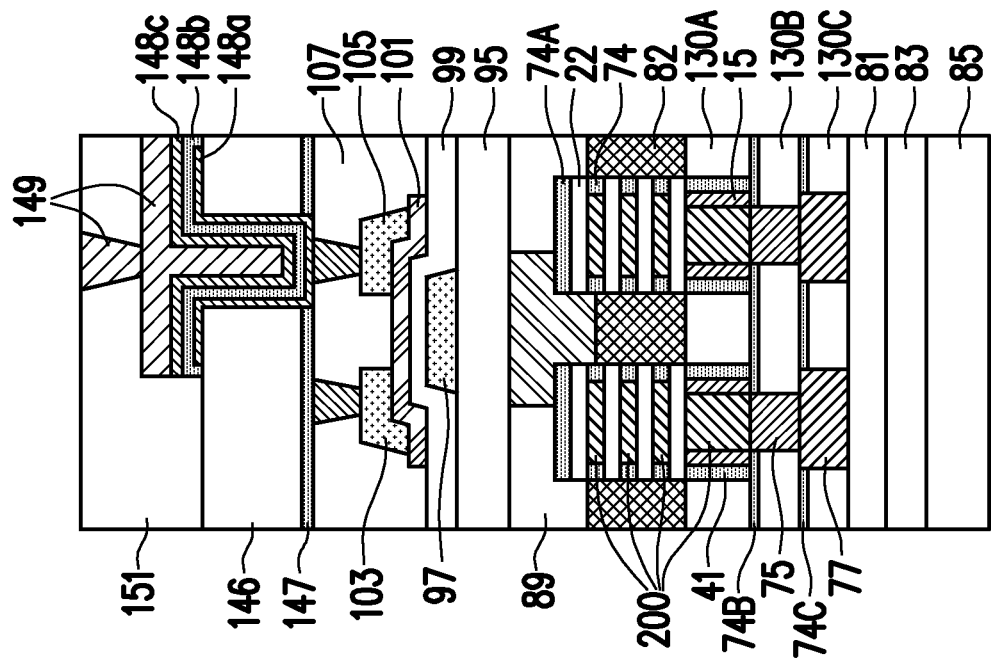
Figure 37:
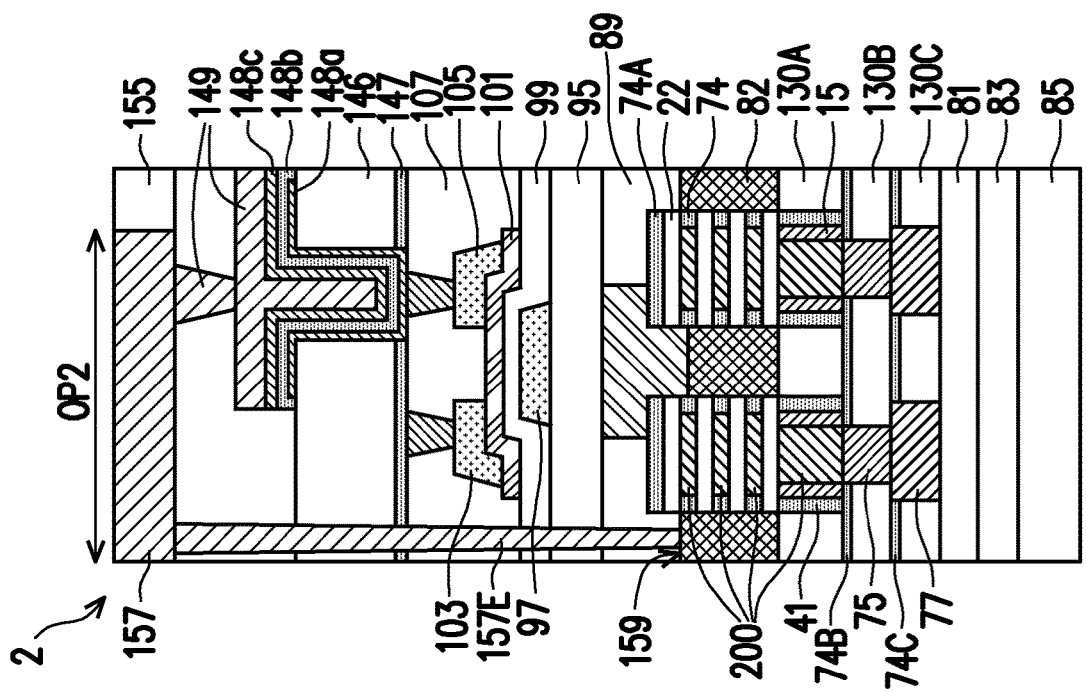

FIG. 36 illustrates forming a MIM capacitor 148 on the TFT. Referring to FIG. 36, an inter-layer dielectric layer 146 is deposited over an etch stop layer (not shown). The ILD layer 146 may be formed of silicon oxide or a low-k dielectric material by chemical vapor deposition (CVD), high density plasma CVD, spin-on, PVD (or sputtering), or other suitable methods. Next, openings are formed in the ILD layer 146, by using a photo lithographical process. Then, a further etching step takes place to etch away the etch stop layer 144 in the opening. This etching step also etches a portion of a first etch stop layer 147, to expose the contact 113a of the TFT. In some embodiments, the etch step terminates before all of the first etch stop layer 147 is removed, so that the ILD layer 107 is not exposed.

The bottom electrode layers 148a for the MIM capacitors 148 are formed. Specifically, a metal layer 148 is deposited to partially fill in the trenches (or voids). In trenches, the metal layer forms the bottom electrode layers 148 and engages the top faces of the contacts 113a, and is thus electrically connected to the doped regions of the transistor TFT. In the trench, the metal layer forms the bottom electrode layer 148 and is thus electrically connected to the TFT. In some embodiments, the electrode layer 148 may be formed so that the electrode layers 148 do not come in physical contact with the ILD layer 107 due to the existence of the etch stop layers 147 (the other one is not shown in the figure). In one or more embodiments, the metal is a layer of TiN deposited to a thickness ranging from about 100 to about 500 Å, but in other embodiments may be thicker or thinner. It may be formed by atomic layer deposition (ALD), PVD, CVD, or other suitable technique. Subsequently, the portions of the metal layer outside the trenches are removed by a suitable process such as CMP.

An insulator 148b and top electrode layer 148c of the MIM capacitor 114 are next formed. In the trench, the dielectric layer forms the insulator 148b. In one or more embodiments, the dielectric layer is a layer of $ZrO_2$ deposited to a thickness ranging from about 50 to about 400 Å, but in other embodiments may be thicker or thinner. It may be formed by ALD, PVD, CVD, or other suitable technique. Next, a second metal layer is deposited over the dielectric layer. In the trench, the second metal layer forms the top electrodes 148c. In one or more embodiments, the metal is a layer of TiN deposited to a thickness ranging from about 100 to about 500 Å, but in other embodiments may be thicker or thinner. It may be formed by ALD, PVD, CVD, or other suitable technique. Next, a contact plug 149 may be filled in the trench part of MIM capacitor 114 and on the top electrode layer 148c. An insulation layer 151 is formed on the MIM capacitor 148 and the contact plugs 149.

FIG. 37 illustrates forming a via to connect the MIM capacitor 148 to the GAA device. An insulation layer 151 is formed on the MIM capacitor 148 and the contact plugs 149. A CMP process may be utilized to planarize the top surface of the insulation layer 151 and the contact plug 149. Another insulation layer 155 is formed on the contact plug 149. One approach for forming a via 157 is forming a photoresist or hard mask layer (not shown) over the exposed surface of the insulation layer 155. Openings OP2 are formed in the photoresist or hard mask layer, using photolithography and etch processes. Using the openings OP2 and using the photoresist layer as an etch mask, vias are formed. One example of vias include through oxide vias (TOVs). The TOVs may extend through the layers adjacent to the MIM capacitor 148 and the TFT portion TP, to expose and contact the top most layer of the metallization structure 159 of the GAA device. At the completion of the forming the via as illustrated in FIG. 37, the semiconductor device 2 is formed and is the same as the semiconductor device 2 illustrated in FIG. 30.

In some embodiments, the etch process used to form the TOVs is an oxide etch process, and may be performed by an RIE etch, which is particularly well suited to the high aspect ratio and anisotropic properties in forming a narrow via openings in an HDP oxide and extending into the oxide layers. Because the etch is an oxide etch, it may be performed at temperatures that have a relatively low thermal impact on the materials in the GAA device. In some embodiments, TOVs extending portion 157E may be connected to any part or any layer of the GAA device.

FIG. 38 illustrates a semiconductor device 2' which is substantially the same as the semiconductor device 2 shown in FIG. 37, except that the TOVs are connected to a contact plug 161 located on the GAA device and below the TFT. The contact plug 161 may be formed based on the same or similar process described in connection with FIG. 24. The difference between FIG. 38 and FIG. 24 is the location in which the contact plug 161 is formed. However, based on where the photoresist or hard mask layer is formed, the method of forming a contact plug in a different location will be readily apparent to a person of ordinary skill in the art.

Figure 39:
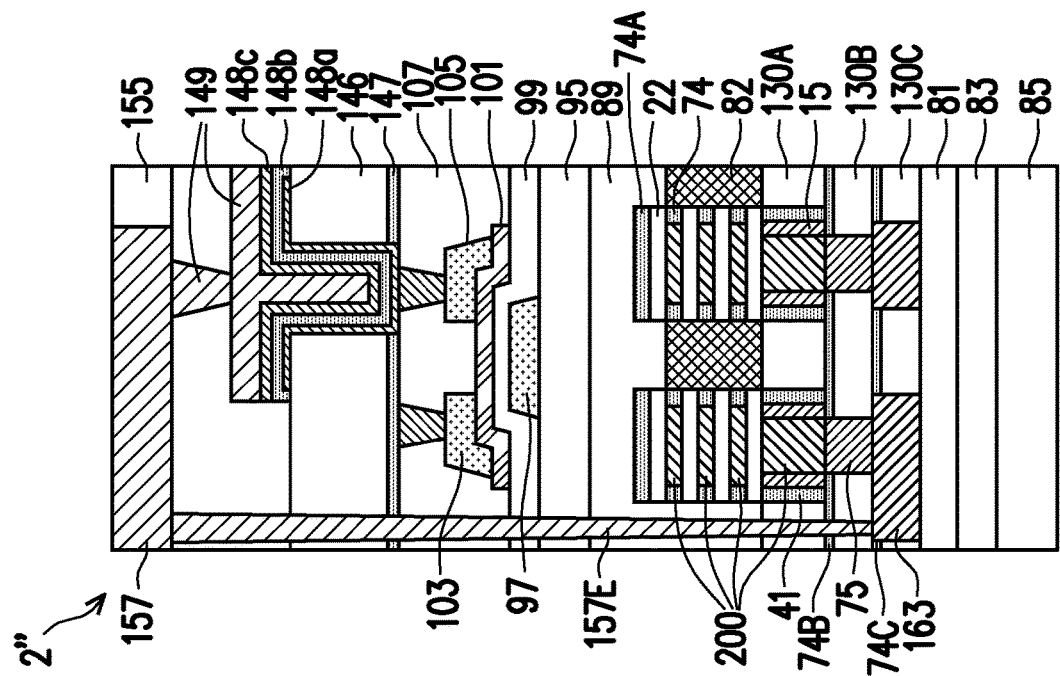
FIG. 39 illustrates a semiconductor device having a via connecting to a metallization structure located in the bottom most layer of the GAA device, in accordance with some embodiments.

FIG. 39 illustrates a semiconductor device 2" which is substantially the same as the semiconductor device 2 shown in FIG. 37, except that the TOVs connecting to a metallization structure 163 located in the bottom most layer of the GAA device. That is, the various oxide layers mounted on the GAA device may be etched to form opening that continues into another oxide layer and then into yet another oxide layer. In some embodiments, the entire etch process is oxide etching. Although it is shown that the TOVs reach and connect to the bottom most layer 163, it will be apparent to a person of ordinary skill in the art that the TOV can connect to any layer of the GAA device.

The MIM capacitor connected to the TFT (e.g., IGZO TFT) forms a 1T1C (e.g., one transistor and one capacitor) DRAM. Accordingly, by connecting the DRAM device with the front side logic device (e.g., GAA device) with the TOV, it is possible to formulate a high density stacked logic and passive device.

Figure 40:
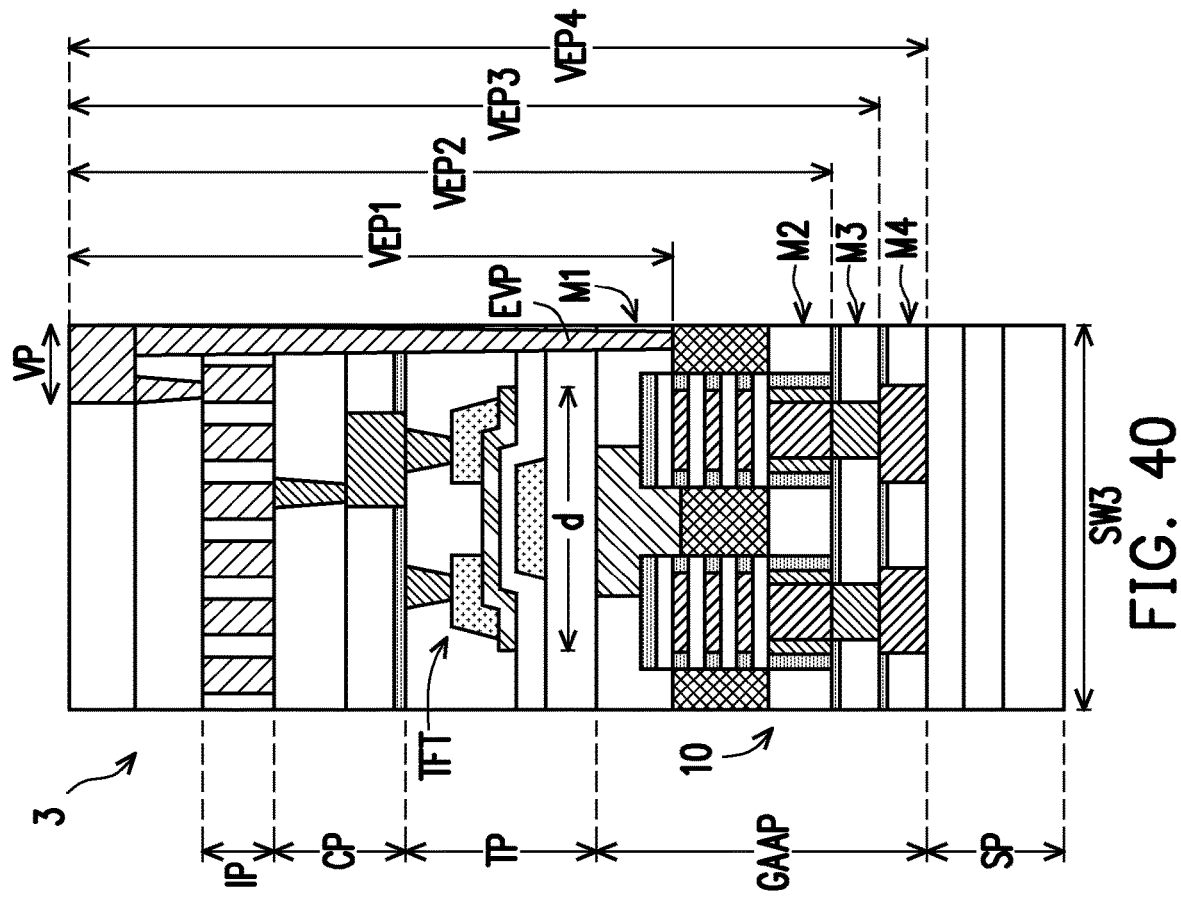
FIG. 40 illustrates a semiconductor device according to some embodiments of the present disclosure.
Figure 42:
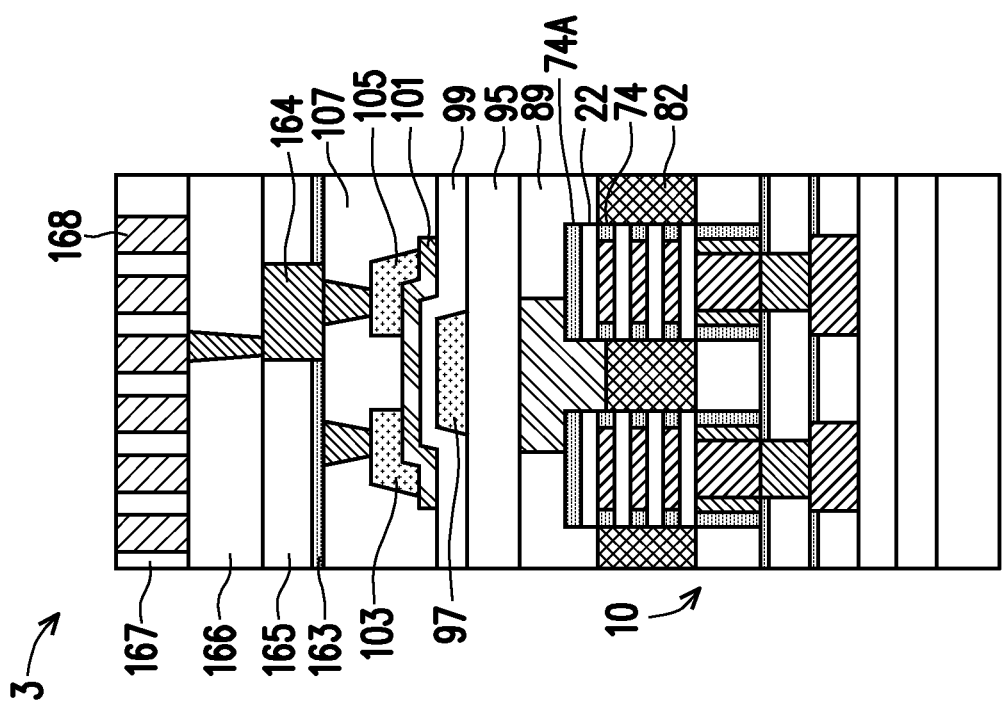
Figure 41:
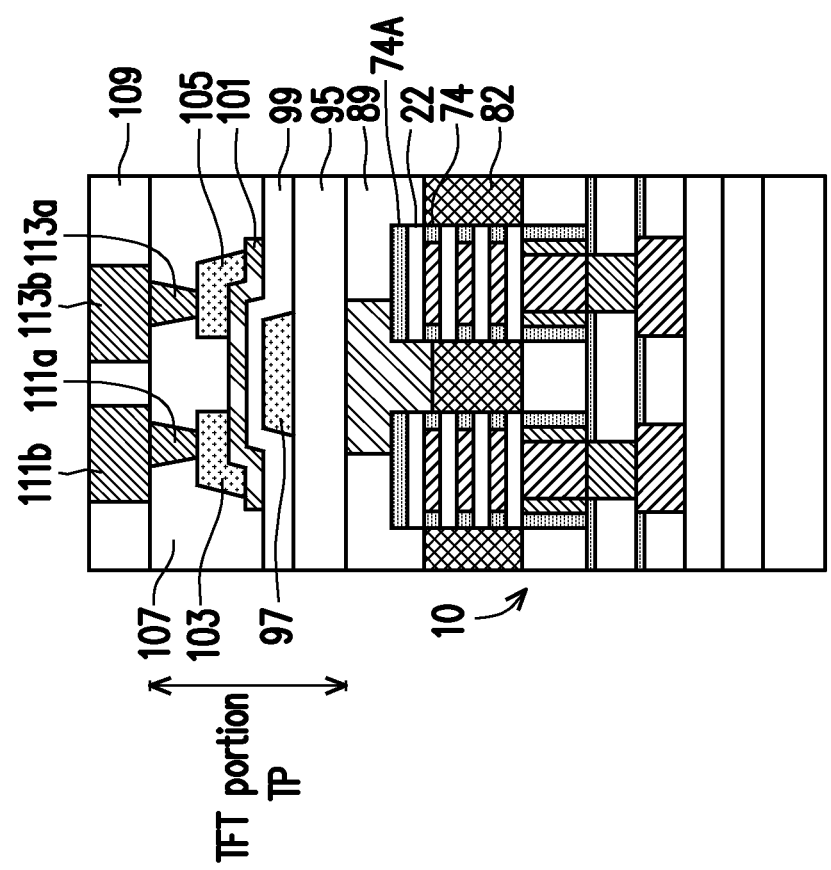

FIG. 40 illustrates a semiconductor device 3 according to some embodiments of the present disclosure. FIGS. 41 to 43 illustrate a method of forming a device shown in FIG. 40, in accordance with one or more embodiments. Accordingly, FIG. 43 and FIG. 40 show identical cross-section views of the semiconductor device 3.

Referring to FIG. 40, the semiconductor device 3 includes a substrate portion SP, a GAA device portion GAAP, a transistor portion TP, a contact plug portion CP, an inductor portion IP, and a via. A GAA device 10 is formed on the substrate portion SP. The transistor portion TP is formed on the GAA device 10 or the GAA device portion GAAP. On the transistor portion TP, one or more contact plugs of the contact plug portion CP electrically connects to either the source or the drain of the transistor TFT in the transistor portion TP. The inductor is formed on the contact plug portion CP and the via is formed on the inductor. One end of the via is electrically connected to the inductor. The other end of the via extends downward and connects to a layer of the GAA device 10. That is, an extended via portion EVP contacts the layer of the GAA device 10. This connection (either electrical or physical, or both) using the via allows the inductor which is spaced apart from the GAA device 10 to be connected to each other.

As shown in FIG. 40, the GAA device 10, the transistor TFT, the contact plugs, the inductor, and the via are vertically stacked and these components at least partially overlap each other.

The semiconductor device 10 may have a selected width SW3 as shown in FIG. 40. In one or more embodiments, the GAA device 10, the transistor TFT, the contact plugs, the inductor, and the via may be arranged to be within this selected width SW3. This features is made possible partly due to the narrow via having a high aspect ratio that connects the GAA device 10 with a passive device (e.g., inductor) on the opposite side of the GAA device In some embodiments, the via portion VP where the via is located overlaps with at least a portion of the transistor TFT. The extended via portion EVP is spaced apart from either the source or the drain of the TFT so that the extended via portion EVP does not contact either the source or the drain of the TFT. The extended via portion EVP may not contact a gate or a semiconductor layer of the TFT as well.

In other embodiments, the width d of the TFT may not overlap with the via portion VP. In one embodiment, the width d of the TFT may be defined as the distance between one end of the semiconductor layer of the TFT and the other opposite end of the semiconductor layer of the TFT. In one embodiment, the width d of the TFT may be defined as the distance between one end of the source electrode of the TFT and the other opposite end of the drain electrode semiconductor layer of the TFT.

In some embodiments, the via portion VP where the via is located overlaps with at least a portion of the inductor portion IP. The extended via portion EVP is spaced apart from the inductor so that the extended via portion EVP does not make an electrical contact with the MIM capacitor from a lateral direction. For example, one end of the via may be electrically connected to a top surface of the inductor. That is, one end of the via may connect with the top surface of the inductor at a vertical direction. However, the extended via portion EVP which is laterally spaced apart from the inductor may not contact the inductor from the lateral direction.

In some embodiments, the via portion VP where the via is located overlaps with at least a portion of the GAA device 10. The extended via portion EVP may be configured to extend to any layer of the GAA device 10. For example, in one embodiment, the extended via portion EVP may extend a distance VEP1 to reach and contact a first layer M1 of the GAA device 10. In another embodiment, the extended via portion EVP may extend a distance VEP2 to reach and contact a second layer M2 of the GAA device 10. In another embodiment, the extended via portion EVP may extend a distance VEP3 to reach and contact a third layer M3 of the GAA device 10. In another embodiment, the extended via portion EVP may extend a distance VEP4 to reach and contact a fourth layer M4 of the GAA device 10.

In some embodiments, a contact plug (not shown) may be further formed so that the contact plug functions as a middle component between the GAA device 10 and the extended via portion EVP. An example of this embodiment is shown in FIG. 44.

FIGS. 41 to 43 illustrate a method of forming a device shown in FIG. 40. The method for forming a device as shown in FIG. 41 is identical to the method explained in connection with FIGS. 2 to 25, and thus the structure of the device shown in FIG. 41 is the same as that of the device shown in FIG. 25. FIG. 42 is similar to the process shown in connection with FIG. 36. However, in FIG. 42, instead of forming an MIM capacitor, a contact plug 164 is formed. For example, an inter-layer dielectric ILD 147 may be deposited on the transistor. Then, some portions of the ILD 147 is removed so that the contact plug 164 establishes an electrical connection with source/drain of the transistor. Further, inter-layer dielectric layers 165, 166 may be formed on the ILD 147 and the contact plug 164. Next, an inductor 168 may be formed on contact plug 164 and the inter-layer dielectric layers 165, 166. The inductor 168 as shown in FIG. 42 have a bar shape that is spaced apart from each other. However, this is because FIG. 42 shows one cross-section of a GAA device. If seen from a top view or a plan view, the inductor 168 would have a spiral or a snake-like shape. In some embodiments, the conductor 168 contacts the contact plug 164 to establish an electrical connection. The layers in between the inductor 168 may be filled with inter-layer dielectric layer 167.

FIG. 43 illustrates forming a via and establish a connection between the GAA device and the inductor 168. Insulation layers 169, 171 are formed on the inductor 168. One approach for forming a via 173 is forming a photoresist or hard mask layer (not shown) over the exposed surface of the insulation layer 171. Openings OP3 are formed in the photoresist or hard mask layer, using photolithography and etch processes. Using the openings OP 3 and using the photoresist layer as an etch mask, vias are formed. One example of vias include through oxide vias (TOVs). The TOVs may extend through the layers adjacent to the inductor 168, the TFT portion TP, to expose and contact the top most layer of the metallization structure 174 of the GAA device. At the completion of the forming the via as illustrated in FIG. 43, the semiconductor device 3 is formed and is the same as the semiconductor device 3 illustrated in FIG. 40.

In some embodiments, TOVs extending portion 173E may be connected to any part or any layer of the GAA device. FIG. 44 illustrates a semiconductor device 3' which is substantially the same as the semiconductor device 3 shown in FIG. 43, except that the TOVs connect to a contact plug 175 located on the GAA device and below the TFT. The contact plug 175 may be formed based on the same or similar process described in connection with FIG. 24. The difference between FIG. 44 and FIG. 24 is the location in which the contact plug 175 is formed. However, based on where the photoresist or hard mask layer is formed, the method of forming a contact plug in a different location will be readily apparent to a person of ordinary skill in the art.

Figure 45:
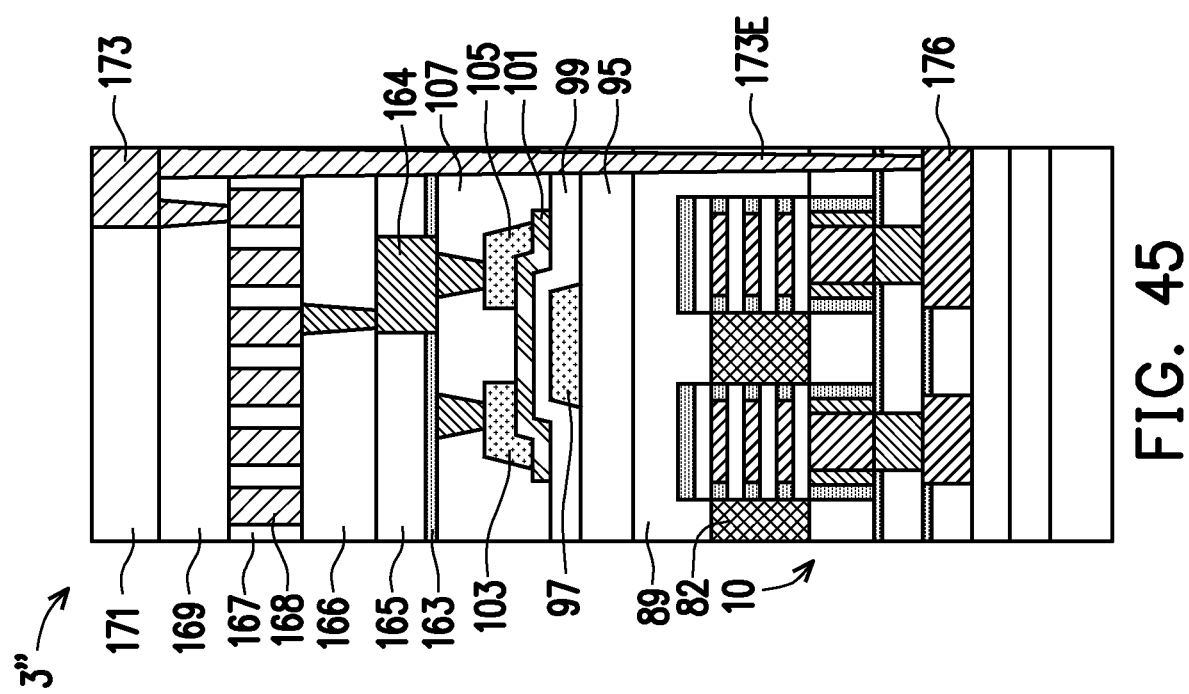
FIG. 45 illustrates the via connecting to a metallization structure located in the bottom most layer of the GAA device, in accordance with some embodiments.

FIG. 45 illustrates a semiconductor device 3" which is substantially the same as the semiconductor device 3 shown in FIG. 43, except that TOVs connect to a metallization structure 176 located in the bottom most layer of the GAA device. That is, the various oxide layers mounted on the GAA device may be etched to form opening that continues into another oxide layer and then into yet another oxide layer. In some embodiments, the entire etch process is oxide etching. Although it is shown that the TOVs reach and connect to the bottom most layer 163, it will be apparent to a person of ordinary skill in the art that the TOV can connect to any layer of the GAA device.

Figure 46:
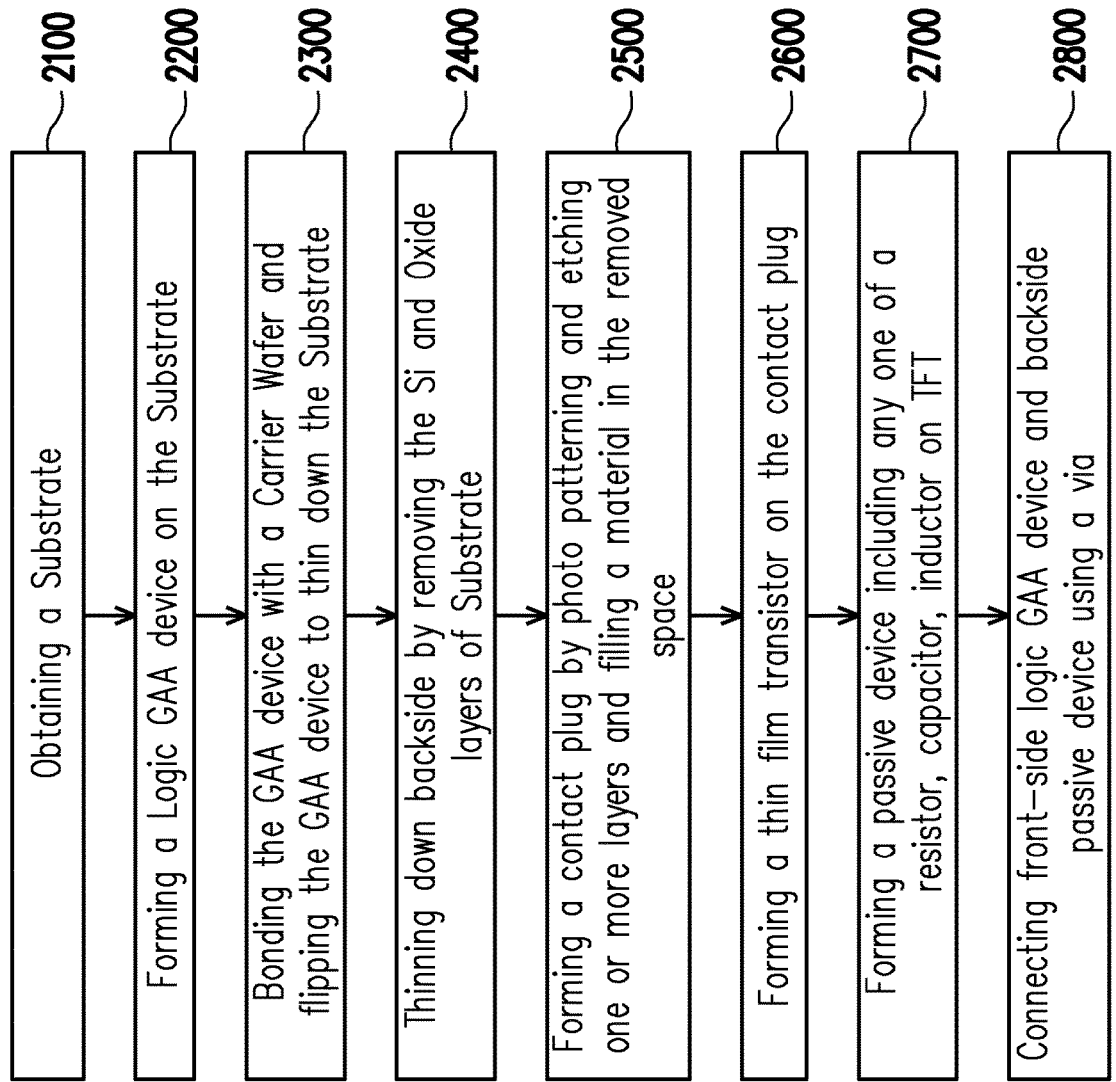
FIG. 46 is a flow chart describing a method of forming a semiconductor device according to some embodiments.

FIG. 46 is a flow chart describing a method of forming a semiconductor device according to some embodiments.

At step 2100, a substrate is obtained. The substrate may include, for example, an SOI, SiGE (doped with boron B), or Si EPI substrate. The step 2100 may correspond to the process explained in connection to FIGS. 2, 3, and 4.

At step 2200, a logic gate all around (GAA) device is formed on the substrate. An FEOL process on the substrate can be used to form a logic GAA MOSFET. Further layers (including metallic layers) of the GAA device may be formed through the MEOL process. A high density plasma (HDP) oxide may be deposited on the metallic layers of the GAA device. Further, the top surface of the oxide layer may be planarized using a CMP to smoothen the bond interface. The step 2200 may correspond to the process explained in connection to FIGS. 5 to 16.

At step 2300, the GAA device is bonded with a carrier. When bonding with the carrier wafer, an oxide bonding used to bond the carrier wafer to the oxide layer. However, other method of bonding may be used and is not necessarily limited to oxide bonding. Next, the GAA device is flipped so that the flipped side of the GAA device can be thinned down. The step 2300 may correspond to the process explained in connection to FIGS. 17 and 18.

At step 2400, the flipped side of the GAA device is thinned down. For example, the Si and oxide layers of the substrate are removed. In some embodiments, further portions of the silicon and the EPI may be etched and removed. In the removed portion, SiCN and oxide may be deposited as shown in FIG. 21. The step 2400 may correspond to the process explained in connection to FIGS. 19, 20, and 21.

At step 2500, a contact plug is formed by patterning and etching (e.g., dry etching, wet etching, etc.) one or more layers. The contact plug (e.g., contact silicide) is formed in the area that is etched and removed. The step 2500 may correspond to the process explained in connection to FIGS. 22 to 24.

At step 2600, a thin film transistor (e.g., IGZO TFT) is formed on the contact plug. The step 2600 may correspond to the process explained in connection to FIG. 25.

At step 2700, a passive device including a resistor, capacitor, inductor, or the like is formed on the thin film transistor. The step 2700 may correspond to the process explained in connection to FIGS. 26, 36, and 42.

At step 2800, a via is used to connect the front-side logic GAA device and the backside passive device. In some embodiments, the via includes a through oxide via (TOV). The step 2800 may correspond to the process explained in connection to FIGS. 27-29, 37-39, 43-45.

Figure 47:
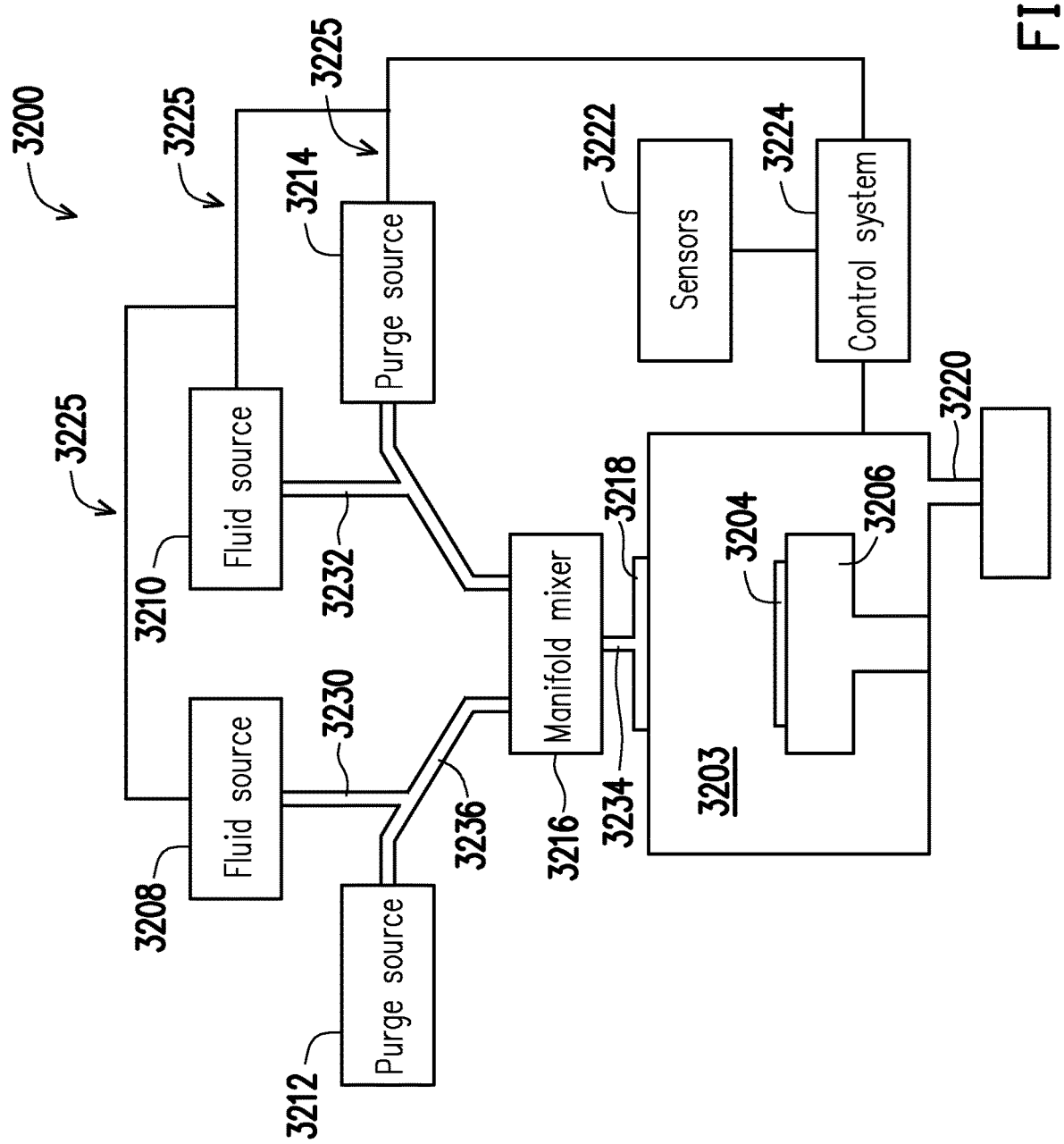
FIG. 47 is an illustration of a semiconductor process system, according to some embodiments.

FIG. 47 is an illustration of a semiconductor process system 3200, according to one embodiment. The semiconductor process system 3200 can be utilized to perform the controlled ALE processes used to form the various semiconductor devices including the GAA devices as described in relation to FIGS. 1-46. The semiconductor process system 3200 includes a process chamber 3202 including an interior volume 3203. A support 3206 is positioned within the interior volume 3203 and is configured to support a substrate 3204 during a thin-film etching process. The semiconductor process system 3200 is configured to etch a thin film on the substrate 3204, such as the high-k layer or the metal gate layer. The semiconductor process system 3200 includes a control system 3224 that dynamically adjusts thin-film etching parameters. Details of the control system 3224 are provided after description of the operation of the semiconductor process system 3200.

In some embodiments, the semiconductor process system 3200 includes a first fluid source 3208 and a second fluid source 3210. The first fluid source 3208 supplies a first fluid into the interior volume 3203. The second fluid source 3210 supplies a second fluid into the interior volume 3203. The first and second fluids both contribute in etching a thin film on the substrate 3204. While FIG. 47 illustrates fluid sources 3208 and 3210, in practice, the fluid sources 3208 and 3210 may include or supply materials other than fluids. For example, the fluid sources 3208 and 3210 may include material sources that provide all materials for the etching process.

Figure 48:
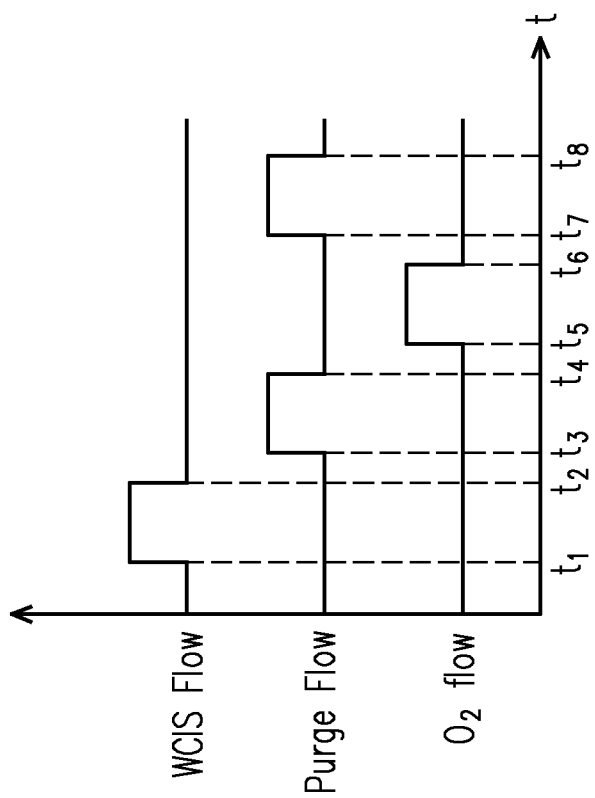
FIG. 48 is a graph illustrating a cycle of an ALE process performed by the semiconductor process system, according to some embodiments.

In some embodiments, the semiconductor process system 3200 is an atomic layer etching (ALE) system that performs ALE processes. The ALE system performs etching processes in cycles. Each cycle includes flowing a first etching fluid from the fluid source 3208, followed by purging the first etching fluid from the etching chamber by flowing the purge gas from one or both of the purge sources 3212 and 3224, followed by flowing a second etching fluid from the fluid source 3210, followed by purging the second etching fluid from the etching chamber by flowing the purge gas from one or both of the purge sources 3212 and 3224. This corresponds to a single ALE cycle. Each cycle etches an atomic or molecular layer from the thin-film that is being etched. A specific example of the ALE cycle is illustrated in FIG. 48.

The parameters of a thin film generated by the semiconductor process system 3200 can be affected by a large number of process conditions. The process conditions can include, but are not limited to, an amount of fluid or material remaining in the fluid sources 3208, 3210, a flow rate of fluid or material from the fluid sources 3208, 3210, the pressure of fluids provided by the fluid sources 3208 and 3210, the length of tubes or conduits that carry fluid or material into the process chamber 3202, the age of an ampoule defining or included in the process chamber 3202, the temperature within the process chamber 3202, the humidity within the process chamber 3202, the pressure within the process chamber 3202, light absorption and reflection within the process chamber 3202, surface features of the semiconductor wafer 3204, the composition of materials provided by the fluid sources 3208 and 3210, the phase of materials provided by the fluid sources 3208 and 3210, the duration of the etching process, the duration of individual phases of the etching process, and various other factors.

The combination of the various process conditions during the etching process determines the remaining thickness of a thin film etched by the ALE process. It is possible that process conditions may result in thin films that do not have remaining thicknesses that fall within target parameters. If this happens, then integrated circuits formed from the semiconductor wafer 3204 may not function properly. The quality of batches of semiconductor wafers may suffer. In some cases, some semiconductor wafers may need to be scrapped.

The semiconductor process system 3200 utilizes the control system 3224 to dynamically adjust process conditions to ensure that etching processes result in thin films having parameters or characteristics that fall within target parameters or characteristics. The control system 3224 is connected to processing equipment associated with the semiconductor process system 3200. The control system 3224 can control the flow rate of material from the fluid sources 3208 and 3210, the temperature of materials supplied by the fluid sources 3208 and 3210, the pressure of fluids provided by the fluid sources 3208 and 3210, the flow rate of material from purge sources 3212 and 3214, the duration of flow of materials from the fluid sources 3208 and 3210 and the purge sources 3212 of 3214, the temperature within the process chamber 3202, the pressure within the process chamber 3202, the humidity within the process chamber 3202, and other aspects of the thin-film etching process. The control system 3224 controls these process parameters so that the thin-film etching process results in a thin-film having target parameters such as a target remaining thickness, a target composition, a target crystal orientation, etc. Further details regarding the control system are provided in relation to FIGS. 49 and 50.

In some embodiments, the control system 224 is communicatively coupled to the first and second fluid sources 3208, 3210 via one or more communication channels 3225. The control system 3224 can send signals to the first fluid source 3208 and the second fluid source 3210 via the communication channels 3225. The control system 3224 can control functionality of the first and second fluid sources 3208, 3210 responsive, in part, to the sensor signals from a byproduct sensor 3222.

In some embodiments, the semiconductor process system 3200 can include one or more valves, pumps, or other flow control mechanisms for controlling the flow rate of the first fluid from the first fluid source 3208. These flow control mechanisms may be part of the fluid source 3208 or may be separate from the fluid source 3208. The control system 3224 can be communicatively coupled to these flow control mechanisms or to systems that control these flow control mechanisms. The control system 3224 can control the flow-rate of the first fluid by controlling these mechanisms. The control system 3200 may include valves, pumps, or other flow control mechanisms that control the flow of the second fluid from the second fluid source 3210 in the same manner as described above in reference to the first fluid and the first fluid source 3208.

In some embodiments, the semiconductor process system 3200 includes a manifold mixer 3216 and a fluid distributor 3218. The manifold mixer 3216 receives the first and second fluids, either together or separately, from the first fluid source 3208 and the second fluid source 3210. The manifold mixer 3216 provides either the first fluid, the second fluid, or a mixture of the first and second fluids to the fluid distributor 3218. The fluid distributor 3218 receives one or more fluids from the manifold mixer 3216 and distributes the one or more fluids into the interior volume 3203 of the process chamber 3202.

In some embodiments, the first fluid source 3208 is coupled to the manifold mixer 3216 by a first fluid channel 3230. The first fluid channel 3230 carries the first fluid from the fluid source 3208 to the manifold mixer 3216. The first fluid channel 3230 can be a tube, pipe, or other suitable channel for passing the first fluid from the first fluid source 3208 to the manifold mixer 3216. The second fluid source 3210 is coupled to the manifold mixer 3216 by second fluid channel 3232. The second fluid channel 3232 carries the second fluid from the second fluid source 3210 to the manifold mixer 3216.

In some embodiments, the manifold mixer 3216 is coupled to the fluid distributor 3218 by a third fluid line 3234. The third fluid line 3234 carries fluid from the manifold mixer 3216 to the fluid distributor 3218. The third fluid line 3234 may carry the first fluid, the second fluid, a mixture of the first and second fluids, or other fluids, as will be described in more detail below.

The first and second fluid sources 3208, 3210 can include fluid tanks. The fluid tanks can store the first and second fluids. The fluid tanks can selectively output the first and second fluids.

In some embodiments, the semiconductor process system 3200 includes a first purge source 3212 and the second purge source 3214. The first purge source is coupled to the first fluid line 3230 by first purge line 3236. The second purge source is coupled to the fluid line 3232 by second purge line 3238. In practice, the first and second purge sources may be a single purge source.

In some embodiments, the first and second purge sources 3212, 3214 supply a purging gas into the interior volume 3203 of the process chamber 3202. The purge fluid is a fluid selected to purge or carry the first fluid, the second fluid, byproducts of the first or second fluid, or other fluids from the interior volume 3203 of the process chamber 3202. The purge fluid is selected to not react with the substrate 3204, the gate metal layer on the substrate 3204, the first and second fluids, and byproducts of this first or second fluid. Accordingly, the purge fluid may be an inert gas including, but not limited to, Ar or $N_2$.

While FIG. 47 illustrates a first fluid source 3208 and a second fluid source 3210, in practice the semiconductor process system 3200 can include other numbers of fluid sources. For example, the semiconductor process system 3200 may include only a single fluid source or more than two fluid sources. Accordingly, the semiconductor process system 3200 can include a different number than two fluid sources without departing from the scope of the present disclosure.

FIG. 48 is a graph illustrating a cycle of an ALE process performed by the semiconductor process system 3200, according to one or more embodiments. At time T1 the first etching fluid begins to flow. In the example of FIG. 48, the first etching fluid is WCl5. The first etching fluid flows from the fluid source 3208 into the interior volume 3203. In the interior volume 3203, the first etching fluid reacts with the high-k layer (e.g., TiSiN). At time T2, the first etching fluid WCl5 stops flowing. In one example, the time elapsed between T1 and T2 between 1 s and 10 s.

At time T3, the purge gas begins to flow. The purge gas flows from one or both of the purge sources 3212 and 3224. In one example, the purge gas is one of argon, $N_2$, or another inert gas that can purge the first etching fluid WCl5 without reacting with the high-k layer (e.g., TiSiN). At time T4, the purge gas stops flowing. In one example, the time elapsed between T3 and T4 is between 2 s and 15 s.

At time T5, the second etching fluid flows into the interior volume 3203. The second etching fluid flows from the fluid source 3210 into the interior volume 3203. In one example, the second etching fluid is $O_2$. The $O_2$ reacts with the top atomic or molecular layer of the titanium nitride layer 124 and completes the etching of the top atomic or molecular layer of the titanium nitride layer 124. At time T6, the second etching fluid stops flowing. In one example, the elapsed time between T5 and T6 is between 1 s and 10 s.

At time T7, the purge gas flows again and purges the interior volume 3203 of the second etching fluid. At time T8 the purge gas stops flowing. The time between T1 and T8 corresponds to a single ALE cycle.

In practice, an ALE process may include between 5 and 50 cycles, depending on the initial thickness of the high-k capping layer (e.g., TiSiN) and the desired final thickness of the high-k layer (e.g., TiSiN). Each cycle removes an atomic or molecular layer of the high-k layer (e.g., TiSiN). Other materials, processes, and elapsed times can be utilized without departing from the scope of the present disclosure.

The above mentioned ALE process may be used to pattern the metal gate layers of the semiconductor device including the GAA device.

Figure 49:
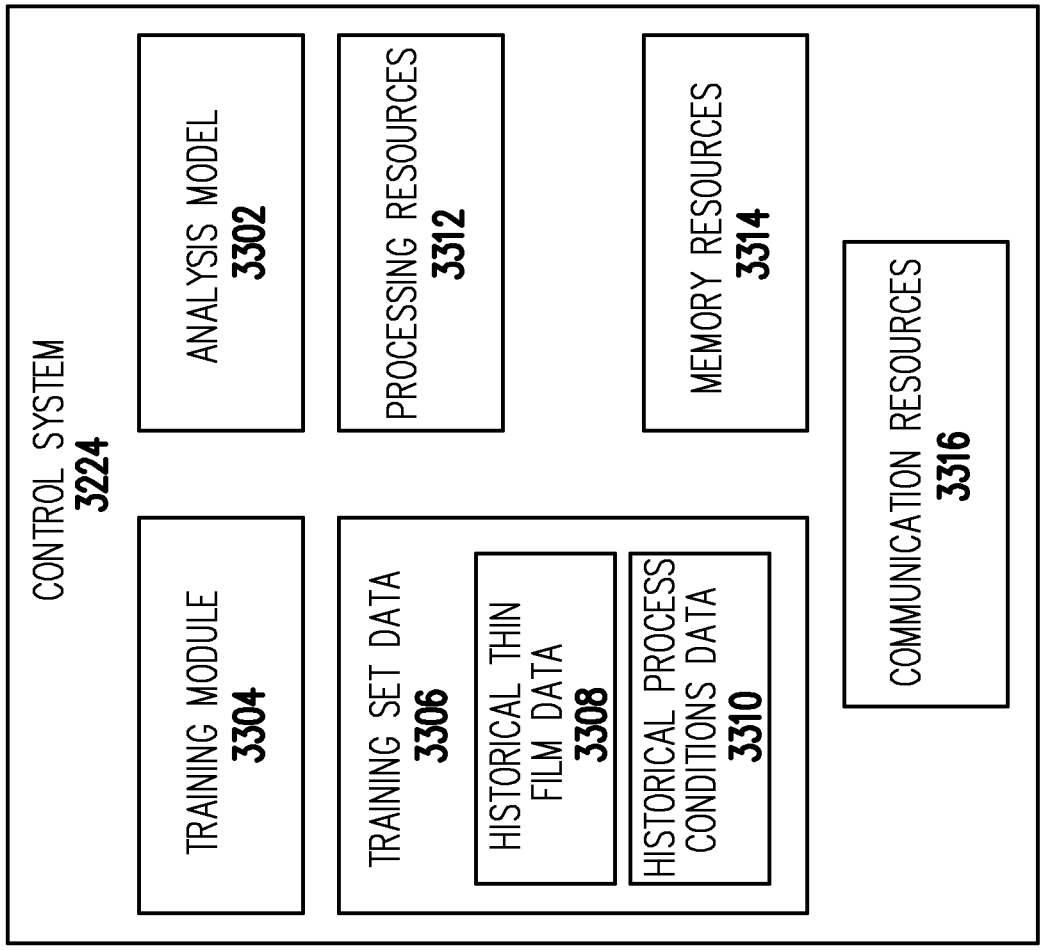
FIG. 49 is a block diagram of the control system of FIG. 47, according to some embodiments.

FIG. 49 is a block diagram of the control system 3224 of FIG. 47, according to one embodiment. The control system 3224 of FIG. 23 is configured to control operation of the semiconductor process system 3200 in performing ALE processes to form the GAA devices of FIGS. 1-46, according to one embodiment. The control system 3224 utilizes machine learning to adjust parameters of the semiconductor process system 3200. The control system 3224 can adjust parameters of the semiconductor process system 3200 between ALE runs or even between ALE cycles in order to ensure that a thin-film layer formed by the ALE process falls within selected specifications.

In some embodiments, the control system 3224 includes an analysis model 3302 and a training module 3304. The training module 3304 trains the analysis model 3302 with a machine learning process. The machine learning process trains the analysis model 3302 to select parameters for an ALE process that will result in a thin film having selected characteristics. Although the training module 3304 is shown as being separate from the analysis model 3302, in practice, the training module 3304 may be part of the analysis model 3302.

The control system 3224 includes, or stores, training set data 3306. The training set data 3306 includes historical thin-film data 3308 and historical process conditions data 3310. The historical thin-film data 3308 includes data related to thin films resulting from ALE processes. The historical process conditions data 3310 includes data related to process conditions during the ALE processes that generated the thin films. As will be set forth in more detail below, the training module 3304 utilizes the historical thin-film data 3308 and the historical process conditions data 3310 to train the analysis model 3302 with a machine learning process.

In some embodiments, the historical thin-film data 3308 includes data related to the remaining thickness of previously etched thin films. For example, during operation of a semiconductor fabrication facility, thousands or millions of semiconductor wafers may be processed over the course of several months or years. Each of the semiconductor wafers may include thin films etched by ALE processes. After each ALE process, the thicknesses of the thin-films are measured as part of a quality control process. The historical thin-film data 3308 includes the remaining thicknesses of each of the thin films etched by ALE processes. Accordingly, the historical thin-film data 3308 can include thickness data for a large number of thin-films etched by ALE processes.

In some embodiments, the historical thin-film data 3308 may also include data related to the thickness of thin films at intermediate stages of the thin-film etching processes. For example, an ALE process may include a large number of etching cycles during which individual layers of the thin film are etched. The historical thin-film data 3308 can include thickness data for thin films after individual etching cycles or groups of etching cycles. Thus, the historical thin-film data 3308 not only includes data related to the total thickness of a thin film after completion of an ALE process, but may also include data related to the thickness of the thin film at various stages of the ALE process.

In some embodiments, the historical thin-film data 3308 includes data related to the composition of the remaining thin films etched by ALE processes. After a thin film is etched, measurements can be made to determine the elemental or molecular composition of the thin films. Successful etching of the thin films results in a thin film that includes particular remaining thicknesses. Unsuccessful etching processes may result in a thin film that does not include the specified proportions of elements or compounds. The historical thin-film data 3308 can include data from measurements indicating the elements or compounds that make up the various thin films.

In some embodiments, the historical process conditions 3310 include various process conditions or parameters during ALE processes that etch the thin films associated with the historical thin-film data 3308. Accordingly, for each thin film having data in the historical thin-film data 3308, the historical process conditions data 3310 can include the process conditions or parameters that were present during etching of the thin film. For example, the historical process conditions data 3310 can include data related to the pressure, temperature, and fluid flow rates within the process chamber during ALE processes.

The historical process conditions data 3310 can include data related to remaining amounts of precursor material in the fluid sources during ALE processes. The historical process conditions data 3310 can include data related to the age of the process chamber 3202, the number of etching processes that have been performed in the process chamber 3202, a number of etching processes that have been performed in the process chamber 3202 since the most recent cleaning cycle of the process chamber 3202, or other data related to the process chamber 3202. The historical process conditions data 3310 can include data related to compounds or fluids introduced into the process chamber 3202 during the etching process. The data related to the compounds can include types of compounds, phases of compounds (solid, gas, or liquid), mixtures of compounds, or other aspects related to compounds or fluids introduced into the process chamber 3202. The historical process conditions data 3310 can include data related to the humidity within the process chamber 3202 during ALE processes. The historical process conditions data 3310 can include data related to light absorption, light adsorption, and light reflection related to the process chamber 3202. The historical process conditions data 3326 can include data related to the length of pipes, tubes, or conduits that carry compounds or fluids into the process chamber 3202 during ALE processes. The historical process conditions data 3310 can include data related to the condition of carrier gases that carry compounds or fluids into the process chamber 3202 during ALE processes.

In some embodiments, historical process conditions data 3310 can include process conditions for each of a plurality of individual cycles of a single ALE process. Accordingly, the historical process conditions data 3310 can include process conditions data for a very large number of ALE cycles.

In some embodiments, the training set data 3306 links the historical thin-film data 3308 with the historical process conditions data 3310. In other words, the thin-film thickness, material composition, or crystal structure associated with a thin film in the historical thin-film data 3308 is linked (e.g., by labeling) to the process conditions data associated with that etching process. As will be set forth in more detail below, the labeled training set data can be utilized in a machine learning process to train the analysis model 3302 to predict semiconductor process conditions that will result in properly formed thin films.

In some embodiments, the control system 3324 includes processing resources 3312, memory resources 3314, and communication resources 3316. The processing resources 3312 can include one or more controllers or processors. The processing resources 3312 are configured to execute software instructions, process data, make thin-film etching control decisions, perform signal processing, read data from memory, write data to memory, and to perform other processing operations. The processing resources 3312 can include physical processing resources 3312 located at a site or facility of the semiconductor process system 3200. The processing resources can include virtual processing resources 3312 remote from the site semiconductor process system 3200 or a facility at which the semiconductor process system 3200 is located. The processing resources 3312 can include cloud-based processing resources including processors and servers accessed via one or more cloud computing platforms.

In some embodiments, the memory resources 3314 can include one or more computer readable memories. The memory resources 3314 are configured to store software instructions associated with the function of the control system and its components, including, but not limited to, the analysis model 3302. The memory resources 3314 can store data associated with the function of the control system 3224 and its components. The data can include the training set data 3306, current process conditions data, and any other data associated with the operation of the control system 3224 or any of its components. The memory resources 3314 can include physical memory resources located at the site or facility of the semiconductor process system 3200. The memory resources can include virtual memory resources located remotely from site or facility of the semiconductor process system 3200. The memory resources 3314 can include cloud-based memory resources accessed via one or more cloud computing platforms.

In some embodiments, the communication resources can include resources that enable the control system 3224 to communicate with equipment associated with the semiconductor process system 3200. For example, the communication resources 3316 can include wired and wireless communication resources that enable the control system 3224 to receive the sensor data associated with the semiconductor process system 3200 and to control equipment of the semiconductor process system 3200. The communication resources 3316 can enable the control system 3224 to control the flow of fluids or other material from the fluid sources 3308 and 3310 and from the purge sources 3312 and 3314. The communication resources 3316 can enable the control system 3224 to control heaters, voltage sources, valves, exhaust channels, wafer transfer equipment, and any other equipment associated with the semiconductor process system 3200. The communication resources 3316 can enable the control system 3224 to communicate with remote systems. The communication resources 3316 can include, or can facilitate communication via, one or more networks such as wire networks, wireless networks, the Internet, or an intranet. The communication resources 3316 can enable components of the control system 3224 to communicate with each other.

In some embodiments, the analysis model 3302 is implemented via the processing resources 3312, the memory resources 3314, and the communication resources 3316. The control system 3224 can be a dispersed control system with components and resources and locations remote from each other and from the semiconductor process system 3200.

Figure 50:
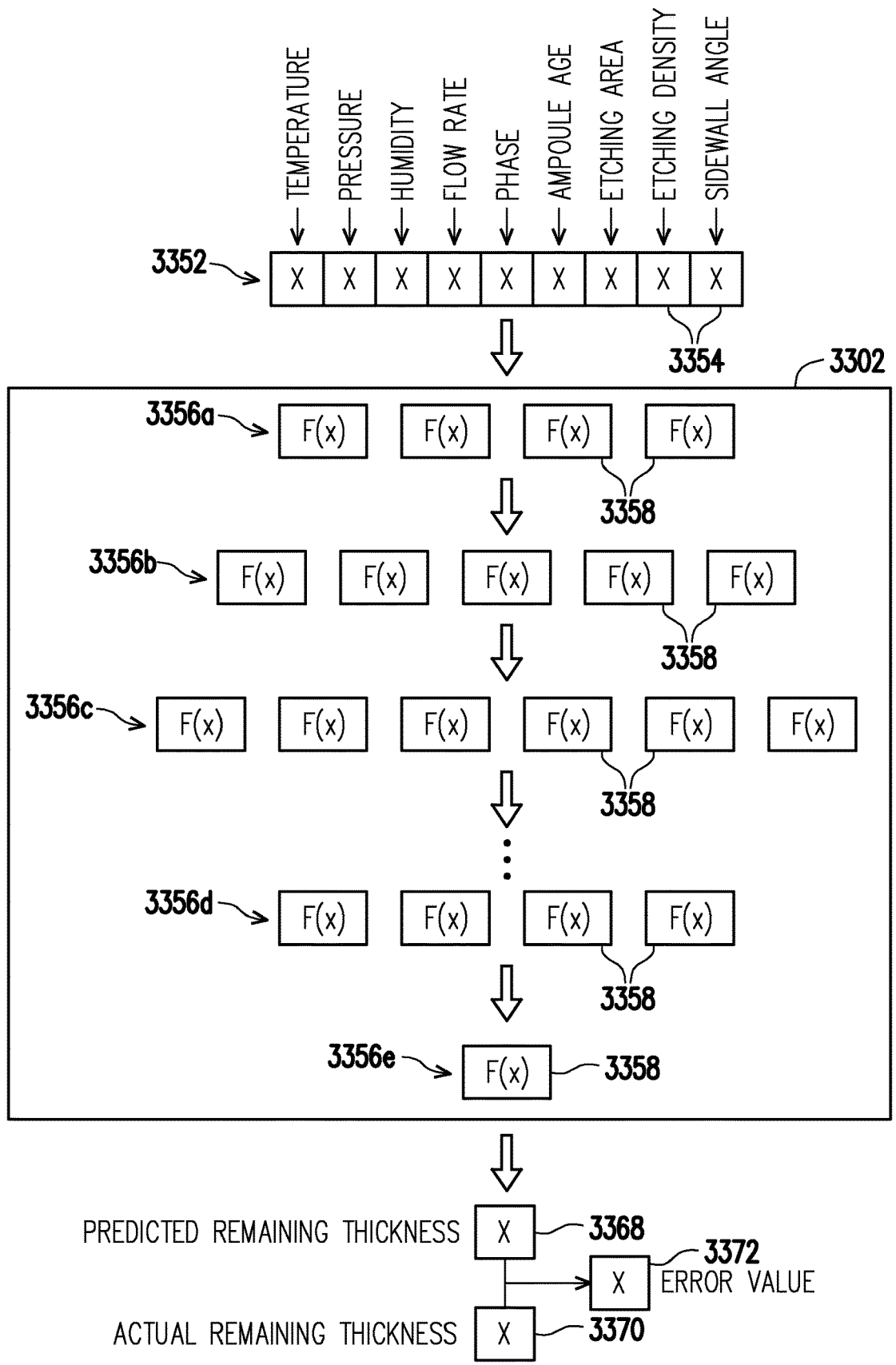
FIG. 50 is a block diagram illustrating operational aspects and training aspects of the analysis model of FIG. 49, according to some embodiments.

FIG. 50 is a block diagram illustrating operational aspects and training aspects of the analysis model 3302 of FIG. 49, according to one embodiment. The analysis model 3302 can be used to select parameters for ALE processes performed by the semiconductor process system 3200 of FIG. 47 to form the GAA devices of FIGS. 1-46. As described previously, the training set data 3306 includes data related to a plurality of previously performed thin-film etching processes. Each previously performed thin-film etching process took place with particular process conditions and resulted in a thin-film having a particular characteristics. The process conditions for each previously performed thin-film etching process are formatted into a respective process conditions vector 3352. The process conditions vector includes a plurality of data fields 3354. Each data field 3354 corresponds to a particular process condition.

The example of FIG. 50 illustrates a single process conditions vector 3352 that will be passed to the analysis model 3302 during the training process. In the example of FIG. 50, the process conditions vector 3352 includes nine data fields 3354. A first data field 3354 corresponds to the temperature during the previously performed thin-film etching process. A second data field 3356 corresponds to the pressure during the previously performed thin-film etching process. A third data field 3354 corresponds to the humidity during the previously performed thin-film etching process. The fourth data field 3354 corresponds to the flow rate of etching materials during the previously performed thin-film etching process. The fifth data field 3354 corresponds to the phase (liquid, solid, or gas) of etching materials during the previously performed thin-film etching process. The sixth data field 3354 corresponds to the age of the ampoule used in the previously performed thin-film etching process. The seventh data field 3354 corresponds to a size of an etching area on a wafer during the previously performed thin-film etching process. The eighth data field 3354 corresponds to the density of surface features of the wafer utilized during the previously performed thin-film etching process. The ninth data field corresponds to the angle of sidewalls of surface features during the previously performed thin-film etching process. In practice, each process conditions vector 3352 can include more or fewer data fields than are shown in FIG. 50 without departing from the scope of the present disclosure. Each process conditions vector 3352 can include different types of process conditions without departing from the scope of the present disclosure. The particular process conditions illustrated in FIG. 50 are given only by way of example. Each process condition is represented by a numerical value in the corresponding data field 3354. For condition types that are not naturally represented in numbers, such as material phase, a number can be assigned to each possible phase.

The analysis model 3302 includes a plurality of neural layers 3356*a-e*. Each neural layer includes a plurality of nodes 3358. Each node 3358 can also be called a neuron. Each node 3358 from the first neural layer 3356*a* receives the data values for each data field from the process conditions vector 3352. Accordingly, in the example of FIG. 50, each node 3358 from the first neural layer 3356*a* receives nine data values because the process conditions vector 3352 has nine data fields. Each neuron 3358 includes a respective internal mathematical function labeled F(x) in FIG. 50. Each node 3358 of the first neural layer 3356*a* generates a scalar value by applying the internal mathematical function F(x) to the data values from the data fields 3354 of the process conditions vector 3352. Further details regarding the internal mathematical functions F(x) are provided below.

Each node 3358 of the second neural layer 3356*b* receives the scalar values generated by each node 3358 of the first neural layer 3356*a*. Accordingly, in the example of FIG. 50 each node of the second neural layer 3356*b* receives four scalar values because there are four nodes 3358 in the first neural layer 3356*a*. Each node 3358 of the second neural layer 3356*b* generates a scalar value by applying the respective internal mathematical function F(x) to the scalar values from the first neural layer 3356*a*.

Each node 3358 of the third neural layer 3356*c* receives the scalar values generated by each node 3358 of the second neural layer 3356*b*. Accordingly, in the example of FIG. 50 each node of the third neural layer 3356*c* receives five scalar values because there are five nodes 3358 in the second neural layer 3356*b*. Each node 3358 of the third neural layer 3356*c* generates a scalar value by applying the respective internal mathematical function F(x) to the scalar values from the nodes 3358 of the second neural layer 3356*b*.

Each node 3358 of the neural layer 3356*d* receives the scalar values generated by each node 3358 of the previous neural layer (not shown). Each node 3358 of the neural layer 3356*d* generates a scalar value by applying the respective internal mathematical function F(x) to the scalar values from the nodes 3358 of the second neural layer 3356*b*.

The final neural layer includes only a single node 3358. The final neural layer receives the scalar values generated by each node 3358 of the previous neural layer 3356*d*. The node 3358 of the final neural layer 3356*e* generates a data value 3368 by applying a mathematical function F(x) to the scalar values received from the nodes 3358 of the neural layer 3356*d*.

In the example of FIG. 50, the data value 3368 corresponds to the predicted remaining thickness of a thin film generated by process conditions data corresponding to values included in the process conditions vector 3352. In other embodiments, the final neural layer 3356*e* may generate multiple data values each corresponding to a particular thin-film characteristic such as thin-film crystal orientation, thin-film uniformity, or other characteristics of a thin film. The final neural layer 3356*e* will include a respective node 3358 for each output data value to be generated. In the case of a predicted thin film thickness, engineers can provide constraints that specify that the predicted thin film thickness 3368 must fall within a selected range, such as between 0 nm and 50 nm, in one example. The analysis model 3302 will adjust internal functions F(x) to ensure that the data value 3368 corresponding to the predicted thin film thickness will fall within the specified range.

During the machine learning process, the analysis model compares the predicted remaining thickness in the data value 3368 to the actual remaining thickness of the thin-film as indicated by the data value 3370. As set forth previously, the training set data 3306 includes, for each set of historical process conditions data, thin-film characteristics data indicating the characteristics of the thin-film that resulted from the historical thin-film etching process. Accordingly, the data field 3370 includes the actual remaining thickness of the thin-film that resulted from the etching process reflected in the process conditions vector 3352. The analysis model 3302 compares the predicted remaining thickness from the data value 3368 to the actual remaining thickness from the data value 3370. The analysis model 3302 generates an error value 3372 indicating the error or difference between the predicted remaining thickness from the data value 3368 and the actual remaining thickness from the data value 3370. The error value 3372 is utilized to train the analysis model 3302.

The training of the analysis model 3302 can be more fully understood by discussing the internal mathematical functions F(x). While all of the nodes 3358 are labeled with an internal mathematical function F(x), the mathematical function F(x) of each node is unique. In one example, each internal mathematical function has the following form:

$$F(x)=x1*w1+x2*w2+\ldots xn*w1+b.$$

In the equation above, each value x1-*xn* corresponds to a data value received from a node 3358 in the previous neural layer, or, in the case of the first neural layer 3356*a*, each value x1-*xn* corresponds to a respective data value from the data fields 3354 of the process conditions vector 3352. Accordingly, n for a given node is equal to the number of nodes in the previous neural layer. The values w1-wn are scalar weighting values associated with a corresponding node from the previous layer. The analysis model 3302 selects the values of the weighting values w1-wn. The constant b is a scalar biasing value and may also be multiplied by a weighting value. The value generated by a node 3358 is based on the weighting values w1-wn. Accordingly, each node 3358 has n weighting values w1-wn. Though not shown above, each function F(x) may also include an activation function. The sum set forth in the equation above is multiplied by the activation function. Examples of activation functions can include rectified linear unit (ReLU) functions, sigmoid functions, hyperbolic tension functions, or other types of activation functions.

After the error value 3372 has been calculated, the analysis model 3302 adjusts the weighting values w1-wn for the various nodes 3358 of the various neural layers 3356*a*-3356*e*. After the analysis model 3302 adjusts the weighting values w1-wn, the analysis model 3302 again provides the process conditions vector 3352 to the input neural layer 3356*a*. Because the weighting values are different for the various nodes 3358 of the analysis model 3302, the predicted remaining thickness 3368 will be different than in the previous iteration. The analysis model 3302 again generates an error value 3372 by comparing the actual remaining thickness 3370 to the predicted remaining thickness 3368.

The analysis model 3302 again adjusts the weighting values w1-wn associated with the various nodes 3358. The analysis model 3302 again processes the process conditions vector 3352 and generates a predicted remaining thickness 3368 and associated error value 3372. The training process includes adjusting the weighting values w1-wn in iterations until the error value 3372 is minimized.

FIG. 50 illustrates a single process conditions vector 3352 being passed to the analysis model 3302. In practice, the training process includes passing a large number of process conditions vectors 3352 through the analysis model 3302, generating a predicted remaining thickness 3368 for each process conditions vector 3352, and generating associated error value 3372 for each predicted remaining thickness. The training process can also include generating an aggregated error value indicating the average error for all the predicted remaining thicknesses for a batch of process conditions vectors 3352. The analysis model 3302 adjusts the weighting values w1-wn after processing each batch of process conditions vectors 3352. The training process continues until the average error across all process conditions vectors 3352 is less than a selected threshold tolerance. When the average error is less than the selected threshold tolerance, the analysis model 3302 training is complete and the analysis model is trained to accurately predict the thickness of thin films based on the process conditions. The analysis model 3302 can then be used to predict thin-film thicknesses and to select process conditions that will result in a desired thin-film thickness. During use of the trained model 3302, a process conditions vector, representing current process condition for a current thin film etching process to be performed, and having the same format at the process conditions vector 3352, is provided to the trained analysis model 3302. The trained analysis model 3302 can then predict the thickness of a thin film that will result from those process conditions.

A particular example of a neural network based analysis model 3302 has been described in relation to FIG. 50. However, other types of neural network based analysis models, or analysis models of types other than neural networks can be utilized without departing from the scope of the present disclosure. Furthermore, the neural network can have different numbers of neural layers having different numbers of nodes without departing from the scope of the present disclosure.

Figure 51:
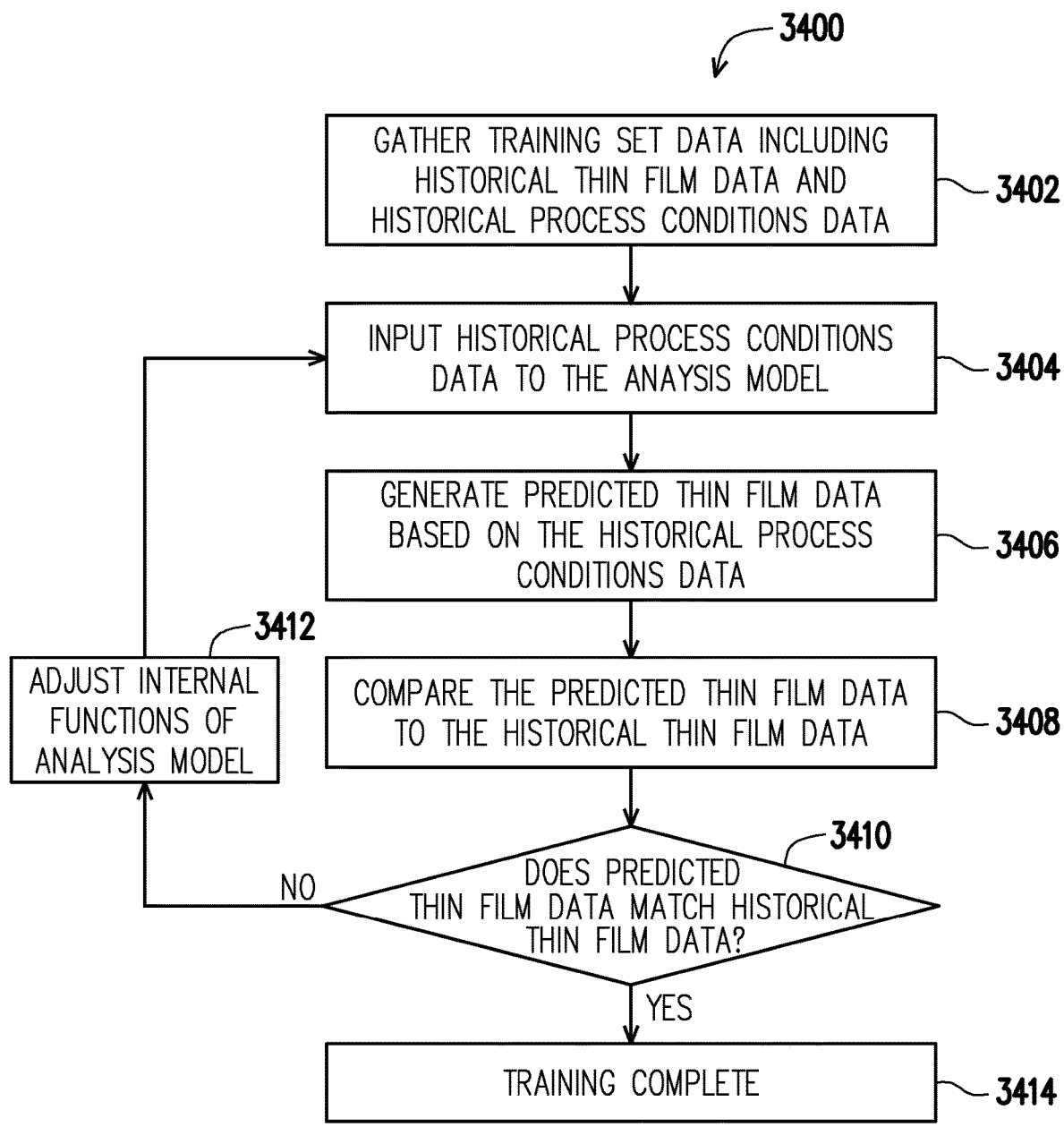
FIG. 51 is a flow diagram of a process or training an analysis model to identify process conditions that will result in proper etching of a thin film, according to some embodiments.

FIG. 51 is a flow diagram of a process 3400 for training an analysis model to identify process conditions that will result in proper etching of a thin film, according to one embodiment. One example of an analysis model is the analysis model 3302 of FIG. 49. The various steps of the process 3400 can utilize components, processes, and techniques described in relation to FIGS. 47-50. Accordingly, FIG. 51 is described with reference to FIGS. 47-50.

At 3402, the process 3400 gathers training set data including historical thin-film data and historical process conditions data. This can be accomplished by using a data mining system or process. The data mining system or process can gather training set data by accessing one or more databases associated with the semiconductor process system 3200 and collecting and organizing various types of data contained in the one or more databases. The data mining system or process, or another system or process, can process and format the collected data in order to generate a training set data. The training set data 3306 can include historical thin-film data 3308 and historical process conditions data 3310 as described in relation to FIG. 49.

At 3404, the process 3400 inputs historical process conditions data to the analysis model. In one example, this can include inputting historical process conditions data 3310 into the analysis model 3302 with the training module 3304 as described in relation to FIG. 49. The historical process conditions data can be provided in consecutive discrete sets to the analysis model 3302. Each district set can correspond to a single thin-film etching process or a portion of a single thin-film etching process. The historical process conditions data can be provided as vectors to the analysis model 3302. Each set can include one or more vectors formatted for reception processing by the analysis model 3302. The historical process conditions data can be provided to the analysis model 3302 in other formats without departing from the scope of the present disclosure.

At 3406, the process 3400 generates predicted thin-film data based on historical process conditions data. In particular, the analysis model 3302 generates, for each set of historical thin-film conditions data 3310, predicted thin-film data. The predicted thin-film data corresponds to a prediction of characteristics, such as the remaining thickness, of a thin film that would result from that particular set of process conditions. The predicted thin-film data can include thickness, uniformity, composition, crystal structure, or other aspects of a remaining thin film.

At 3408, the predicted thin-film data is compared to the historical thin-film data 3308. In particular, the predicted thin-film data for each set of historical process conditions data is compared to the historical thin-film data 3308 associated with that set of historical process conditions data. The comparison can result in an error function indicating how closely the predicted thin-film data matches the historical thin-film data 3308. This comparison is performed for each set of predicted thin-film data. In one embodiment, this process can include generating an aggregated error function or indication indicating how the totality of the predicted thin-film data compares to the historical thin-film data 3308. These comparisons can be performed by the training module 3304 or by the analysis model 3302. The comparisons can include other types of functions or data than those described above without departing from the scope of the present disclosure.

At 3410, the process 3400 determines whether the predicted thin-film data matches the historical thin-film data based on the comparisons generated at step 3408. For example, the process determines whether the predicted remaining thickness matches the actual remaining thickness after a historical etching process. In one example, if the aggregate error function is less than an error tolerance, then the process 3400 determines that the thin-film data matches the historical thin-film data. In one example, if the aggregate error function is greater than an error tolerance, then the process 3400 determines that the thin-film data does not match the historical thin-film data. In one example, the error tolerance can include a tolerance between 0.1 and 0. In other words, if the aggregate percentage error is less than 0.1, or 10%, then the process 3400 considers that the predicted thin-film data matches the historical thin-film data. If the aggregate percentage error is greater than 0.1 or 10%, then the process 3400 considers that the predicted thin-film data does not match the historical thin-film data. Other tolerance ranges can be utilized without departing from the scope of the present disclosure. Error scores can be calculated in a variety of ways without departing from the scope of the present disclosure. The training module 3304 or the analysis model 3302 can make the determinations associated with process step 3410.

In one embodiment, if the predicted thin-film data does not match the historical thin-film data 3308 at step 3410, then the process proceeds to step 3412. At step 3412, the process 3400 adjusts the internal functions associated with the analysis model 3302. In one example, the training module 3304 adjusts the internal functions associated with the analysis model 3302. From step 3412, the process returns to step 3404. At step 3404, the historical process conditions data is again provided to the analysis model 3302. Because the internal functions of the analysis model 3302 have been adjusted, the analysis model 3302 will generate different predicted thin-film data that in the previous cycle. The process proceeds to steps 3406, 3408 and 3410 and the aggregate error is calculated. If the predicted thin-film data does not match the historical thin-film data, then the process returns to step 3412 and the internal functions of the analysis model 3302 are adjusted again. This process proceeds in iterations until the analysis model 3302 generates predicted thin-film data that matches the historical thin-film data 3308.

In one embodiment, if the predicted thin-film data matches the historical thin-film data then process step 3410, in the process 3400, proceeds to 3414. At step 3414 training is complete. The analysis model 3302 is now ready to be utilized to identify process conditions and can be utilized in thin-film etching processes performed by the semiconductor process system 3200. The process 3400 can include other steps or arrangements of steps than shown and described herein without departing from the scope of the present disclosure.

Figure 52:
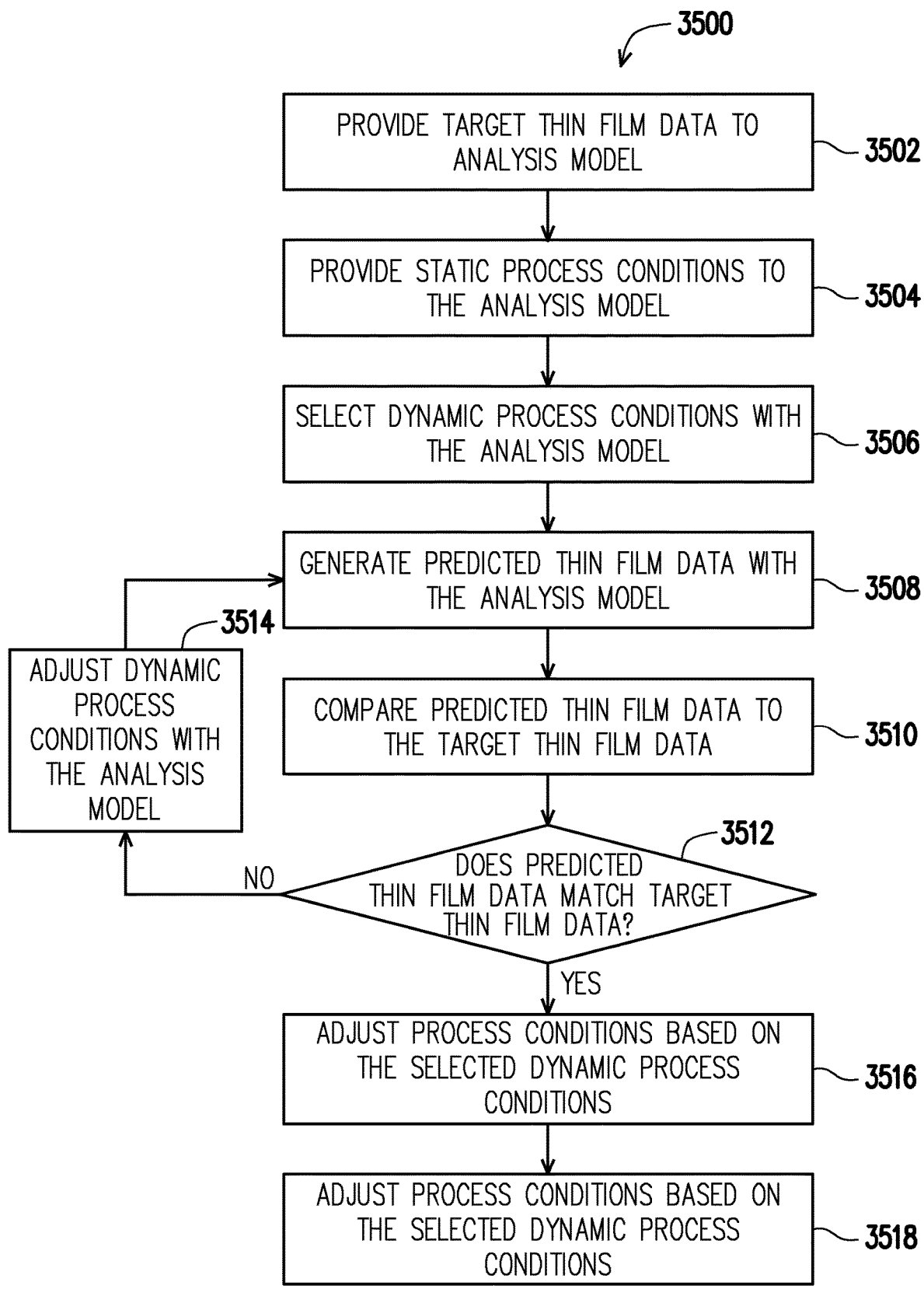
FIG. 52 is a flow diagram of a process for dynamically selecting process conditions for thin-film etching process and for performing a thin-film etching process, according to some embodiments.

FIG. 52 is a flow diagram of a process 3500 for dynamically selecting process conditions for thin-film etching process and for performing a thin-film etching process, according to one embodiment. The various steps of the process 3500 can utilize components, processes, and techniques described in relation to FIGS. 47-50. Accordingly, FIG. 52 is described with reference to FIGS. 47-51.

At 3502, the process 3500 provides target thin-film conditions data to the analysis model 3302. The target thin-film conditions data identifies selected characteristics of a thin film to be formed by thin-film etching process. The target thin-film conditions data can include a target remaining thickness, a target composition, target crystal structure, or other characteristics of the thin film. The target thin-film conditions data can include a range of thicknesses. The target condition or characteristics that can be selected are based on thin film characteristic(s) utilized in the training process. In the example of FIG. 52, the training process focused on thin film thickness.

At 3504, the process 3500 provides static process conditions to the analysis model 3302. The static process conditions include process conditions that will not be adjusted for a next thin-film etching process. The static process conditions can include the target device pattern density indicating the density of patterns on the wafer on which the thin-film etching process will be performed. The static process conditions can include an effective plan area crystal orientation, an effective plan area roughness index, an effective sidewall area of the features on the surface of the semiconductor wafer, an exposed effective sidewall tilt angle, an exposed surface film function group, an exposed sidewall film function group, a rotation or tilt of the semiconductor wafer, process gas parameters (materials, phase of materials, and temperature of materials), a remaining amount of material fluid in the fluid sources 3208 and 3210, a remaining amount of fluid in the purge sources 3212 and 3214, a humidity within a process chamber, an age of an ampoule utilized in the etching process, light absorption or reflection within the process chamber, the length of pipes or conduits that will provide fluids to the process chamber, or other conditions. The static process conditions can include conditions other than those described above without departing from the scope of the present disclosure. Furthermore, in some cases, some of the static process conditions listed above may be dynamic process conditions subject to adjustment as will be described in more detail below. In the example of FIG. 52, dynamic process conditions include temperature, pressure, humidity, and flow rate. Static process conditions include phase, ampoule age, etching area, etching density, and sidewall angle.

At 3506, the process 3500 selects dynamic process conditions for the analysis model, according to one embodiment. The dynamic process conditions can include any process conditions not designated as static process conditions. For example, the training set data may include a large number of various types of process conditions data in the historical process conditions data 3310. Some of these types of process conditions will be defined the static process conditions and some of these types of process conditions will be defined as dynamic process conditions. Accordingly, when the static process conditions are supplied at operation 3504, the remaining types of process conditions can be defined as dynamic process conditions. The analysis model 3302 can initially select initial values for the dynamic process conditions. After the initial values have been selected for the dynamic process conditions, the analysis model has a full set of process conditions to analyze. In one embodiment, the initial values for the dynamic process conditions may be selected based on previously determined starter values, or in accordance with other schemes.

The dynamic process conditions can include the flow rate of fluids or materials from the fluid sources 3208 and 3210 during the etching process. The dynamic process conditions can include the flow rate of fluids or materials from the purge sources 3212 and 3214. The dynamic process conditions can include a pressure within the process chamber, a temperature within the process chamber, a humidity within the process chamber, durations of various steps of the etching process, or voltages or electric field generated within the process chamber. The dynamic process conditions can include other types of conditions without departing from the scope of the present disclosure.

At 3508, the analysis model 3302 generates predicted thin-film data based on the static and dynamic process conditions. The predicted thin-film data includes the same types of thin-film characteristics established in the target thin-film conditions data. In particular, the predicted thin-film data includes the types of predicted thin-film data from the training process described in relation to FIG. 47-51. For example, the predicted thin-film data can include thin-film thickness, film composition, or other parameters of thin films.

At 3510, the process compares the predicted thin-film data to the target thin-film data. In particular, the analysis model 3302 compares the predicted thin-film data to the target thin-film data. The comparison indicates how closely the predicted thin-film data matches the target thin-film data. The comparison can indicate whether or not predicted thin-film data falls within tolerances or ranges established by the target thin-film data. For example, if the target thin-film thickness is between 1 nm and 9 nm, then the comparison will indicate whether the predicted thin-film data falls within this range.

At 3512, if the predicted thin-film data does not match the target thin-film data, then the process proceeds to 3514. At 3514, the analysis model 3302 adjusts the dynamic process conditions data. From 3514 the process returns to 3508. At 3508, the analysis model 3302 again generates predicted thin-film data based on the static process conditions and the adjusted dynamic process conditions. The analysis model then compares the predicted thin-film data to the target thin-film data at 3510. At 3512, if the predicted thin-film data does not match the target thin-film data, then the process proceeds to 3514 and the analysis model 3302 again adjusts the dynamic process conditions. This process proceeds until predicted thin-film data is generated that matches the target thin-film data. If the predicted thin-film data matches the target thin-film data 3512, then the process proceeds to 3516.

At 3516, the process 3500 adjusts the thin-film process conditions of the semiconductor process system 3200 based on the dynamic process conditions that resulted in predicted thin-film data within the target thin-film data. For example, the control system 3224 can adjust fluid flow rates, etching step durations, pressure, temperature, humidity, or other factors in accordance with the dynamic process conditions data.

At 3518, the semiconductor process system 3200 performs a thin-film etching process in accordance with the adjusted dynamic process conditions identified by the analysis model. In one embodiment, the thin-film etching process is an ALE process. However, other thin-film etching processes can be utilized without departing from the scope of the present disclosure. In one embodiment, the semiconductor process system 3200 adjusts the process parameters based on the analysis model between individual etching stages in a thin-film etching process. For example, in an ALE process, the thin-film is etched one layer at a time. The analysis model 3302 can identify parameters to be utilized for etching of the next layer. Accordingly, the semiconductor process system can adjust etching conditions between the various etching stages.

Embodiments provided herein provide several advantages. For example, the semiconductor device according to the present disclosure provides a high density stacked logic circuit device (e.g., GAA device) and a passive device (e.g., resistor, capacitor, inductor, RRAM, DRAM, or the like). The semiconductor device according to one or more configurations as described herein forms a passive device on the opposite side of the GAA device and connects the passive device and the GAA device through a via having a high aspect ratio. The high aspect ratio via further allows the various components of the semiconductor device to be stacked with each other within a certain selected width to increase the level of integration of semiconductor components within that certain width. The particular configuration of the semiconductor device according to the present disclosure also allows the various components of the semiconductor device including the GAA device, contact plugs, TFTs, MIM structures, and vias to at least partially overlap with each other in a vertical direction.

In accordance with at least one embodiment, a device includes a logic component on a substrate, a passive component on the substrate. Here, the logic component is disposed between the substrate and the passive component. The device includes a via electrically connecting the logic component to the passive component.

In accordance with at least one embodiment, a method includes forming a gate-all-around field effect transistor (GAA FET) on a first substrate, forming a first metal layer on the GAA FET, forming a first oxide layer on the first metal layer, bonding the first oxide layer to a second oxide layer on a second substrate, and exposing a portion of the GAA FET by removing one or more layers of the first substrate.

In accordance with at least one embodiment, a device includes a substrate, a gate-all-around field effect transistor on the substrate. The GAA FET includes a first metal layer and a second metal layer on the first metal layer.

The device further includes a thin film transistor, a metal-insulator-metal (MIM) structure. Here, the thin film transistor disposed between the MIM structure and the GAA FET. The device includes a through oxide via having a first end and a second end. The first end of the through oxide via is electrically connected to the MIM structure and the second end of the through oxide via is electrically connected to at least one of the first metal layer or the second metal layer of the GAA MOSFET.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a logic component on a substrate, the logic component including a gate-all-around transistor and a thin film transistor vertically stacked on the gate-all-around transistor;
a passive component on the substrate, the logic component being disposed between the substrate and the passive component, the passive component including a metal-insulator-metal (MIM) structure; and
a via electrically connecting the logic component to the passive component,
wherein the gate-all-around transistor and the thin film transistor are vertically adjacent to each other without any MIM structure therebetween, and
wherein the gate-all-around transistor includes a multilayer stack including a plurality of semiconductor layers.

2. The device of claim 1, wherein the logic component further includes one or more integrated circuits, and the passive component further includes at least one of a resistor, a capacitor, an inductor, or a random access memory.

3. The device of claim 1, wherein the via is a through oxide via.

4. The device of claim 3, wherein the through oxide via includes copper.

5. The device of claim 1,
wherein the via is electrically connected to the MIM structure.

6. The device of claim 5, wherein the via includes a first end and a second end opposite the first end, the first end of the via is connected to the MIM structure and the second end of the via extends past the MIM structure and connects to the logic component.

7. The device of claim 6, wherein an extended portion of the via between the first end and the second end of the via is laterally spaced apart from the MIM structure.

8. The device of claim 6, wherein the logic component, the passive component, and the via at least partially overlap with each other.

9. A device, comprising:
a substrate;
a gate-all-around field effect transistor (GAA FET) on the substrate, the GAA FET including:
a first metal layer; and
a second metal layer on the first metal layer;
a thin film transistor (TFT) vertically stacked on the GAA FET;
a metal-insulator-metal (MIM) structure, the thin film transistor being disposed between the MIM structure and the GAA FET, the MIM structure being vertically stacked on the TFT; and
a through oxide via having a first end and a second end, wherein the first end of the through oxide via is electrically connected to the MIM structure,
wherein the second end of the through oxide via is electrically connected to at least one of the first metal layer or the second metal layer of the GAA FET,
wherein the GAA FET and the TFT are vertically adjacent to each other without any MIM structure therebetween, and
wherein the gate-all-around transistor includes a multilayer stack including a plurality of semiconductor layers.

10. The device of claim 9, wherein the substrate, the GAA FET, the thin film transistor, and the MIM structure are stacked so that the GAA FET, the thin film transistor, and the MIM structure at least partially overlap each other.

11. The device of claim 10, wherein the through oxide via includes an extended portion between the first end and the second end, the extended portion of the through oxide via is laterally spaced apart from the GAA FET, the thin film transistor, and the MIM structure.

12. A device, comprising:
a substrate;
a logic component on the substrate, the logic component including a gate-all-around transistor and a thin film transistor vertically stacked on the gate-all-around transistor, the gate-all-around transistor having a gate electrode, a source region, and a drain region, wherein either the source region or the drain region of the gate-all-around transistor includes a first side and a second side opposite the first side;
a passive component on the substrate, the passive component including a metal-insulator-metal (MIM) structure, the MIM structure having a front side and a back side opposite the front side; and
a through oxide via electrically connecting the logic component to the passive component,
wherein the logic component is disposed between the substrate and the passive component,
wherein the back side of the MIM structure faces the gate-all-around transistor and the thin film transistor, and
wherein the through oxide via extends from the front side of the MIM structure and contacts the second side of either the source region or the drain region of the gate-all-around transistor.

13. The device of claim 12, wherein the logic component includes one or more integrated circuits.

14. The device of claim 12, wherein the gate-all-around transistor is one of a gate-all-around field effect transistor (GAA FET) or a gate-all-around metal-oxide-semiconductor field effect transistor (GAA MOSFET).

15. The device of claim 12, wherein the through oxide via includes copper.

16. The device of claim 12, wherein the through oxide via is electrically connected to the MIM structure.

17. The device of claim 16, wherein the through oxide via includes a first end and a second end opposite the first end, the first end of the through oxide via is connected to the MIM structure and the second end of the through oxide via extends past the MIM structure and connects to the logic component.

18. The device of claim 17, wherein an extended portion of the through oxide via between the first end and the second end of the through oxide via is laterally spaced apart from the MIM structure.

19. The device of claim 18, wherein the logic component, the passive component, and the through oxide via at least partially overlap with each other from a plan view.

20. The device of claim 14, wherein the thin film transistor is between the MIM structure and the GAA FET, and
wherein the substrate, the GAA FET, the thin film transistor, and the MIM structure are stacked so that the GAA FET, the thin film transistor, and the MIM structure at least partially overlap each other from a plan view.

* * * * *